(12) United States Patent
Kim et al.

(10) Patent No.: US 11,107,815 B2
(45) Date of Patent: Aug. 31, 2021

(54) SEMICONDUCTOR DEVICE

(71) Applicant: SAMSUNG ELECTRONICS CO., LTD., Suwon-si (KR)

(72) Inventors: Sungmin Kim, Incheon (KR); Dongwon Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/905,027

(22) Filed: Jun. 18, 2020

(65) Prior Publication Data

US 2020/0321338 A1 Oct. 8, 2020

Related U.S. Application Data

(63) Continuation of application No. 15/804,307, filed on Nov. 6, 2017, now Pat. No. 10,714,476.

(30) Foreign Application Priority Data

Mar. 23, 2017 (KR) ........................ 10-2017-0037112

(51) Int. Cl.
| | |
|---|---|
| *H01L 27/092* | (2006.01) |
| *H01L 21/8238* | (2006.01) |
| *H01L 29/423* | (2006.01) |
| *H01L 29/78* | (2006.01) |
| *H01L 29/786* | (2006.01) |
| *H01L 29/66* | (2006.01) |

(52) U.S. Cl.
CPC .. *H01L 27/0924* (2013.01); *H01L 21/823807* (2013.01); *H01L 21/823821* (2013.01); *H01L 21/823828* (2013.01); *H01L 21/823864* (2013.01); *H01L 21/823878* (2013.01); *H01L 29/42392* (2013.01); *H01L 29/66795* (2013.01); *H01L 29/785* (2013.01); *H01L 29/78696* (2013.01)

(58) Field of Classification Search
CPC ........... H01L 27/0924; H01L 29/42392; H01L 29/785; H01L 21/823828; H01L 29/78696; H01L 29/66795; H01L 21/823807; H01L 21/823864; H01L 21/823878; H01L 21/823821; H01L 27/092
See application file for complete search history.

(56) References Cited

U.S. PATENT DOCUMENTS

| | | | |
|---|---|---|---|
| 6,222,788 B1 | 4/2001 | Forbes et al. | |
| 6,940,129 B2 | 9/2005 | Kim et al. | |
| 7,736,962 B1 | 6/2010 | Mori | |
| 8,455,365 B2 | 6/2013 | Guo et al. | |

(Continued)

FOREIGN PATENT DOCUMENTS

KR  10-2016-0122463  10/2016

*Primary Examiner* — Edward Chin
(74) *Attorney, Agent, or Firm* — F. Chau & Associates, LLC

(57) ABSTRACT

A semiconductor device includes: channel patterns disposed on a substrate; a pair of source/drain patterns disposed at first and second sides of each of the channel patterns; and a gate electrode disposed around the channel patterns, wherein the gate electrode includes a first recessed top surface between adjacent channel patterns, wherein the channel patterns are spaced apart from the substrate, and wherein the gate electrode is disposed between the substrate and the channel patterns.

20 Claims, 75 Drawing Sheets

(56) References Cited

U.S. PATENT DOCUMENTS

| | | | |
|---|---|---|---|
| 9,000,499 B2 | 4/2015 | Franklin et al. | |
| 9,121,820 B2 | 9/2015 | Liu et al. | |
| 9,257,527 B2 | 2/2016 | Hashemi et al. | |
| 9,431,399 B1 | 8/2016 | Alptekin et al. | |
| 9,711,414 B2 | 7/2017 | Hatcher et al. | |
| 9,768,255 B2 | 9/2017 | Lee et al. | |
| 2013/0270512 A1 | 10/2013 | Radosavljevic et al. | |
| 2015/0287776 A1 | 10/2015 | Leobandung | |
| 2016/0056291 A1 | 2/2016 | Yokoyama | |
| 2018/0277543 A1 | 9/2018 | Kim et al. | |
| 2018/0308988 A1* | 10/2018 | Chao | H01L 29/78603 |
| 2019/0088759 A1* | 3/2019 | Sung | H01L 29/4983 |
| 2021/0119021 A1* | 4/2021 | Colombeau | H01L 29/66545 |

* cited by examiner

SEMICONDUCTOR DEVICE

CROSS-REFERENCE TO RELATED APPLICATIONS

This U.S. non-provisional patent application is a continuation of U.S. patent application Ser. No. 15/804,307 filed on Nov. 6, 2017, which claims priority under 35 U.S.C. § 119 to Korean Patent Application No. 10-2017-0037112, filed on Mar. 23, 2017, in the Korean Intellectual Property Office, the disclosures of which are incorporated by reference herein in their entireties.

TECHNICAL FIELD

Exemplary embodiments of the inventive concept relate to a semiconductor device and, more particularly, to a semiconductor device including a field effect transistor and a method for manufacturing the same.

DISCUSSION OF RELATED ART

Due to their small sizes, multi-functional characteristics, and/or low manufacture costs, semiconductor devices are ubiquitous in the electronic industry. Semiconductor devices may be a memory device for storing data, a logic device for processing data, or a hybrid device having both memory and logic elements. To meet increased demand for electronic devices with high-reliability, and high-speed, multi-functional semiconductor devices are desired. To satisfy these technical requirements, the complexity and integration density of semiconductor devices are being increased.

SUMMARY

In an exemplary embodiment of the inventive concept, a semiconductor device includes: channel patterns disposed on a substrate; a pair of source/drain patterns disposed at first and second sides of each of the channel patterns; and a gate electrode disposed around the channel patterns, wherein the gate electrode includes a first recessed top surface between adjacent channel patterns, wherein the channel patterns are spaced apart from the substrate, and wherein the gate electrode is disposed between the substrate and the channel patterns.

In an exemplary embodiment of the inventive concept, a semiconductor device includes: a channel pattern disposed between a pair of source/drain patterns on a substrate; a gate electrode disposed around the channel pattern; a mask pattern on the channel pattern; and a gate capping pattern covering the gate electrode and the mask pattern, wherein a top surface of the gate electrode is lower than a top surface of the mask pattern, wherein the channel pattern is spaced apart from the substrate, and wherein the gate electrode is disposed between the substrate and the channel pattern.

In an exemplary embodiment of the inventive concept, a semiconductor device includes: an active pattern on a substrate, the active pattern including a first semiconductor pattern and a second semiconductor pattern spaced apart from the first semiconductor pattern; and a gate electrode intersecting the active pattern and extending in a first direction, wherein the gate electrode is disposed between the first and second semiconductor patterns, wherein the second semiconductor pattern includes a channel pattern and a source/drain pattern, and wherein the gate electrode includes a recessed top surface adjacent to the second semiconductor pattern.

In an exemplary embodiment of the inventive concept, a semiconductor device includes: a substrate; a semiconductor pattern disposed on the substrate first and second channels disposed in the semiconductor pattern, wherein the first and second channels are adjacent to each other; and a gate electrode disposed on first and second sides of each of the first and second channels and between the semiconductor pattern and the first channel and between the semiconductor pattern and the second channel, wherein a surface of the gate electrode between the first and second channels is recessed to the substrate and is lower than a top surface of the first and second channels.

BRIEF DESCRIPTION OF THE DRAWINGS

The above and other features of the inventive concept will become more apparent by describing in detail exemplary embodiments thereof with reference to the attached drawings and accompanying detailed description. Like reference numerals may refer to like elements in the drawings.

DETAILED DESCRIPTION OF THE EMBODIMENTS

Figure 1:
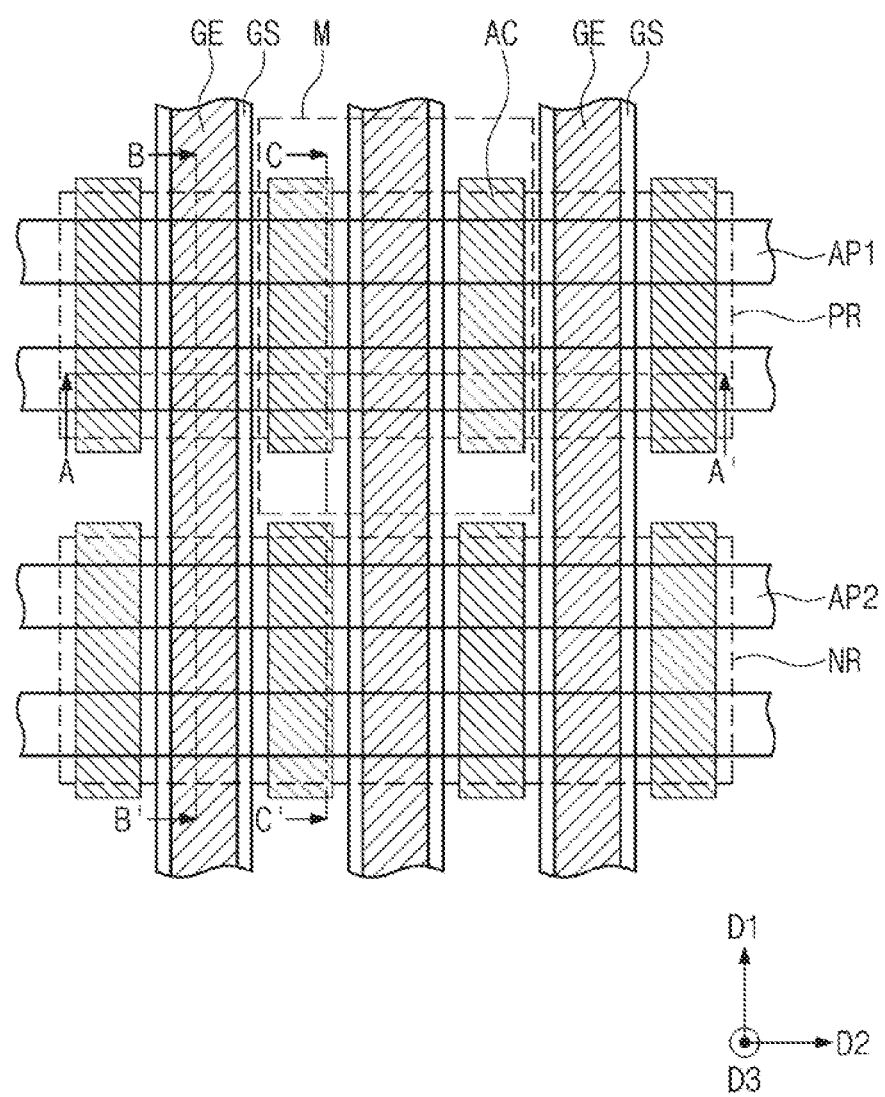
FIG. 1 is a plan view illustrating a semiconductor device according to exemplary embodiments of the inventive concept.
Figure 2A:
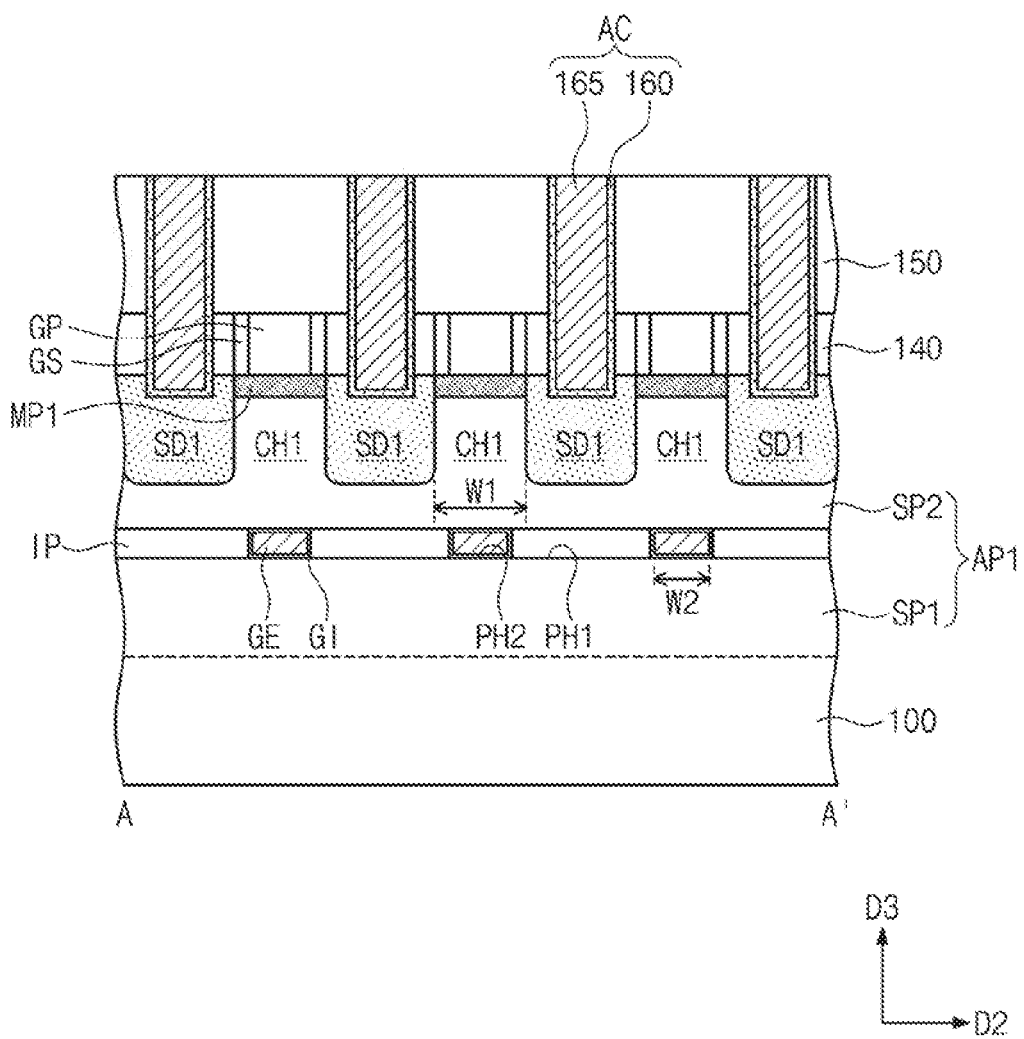
FIGS. 2A, 2B and 2C are cross-sectional views taken along lines A-A', B-B', and C-C' of FIG. 1, respectively.
Figure 2B:
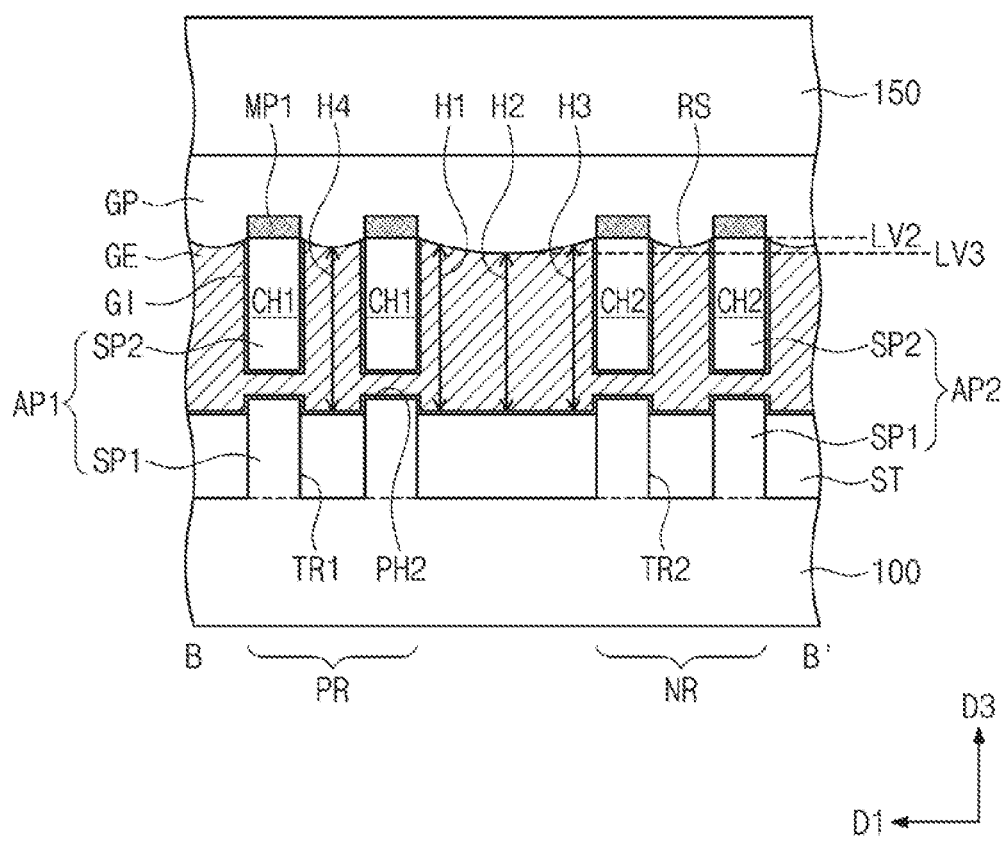
Figure 2C:
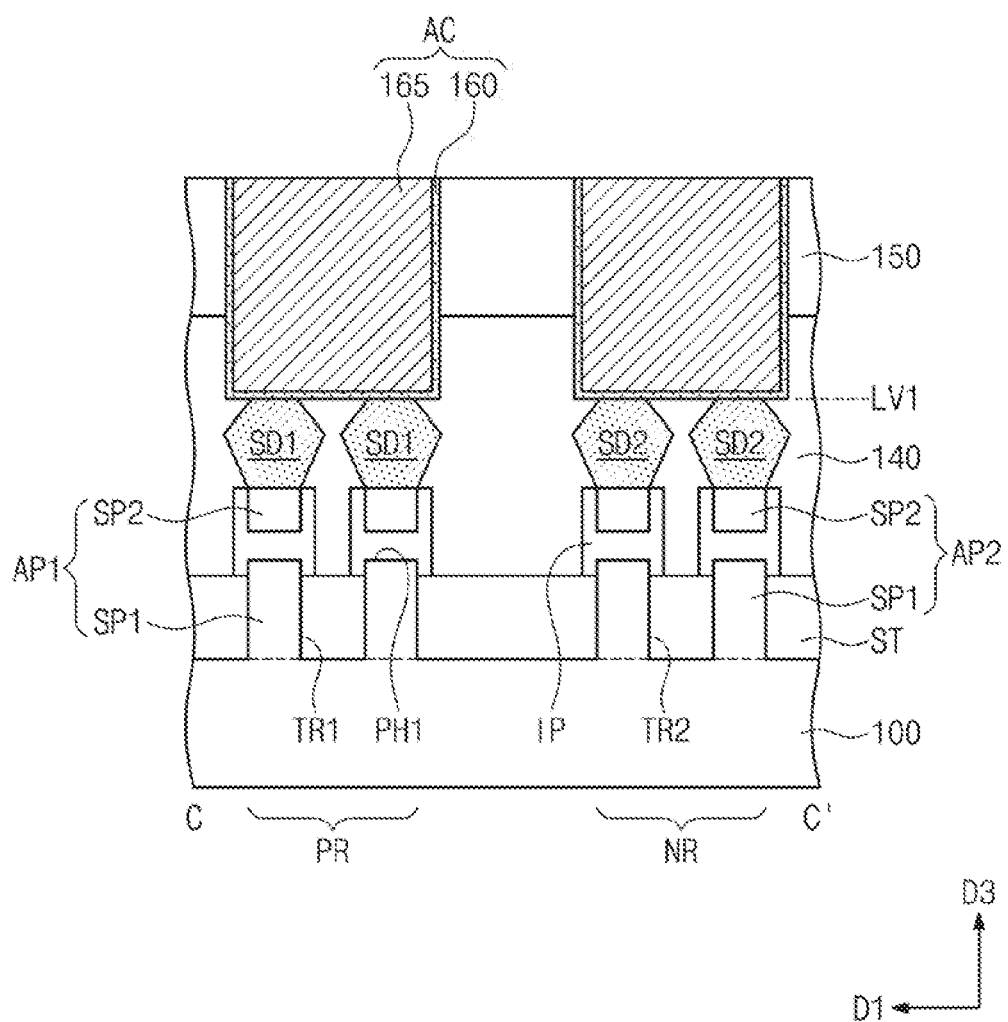
Figure 3A:
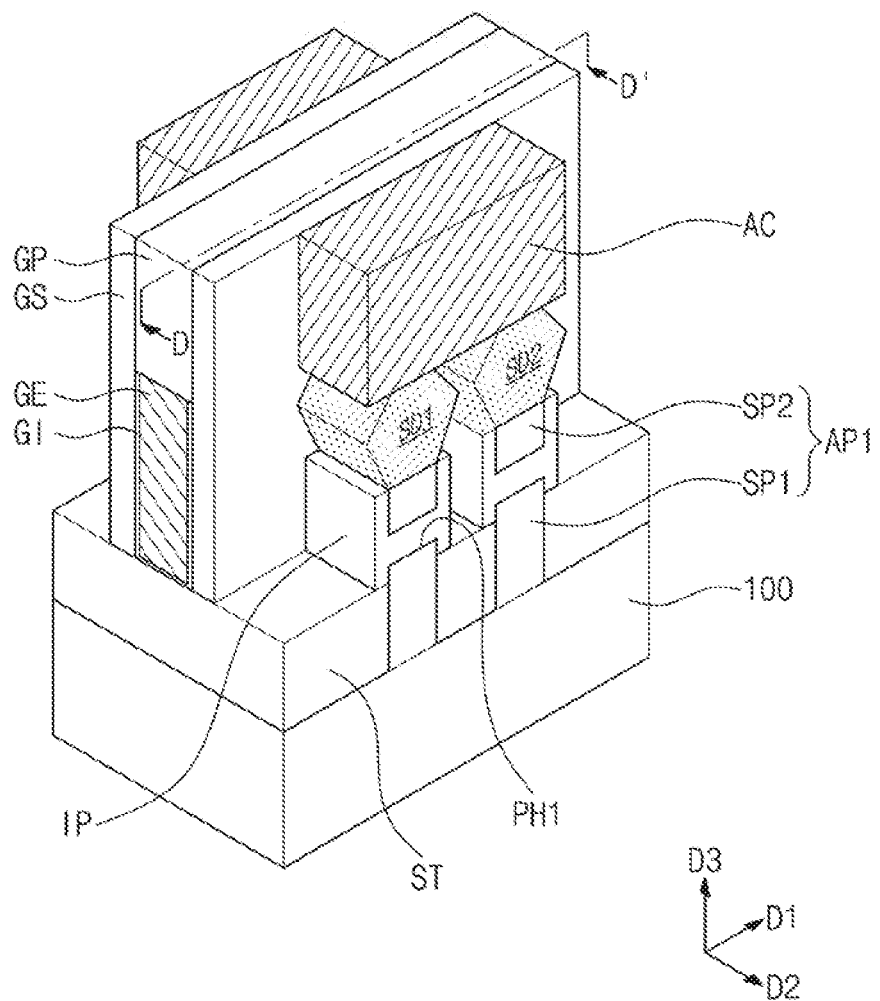
FIG. 3A is a perspective view illustrating a region 'M' of FIG. 1.
Figure 3B:
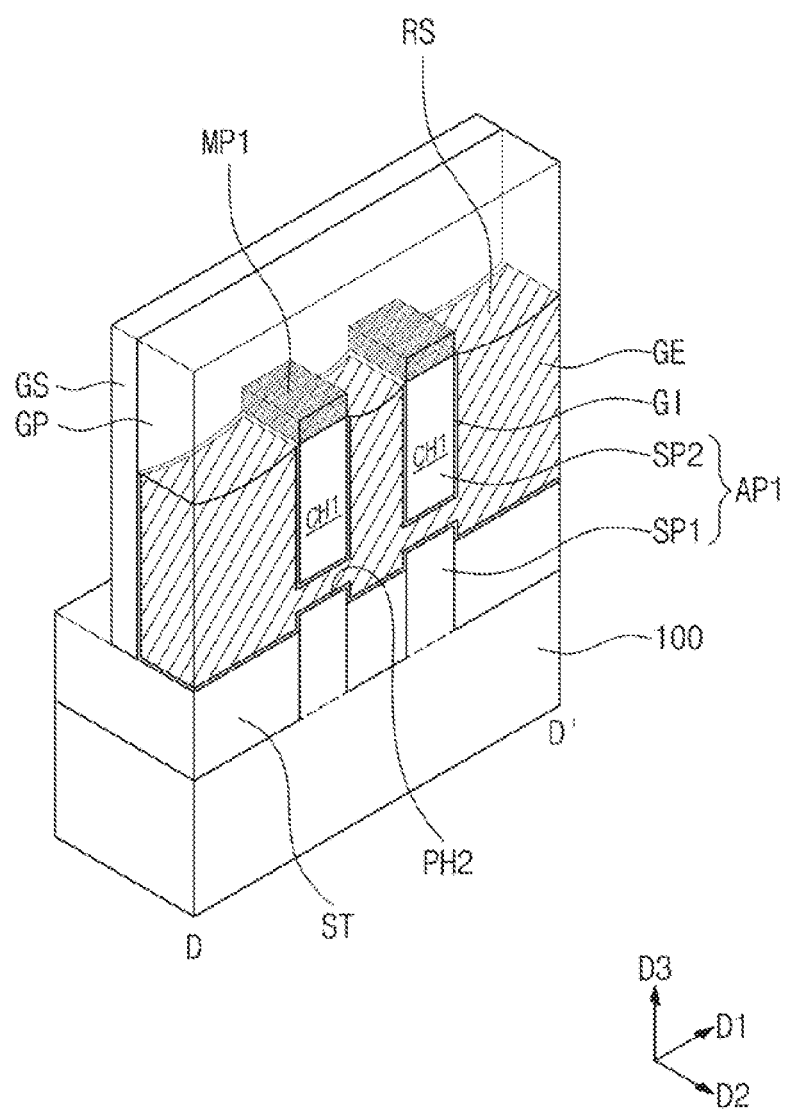
FIG. 3B is a perspective view taken along a line D-D' of FIG. 3A.

FIG. 1 is a plan view illustrating a semiconductor device according to exemplary embodiments of the inventive concept. FIGS. 2A, 2B and 2C are cross-sectional views taken along lines A-A', B-B', and C-C' of FIG. 1, respectively. FIG. 3A is a perspective view illustrating a region 'M' of FIG. 1. FIG. 3B is a perspective view taken along a line D-D' of FIG. 3A.

Referring to FIGS. 1, 2A, 2B, 2C, 3A, and 3B, device isolation layers ST may be provided on a substrate 100. The device isolation layers ST may demarcate a p-channel metal oxide semiconductor field-effect transistor (PMOSFET) region PR and an n-channel metal oxide semiconductor field-effect transistor (NMOSFET) region NR. The substrate 100 may be a semiconductor substrate including silicon, germanium, or silicon-germanium or may be a compound semiconductor substrate. In exemplary embodiments of the inventive concept, the substrate 100 may be a silicon substrate. The device isolation layers ST may include an insulating material such as a silicon oxide layer.

The PMOSFET region PR and the NMOSFET region NR may be spaced apart from each other in a first direction D1 with the device isolation layer ST interposed therebetween. The first direction D1 may be parallel to a top surface of the substrate 100. The PMOSFET region PR and the NMOSFET region NR may extend in a second direction D2 intersecting the first direction D1. The device isolation layer ST between the PMOSFET region PR and the NMOSFET region NR may be deeper than the device isolation layers ST between active patterns AP1 and AP2.

The PMOSFET region PR and the NMOSFET region NR may be a logic cell region on which logic transistors constituting a logic circuit of a semiconductor device are disposed. For example, the logic transistors constituting a processor core or an input/output (I/O) terminal may be disposed on the logic cell region of the substrate 100. The PMOSFET region PR and the NMOSFET region NR may include some of the logic transistors.

Additionally, the PMOSFET region PR and the NMOSFET region NR may constitute a memory cell region for storing logical data. For example, memory cell transistors constituting a plurality of static random access memory (SRAM) cells may be disposed on the memory cell region of the substrate 100. The PMOSFET region PR and the NMOSFET region NR may include some of the memory cell transistors. However, exemplary embodiments of the inventive concept are not limited thereto.

A plurality of the active patterns AP1 and AP2 extending in the second direction D2 may be provided on the PMOSFET region PR and the NMOSFET region NR. The active patterns AP1 and AP2 may include first active patterns API on the PMOSFET region PR and second active patterns AP2 on the NMOSFET region NR. The first and second active patterns AP1 and AP2 may be arranged along the first direction D1. In FIG. 1, two first active patterns AP1 are disposed on the PMOSFET region PR and two second active patterns AP2 are disposed on the NMOSFET region NR. However, exemplary embodiments of the inventive concept are not limited thereto.

Each of the first and second active patterns AP1 and AP2 may include a first semiconductor pattern SP1 and a second semiconductor pattern SP2 disposed on the first semiconductor pattern SP1. The second semiconductor pattern SP2 may be vertically spaced apart from the first semiconductor pattern SP1. As an example, the first and second semiconductor patterns SP1 and SP1 may be separated from each other in a third direction D3. The first semiconductor pattern SP1 may be a portion of the substrate 100 and may correspond to a part of the substrate 100 protruding from the top surface of the substrate 100. For example, the first and second semiconductor patterns SP1 and SP2 may include silicon.

A first trench TR1 may be disposed between the first semiconductor patterns SP1 adjacent to each other on the PMOSFET region PR, and a second trench TR2 may be disposed between the first semiconductor patterns SP1 adjacent to each other on the NMOSFET region NR. The device isolation layers ST may fill the first and second trenches TR1 and TR2. The device isolation layers ST may demarcate the first and second active patterns AP1 and AP2. The device isolation layers ST may directly cover sidewalls of lower portions of the first semiconductor patterns SP1. Top surfaces of the first semiconductor patterns SP1 may be higher than top surfaces of the device isolation layers ST. For example, upper portions of the first semiconductor patterns SP1 may vertically protrude from between the device isolation layers ST.

First channel patterns CH1 and first source/drain patterns SD1 may be provided in the second semiconductor pattern SP2 of the first active pattern AP1. The first source/drain patterns SD1 may be P-type dopant regions. Each of the first channel patterns CH1 may be disposed between a pair of the first source/drain patterns SD1 adjacent to each other. Second channel patterns CH2 and second source/drain patterns SD2 may be provided in the second semiconductor pattern SP2 of the second active pattern AP2. The second source/drain patterns SD2 may be N-type dopant regions. Each of the second channel patterns CH2 may be disposed between a pair of the second source/drain patterns SD2 adjacent to each other.

The first and second source/drain patterns SD1 and SD2 may include epitaxial patterns formed by a selective epitaxial growth (SEG) process. Top surfaces of the first and second source/drain patterns SD1 and SD2 may be disposed at a higher level than top surfaces of the first and second channel patterns CH1 and CH2.

Each of the first source/drain patterns SD1 may include a semiconductor element having a lattice constant greater than that of a semiconductor element of the second semiconductor pattern SP2. Thus, the first source/drain patterns SD1 may provide compressive stress to the first channel patterns CH1. For example, the first source/drain patterns SD1 may include silicon-germanium (SiGe). Each of the second source/drain patterns SD2 may include a semiconductor element having a lattice constant equal to or smaller than that of the semiconductor element of the second semiconductor pattern SP2. In the case that the lattice constant of the semiconductor element of the second source/drain patterns SD2 is smaller than that of the semiconductor element of the second semiconductor pattern SP2, the second source/drain patterns SD2 may provide tensile stress to the second channel patterns CH2. For example, the second source/drain patterns SD2 may include the same semiconductor element (e.g., silicon) as the second semiconductor pattern SP2.

First cavities PH1 and second cavities PH2 may be disposed between the first semiconductor pattern SP1 and the second semiconductor pattern SP2. The first and second cavities PH1 and PH2 may be connected to each other to constitute one united cavity. The first and second cavities PH1 and PH2 may correspond to a space between the first semiconductor pattern SP1 and the second semiconductor pattern SP2. The second semiconductor pattern SP2 may be vertically spaced apart from the first semiconductor pattern SP1 by the first and second cavities PH1 and PH2. The first cavities PH1 may vertically overlap with the first and second source/drain patterns SD1 and SD2, and the second cavities PH2 may vertically overlap with the first and second channel patterns CH1 and CH2. To vertically overlap may mean that elements overlap each other in a direction perpendicular or substantially perpendicular to an extension direction of the substrate 100, for example.

First mask patterns MP1 may be provided on the first and second channel patterns CH1 and CH2, respectively. The first and second channel patterns CH1 and CH2 may vertically overlap with the first mask patterns MP1, respectively. In the present embodiment, the first mask patterns MP1 may be in direct contact with the top surfaces of the first and second channel patterns CH1 and CH2. For example, the first mask patterns MP1 may include SiCN, SiCON, or SiN.

Gate electrodes GE extending in the first direction D1 may be provided to intersect the first and second active patterns AP1 and AP2. The gate electrodes GE may be spaced apart from each other in the second direction D2. The gate electrodes GE may surround the first and second channel patterns CH1 and CH2. The gate electrodes GE may surround both sidewalls and a bottom surface of each of the first and second channel patterns CH1 and CH2. The gate electrodes GE may fill the second cavities PH2 between the first and second semiconductor patterns SP1 and SP2. For example, the gate electrodes GE may include a conductive metal nitride (e.g., titanium nitride or tantalum nitride) or a metal material (e.g., titanium, tantalum, tungsten, copper, or aluminum).

In exemplary embodiments of the inventive concept, the first channel pattern CH1 may have a first width W1 in the second direction D2. The first width W1 may be a distance between a pair of first source/drain patterns SD1 adjacent to each other. The gate electrode GE disposed in the second cavity PH2 may have a second width W2 in the second direction D2. The second width W2 may be smaller than the first width W1. Since the second width W2 has a relatively small size, a parasitic capacitance between the gate electrode GE and a dielectric around the gate electrode GE may be reduced.

Each of the gate electrodes GE may have recessed top surfaces RS. A recessed top surface RS may be formed between adjacent first mask patterns MP1. In other words, the recessed top surface RS may be formed between channel patterns that are adjacent to each other in the first direction D1, for example, between the first channel patterns CH1 adjacent to each other in the first direction D1, between the second channel patterns CH2 adjacent to each other in the first direction D1, and between the first and second channel patterns CH1 and CH2 adjacent to each other in the first direction D1. The recessed top surface RS may be concave toward the substrate 100.

In exemplary embodiments of the inventive concept, the gate electrode GE adjacent to the first channel pattern CH1 has a first height H1, and the gate electrode GE disposed at a center point (or close to the center point) between the first and second channel patterns CH1 and CH2 has a second height H2. The gate electrode GE adjacent to the second channel pattern CH2 has a third height H3. Here, the first height H1 and the third height H3 may be greater than the second height H2. In other words, the height of the gate electrode GE between the first and second channel patterns CH1 and CH2 may decrease and then increase from the first channel pattern CH1 toward the second channel pattern CH2.

In exemplary embodiments of the inventive concept, the gate electrode GE between a pair of the first channel patterns CH1 adjacent to each other in the first direction D1 has a fourth height H4. Here, the fourth height H4 may be greater than the second height H2. In other words, the recessed top surface RS between the first and second channel patterns CH1 and CH2 may be more recessed toward the substrate 100 than the recessed top surface RS between the first channel patterns CH1. For example, a lowest point of the recessed top surface RS between the first and second channel patterns CH1 and CH2 may be closer to the substrate 100 than a lowest point of the recessed top surface RS between the first channel patterns CH1.

A pair of gate spacers GS may be disposed on both sidewalls of each of the gate electrodes GE, respectively. The gate spacers GS may extend along the gate electrodes GE in the first direction D1. Top surfaces of the gate spacers GS may be higher than the top surfaces of the gate electrodes GE. The top surfaces of the gate spacers GS may be substantially coplanar with a top surface of a first interlayer insulating layer 140 and a top surface of a gate capping pattern GP. The pair of gate spacers GS may be provided on both edge portions of the first mask pattern MP1, respectively. In exemplary embodiments of the inventive concept, outer sidewalls of the pair of gate spacers GS may be aligned with both sidewalls of the first mask pattern MP1, respectively. For example, the gate spacers GS may include SiCN, SiCON, or SiN. In exemplary embodiments of the inventive concept, each of the gate spacers GS may have a multi-layered structure formed of SiCN, SiCON, or SiN.

Gate dielectric patterns GI may be disposed between the gate electrodes GE and the first and second active patterns AP1 and AP2. Each of the gate dielectric patterns GI may extend along a bottom surface of each of the gate electrodes GE. The gate dielectric pattern GI may cover a top surface of the device isolation layer ST and a top surface of the first semiconductor pattern SP1. The gate dielectric pattern GI may cover both sidewalls and a bottom surface of each of the first and second channel patterns CH1 and CH2. The gate dielectric pattern GI and the gate electrode GE may fill the second cavity PH2.

The gate dielectric patterns GI may include a high-k dielectric material. For example, the high-k dielectric material may include hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

The gate capping pattern GP may be provided on each of the gate electrodes GE. The gate capping pattern GP may extend along the gate electrode GE in the first direction D1. The gate capping pattern GP may be disposed between the pair of gate spacers GS. The gate capping pattern GP may cover the recessed top surfaces RS of the gate electrode GE and the first mask patterns MP1. The gate capping patterns GP may include a material having an etch selectivity with respect to first and second interlayer insulating layers 140 and 150. For example, the gate capping patterns GP may include SiON, SiCN, SiCON, or SiN.

Insulating patterns IP may be provided between a pair of the gate electrodes GE adjacent to each other and may fill the first cavities PH1. The insulating patterns IP may cover sidewalls of the upper portions of the first semiconductor patterns SP1 and sidewalls of lower portions of the second semiconductor patterns SP2. A thickness, in the first direction D1, of the insulating pattern IP disposed on the sidewalls of the first and second semiconductor patterns SP1 and SP2 may be substantially equal to a thickness of the gate spacer GS in the second direction D2. The insulating pattern IP may include the same material as the gate spacer GS.

The first interlayer insulating layer 140 may be provided on the substrate 100. The first interlayer insulating layer 140 may cover the gate spacers GS, the insulating patterns IP, and the first and second source/drain patterns SD1 and SD2. The top surface of the first interlayer insulating layer 140 may be substantially coplanar with the top surfaces of the gate capping patterns GP and the top surfaces of the gate spacers GS. A second interlayer insulating layer 150 may be disposed on the first interlayer insulating layer 140 and the gate capping patterns GP. For example, each of the first and second interlayer insulating layers 140 and 150 may include a silicon oxide layer.

At least one contact AC may penetrate the second and first interlayer insulating layers 150 and 140 between a pair of gate electrodes GE to be electrically connected to the first and/or second source/drain patterns SD1 and/or SD2. In exemplary embodiments of the inventive concept, each of the contacts AC may be connected to a plurality of the source/drain patterns SD1 and/or SD2. In exemplary embodiments of the inventive concept, one contact AC may be connected to one source/drain pattern SD1 or SD2. However, exemplary embodiments of the inventive concept are not limited thereto.

Each of the contacts AC may include a conductive pillar 165 and a barrier layer 160 surrounding the conductive pillar 165. The barrier layer 160 may cover sidewalls and a bottom surface of the conductive pillar 165. For example, the conductive pillar 165 may include at least one metal material such as aluminum, copper, tungsten, molybdenum, or cobalt. For example, the barrier layer 160 may include at least one metal nitride such as titanium nitride (TiN), tantalum nitride (TaN), or tungsten nitride (WN).

In exemplary embodiments of the inventive concept, the bottom surface of the contact AC may be disposed at a first level LV1. The highest point of the top surface of the gate electrode GE may be disposed at a second level LV2. The lowest point of the top surface of the gate electrode GE may be disposed at a third level LV3. In exemplary embodiments of the inventive concept, the second level LV2 may be substantially the same as or lower than the first level LV1. The third level LV3 may be lower than the first level LV1. In other words, the gate electrode GE may be lower than the contact AC. The gate electrode GE may not overlap with the contact AC when viewed in a cross-sectional view. The second level LV2 of the top surface of the gate electrode GE may be lower than a level of the top surface of the first mask pattern MP1. For example, the second level LV2 may be substantially the same as or lower than a level of a bottom surface of the first mask pattern MP1.

A parasitic capacitance may occur between the gate electrode GE and the contact AC due to a dielectric (e.g., the gate spacer GS and the gate capping pattern GP) disposed between the gate electrode GE and the contact AC. However, in the semiconductor device according to exemplary embodiments of the inventive concept, the gate electrode GE may be lower than the contact AC, and thus the parasitic capacitance may be reduced. As a result, an operating speed and electrical characteristics of the semiconductor device can be increased.

In addition, silicide layers may be disposed between the contacts AC and the source/drain patterns SD1 and SD2. The contacts AC may be electrically connected to the first and second source/drain patterns SD1 and SD2 through the silicide layers. The silicide layers may include a metal silicide, e.g., titanium silicide, tantalum silicide, and/or tungsten silicide.

In an alternative embodiment of the inventive concept, the channels may be fin channels and the recessed gate electrode may have a top surface lower than a top surface of the fin channel, and thus, capacitance between the gate electrode and the contact may be reduced, for example.

FIGS. 4, 6, 8, 10, 12, 14, and 16 are plan views illustrating a method for manufacturing a semiconductor device according to exemplary embodiments of the inventive concept. FIGS. 5A, 7A, 9A, 11A, 13A, 15A, and 17A are cross-sectional views taken along lines A-A' of FIGS. 4, 6, 8, 10, 12, 14, and 16, respectively. FIGS. 5B, 7B, 9B, 11B, 13B, 15B, and 17B are cross-sectional views taken along lines B-B' of FIGS. 4, 6, 8, 10, 12, 14, and 16, respectively. FIGS. 7C, 9C, 11C, 13C, 15C, and 17C are cross-sectional views taken along lines C-C' of FIGS. 6, 8, 10, 12, 14, and 16, respectively.

Figure 4:
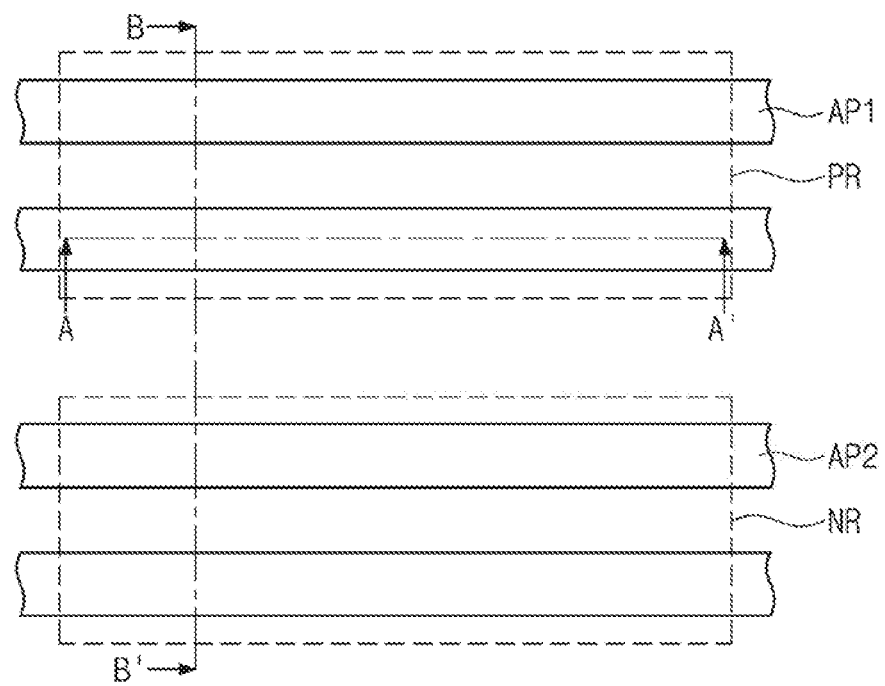
FIGS. 4, 6, 8, 10, 12, 14, and 16 are plan views illustrating a method for manufacturing a semiconductor device according to exemplary embodiments of the inventive concept.
Figure 4:
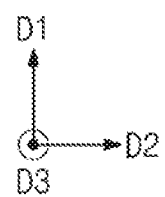
Figure 5A:
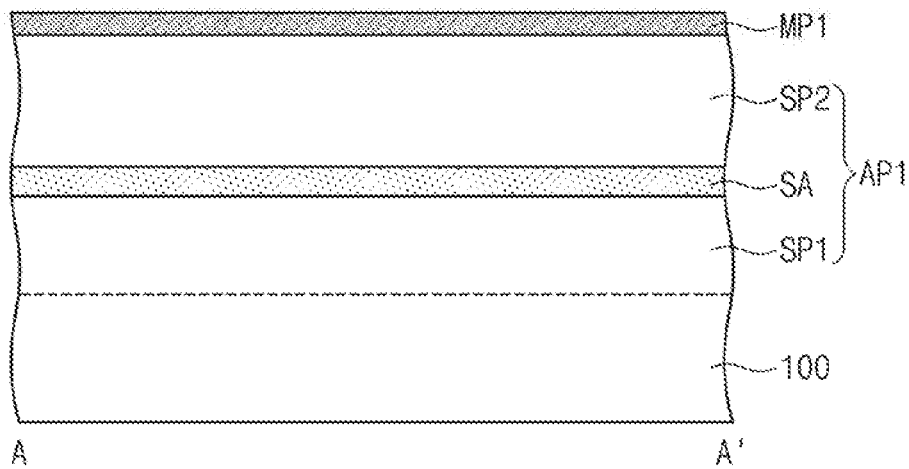
FIGS. 5A, 7A, 9A, 11A, 13A, 15A, and 17A are cross-sectional views taken along lines A-A' of FIGS. 4, 6, 8, 10, 12, 14, and 16, respectively.
Figure 5A:
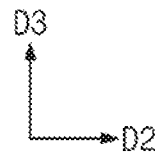
Figure 5B:
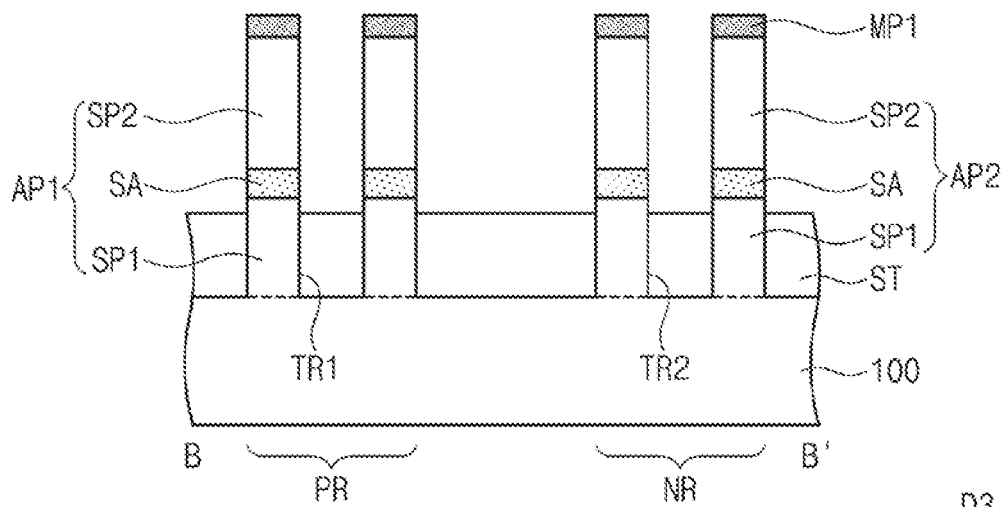
FIGS. 5B, 7B, 9B, 11B, 13B, 15B, and 17B are cross-sectional views taken along lines B-B' of FIGS. 4, 6, 8, 10, 12, 14, and 16, respectively.
Figure 5B:
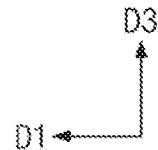
Figure 6:
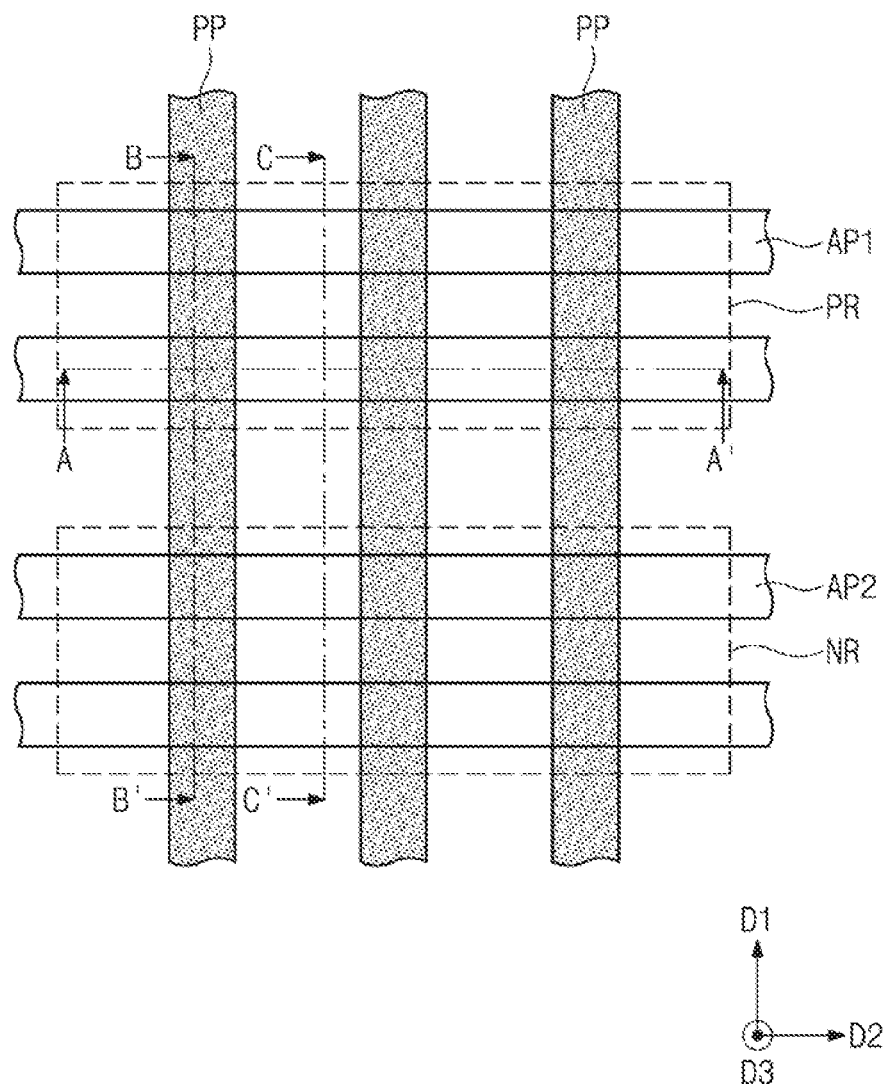
Figure 7A:
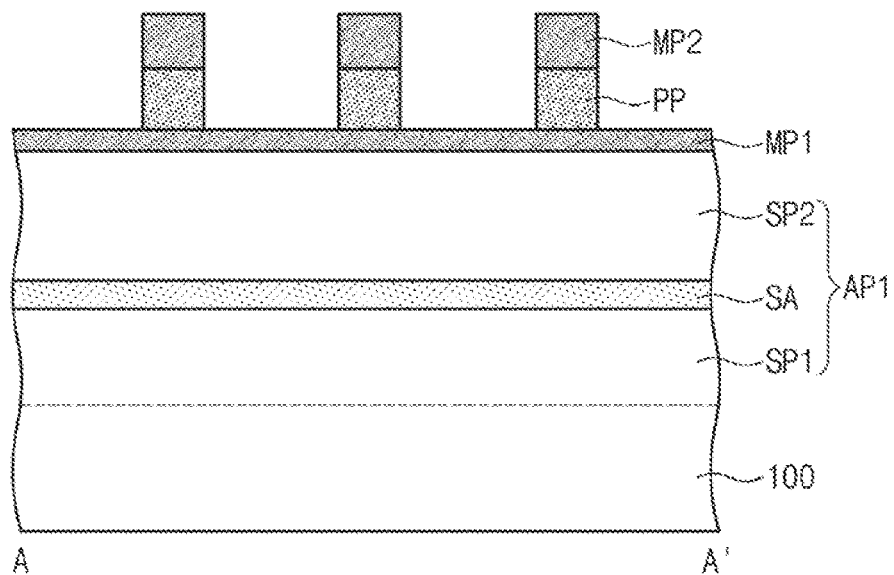
Figure 7B:
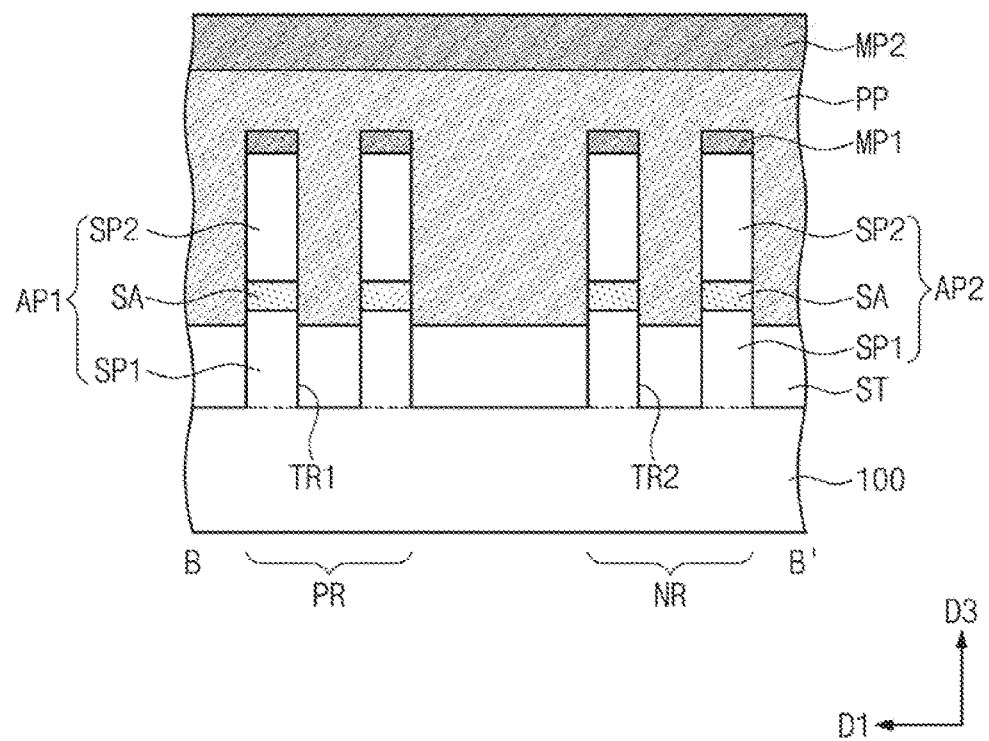
Figure 7C:
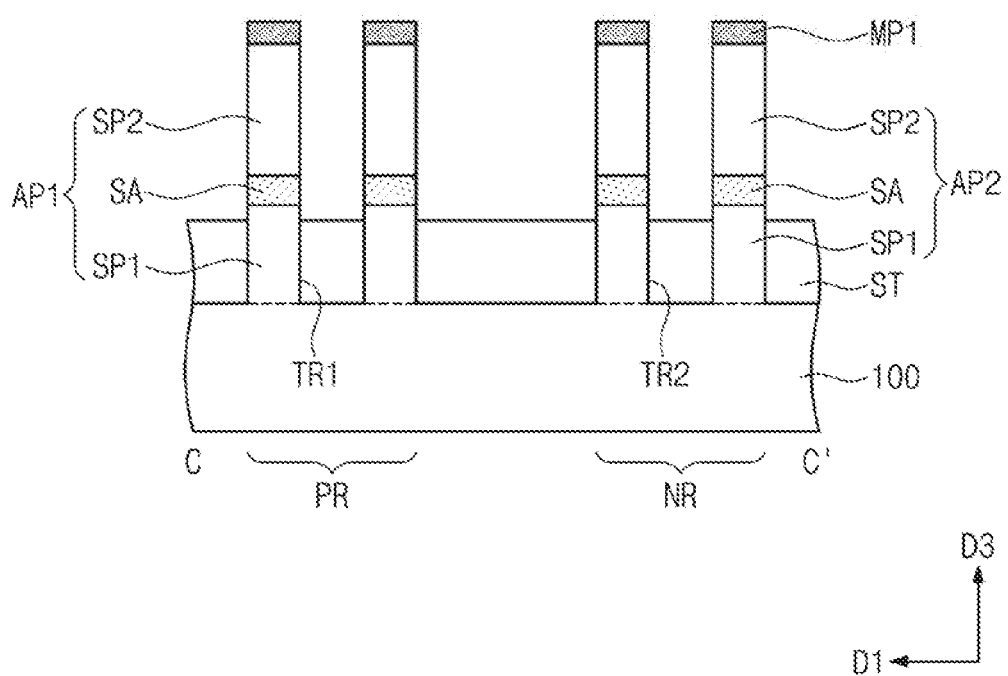
FIGS. 7C, 9C, 11C, 13C, 15C, and 17C are cross-sectional views taken along lines C-C' of FIGS. 6, 8, 10, 12, 14, and 16, respectively.
Figure 8:
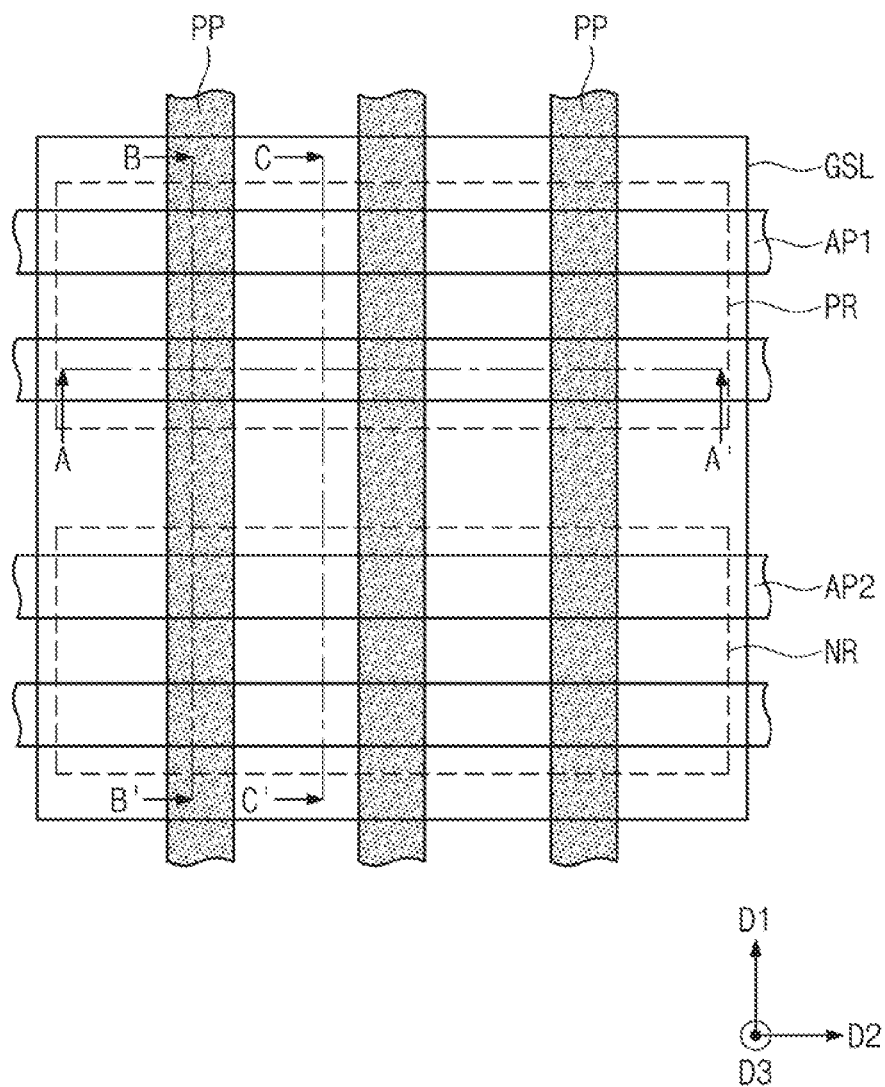
Figure 9A:
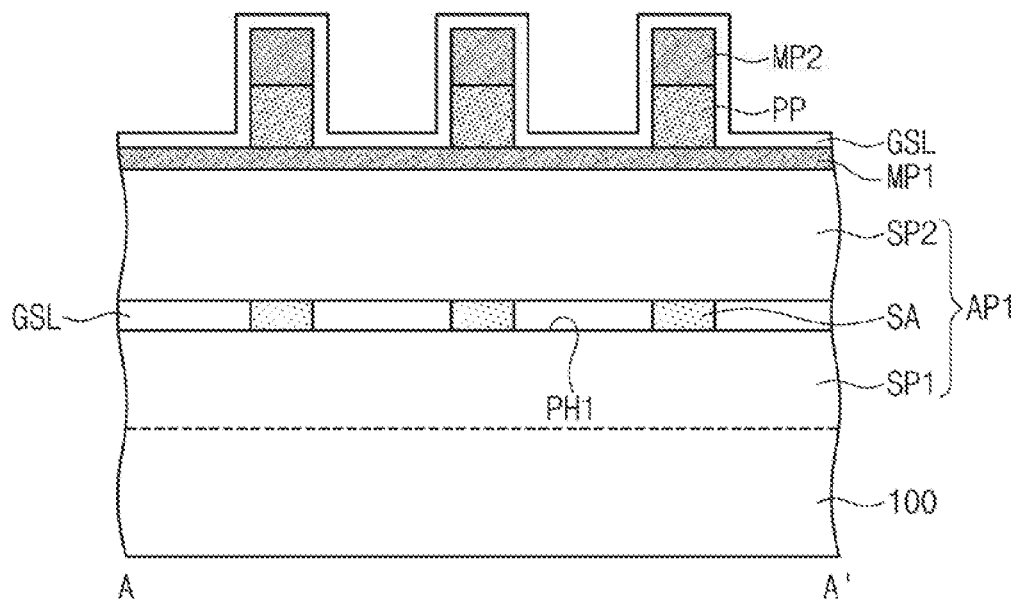
Figure 9A:
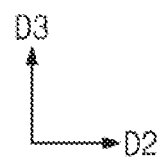
Figure 9B:
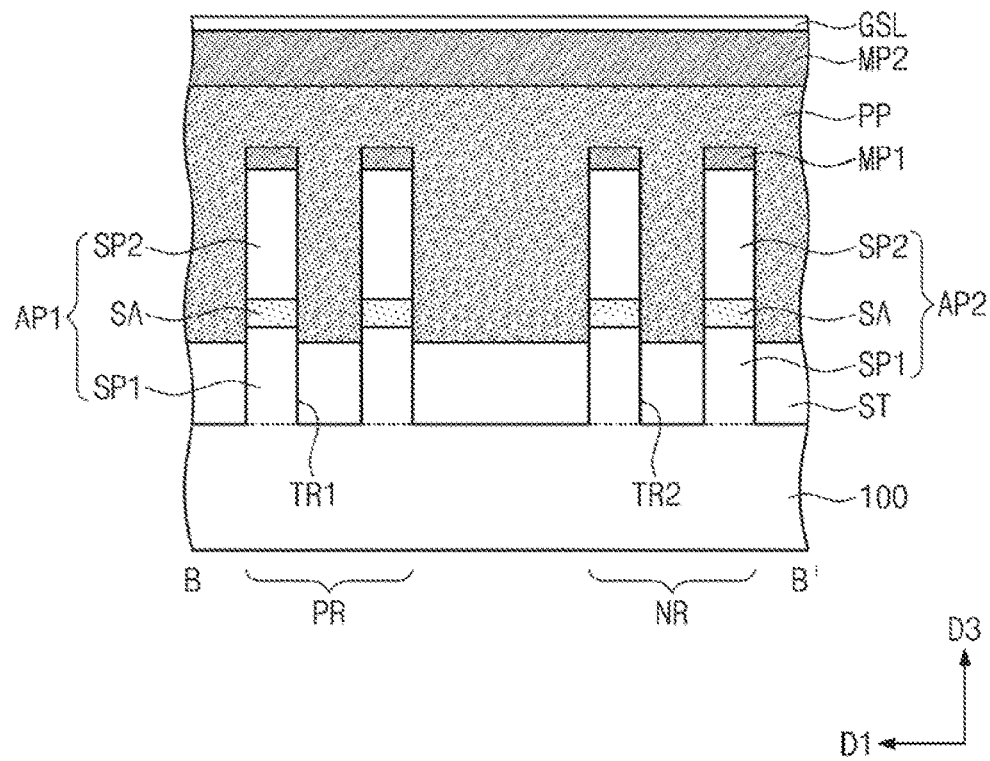
Figure 9C:
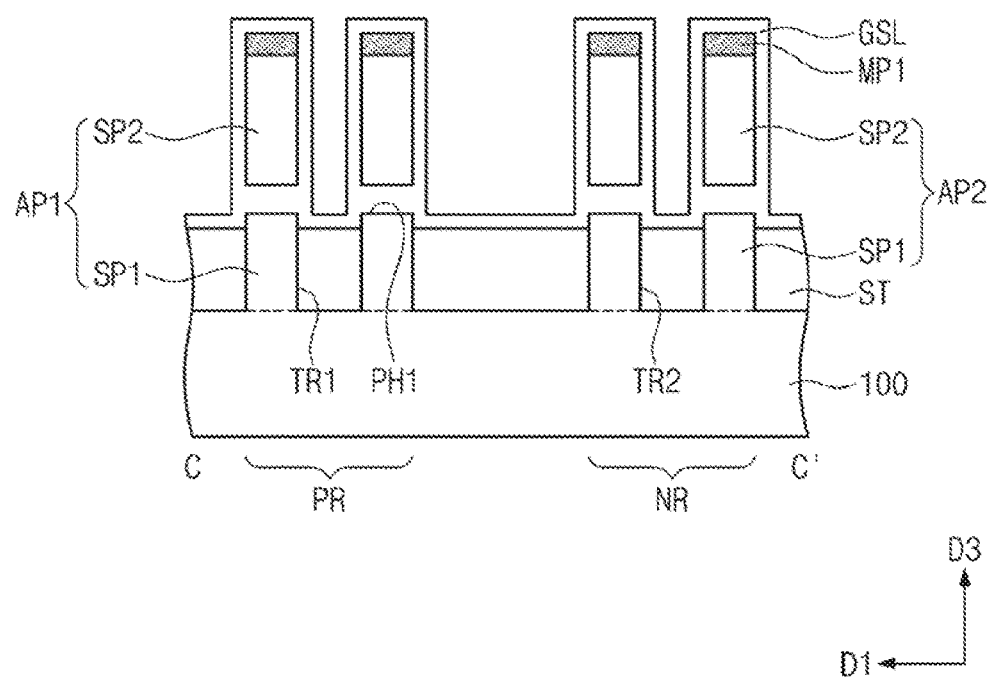
Figure 10:
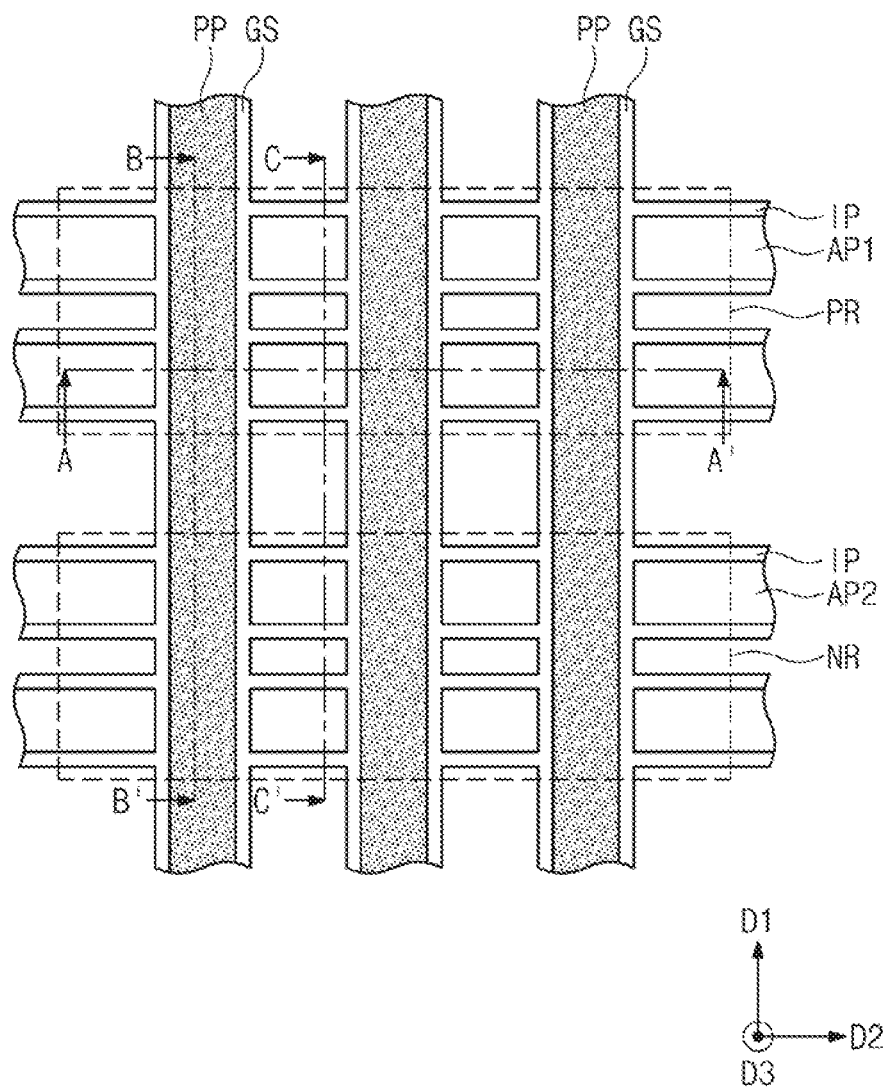
Figure 11A:
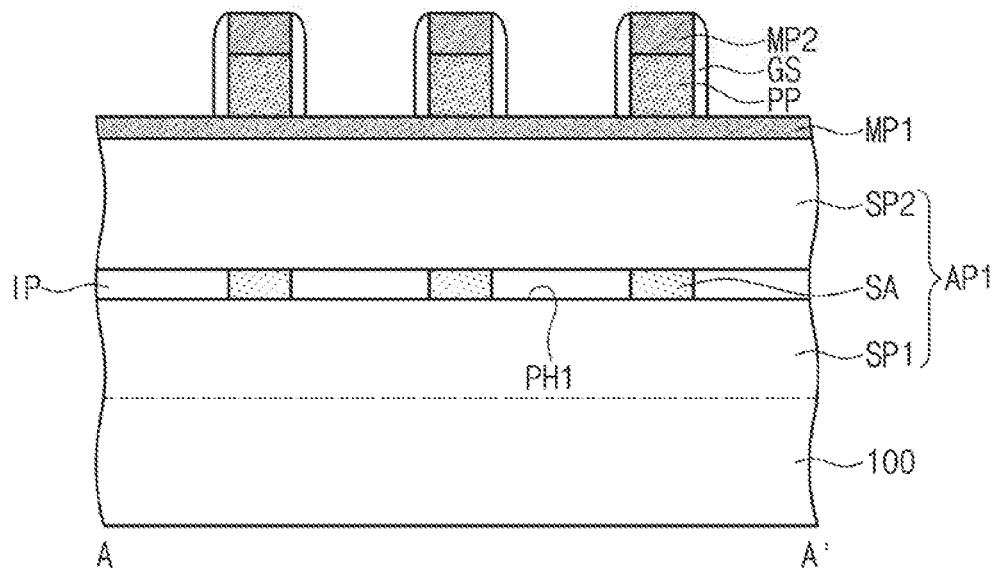
Figure 11A:
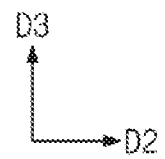
Figure 11B:
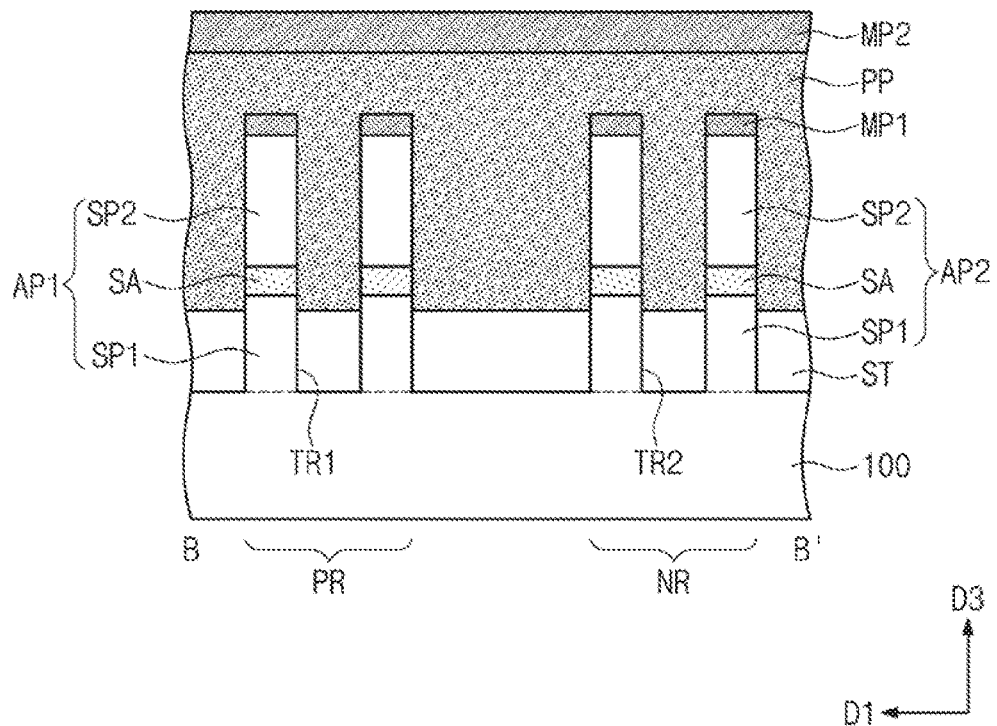
Figure 11C:
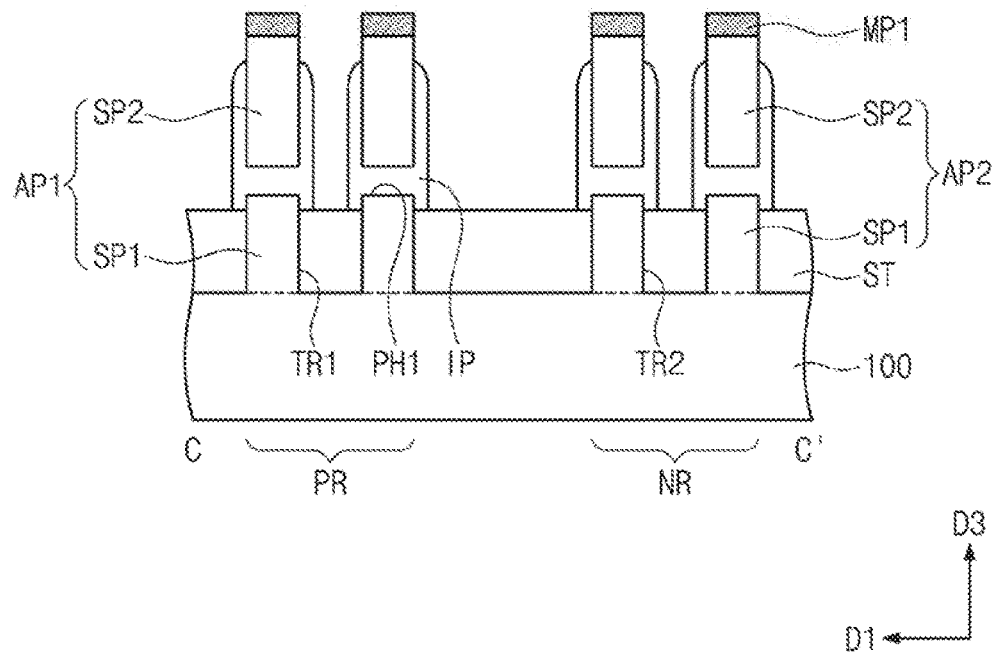
Figure 12:
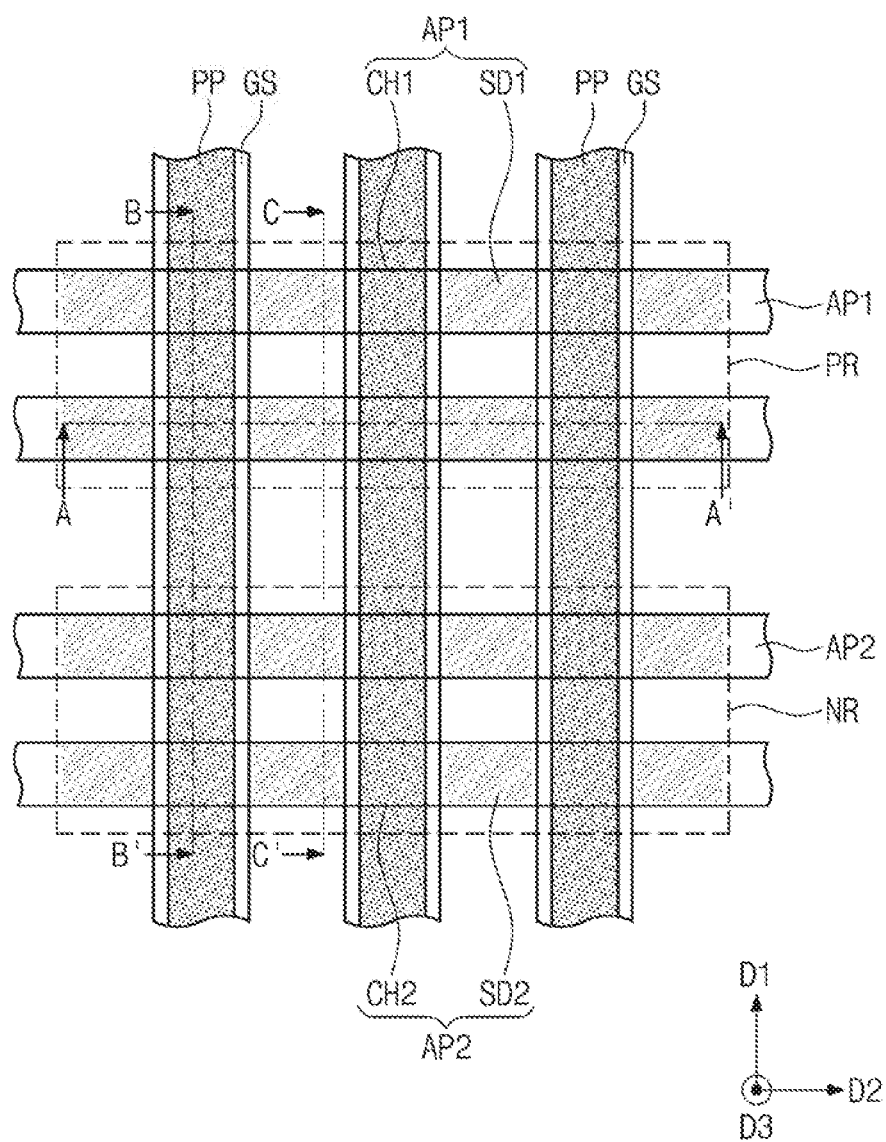
Figure 13A:
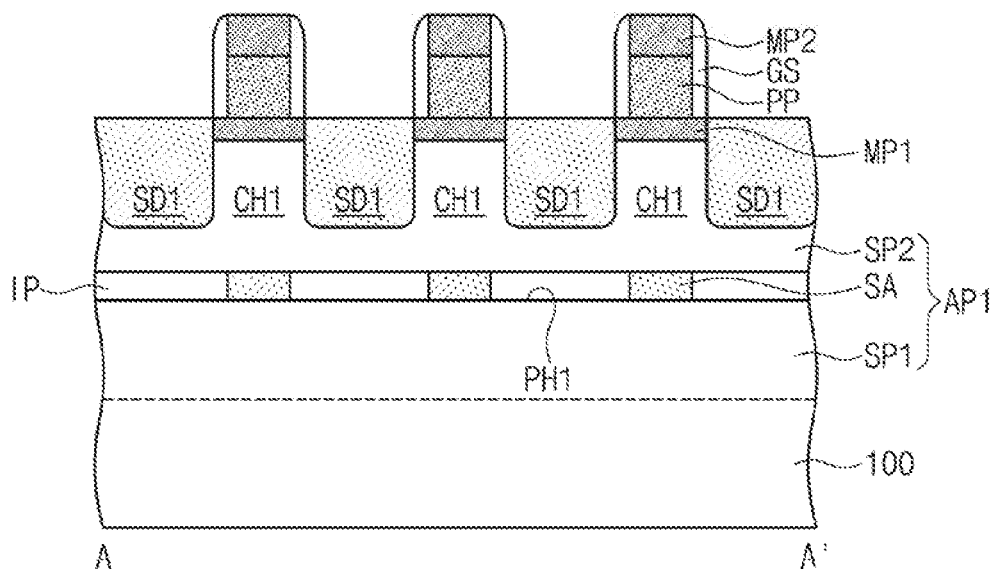
Figure 13A:
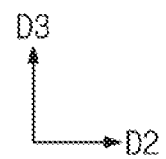
Figure 13B:
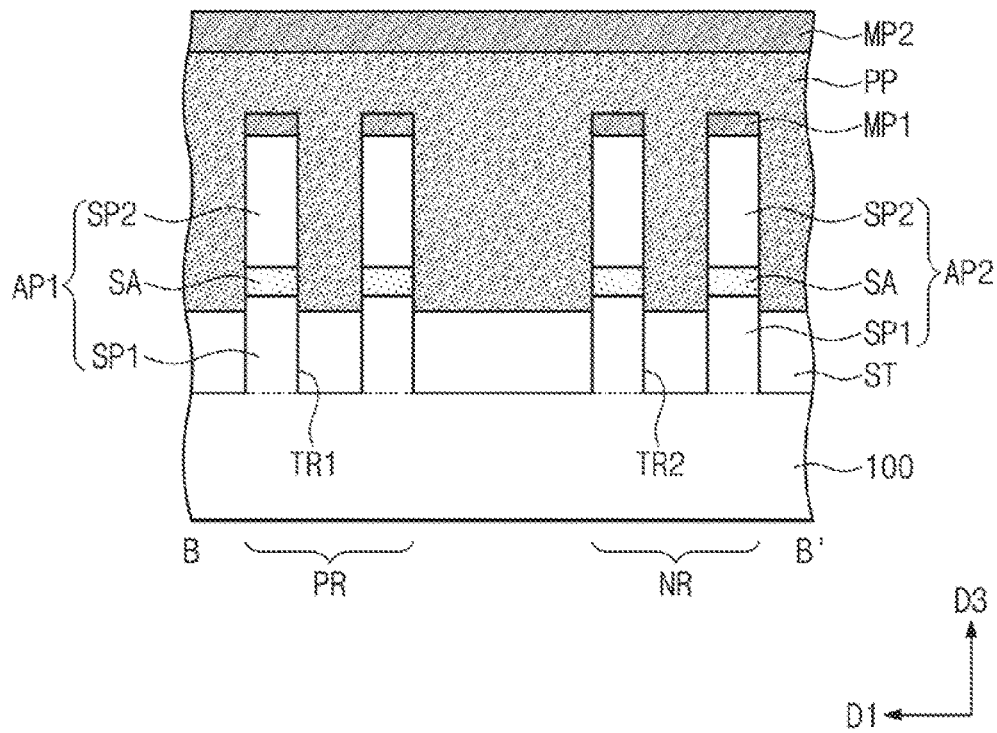
Figure 13C:
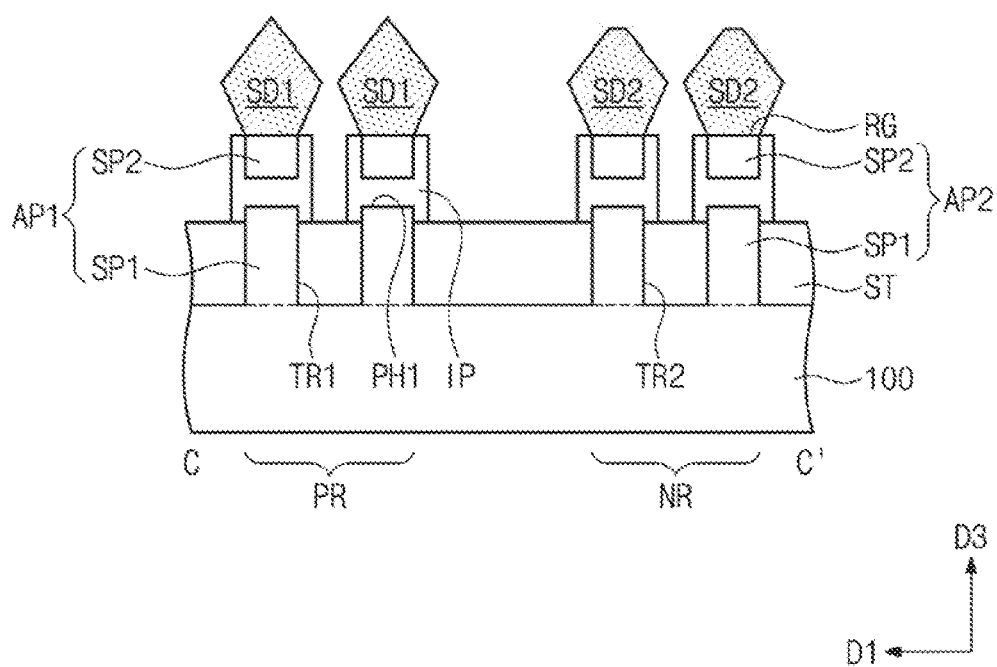
Figure 14:
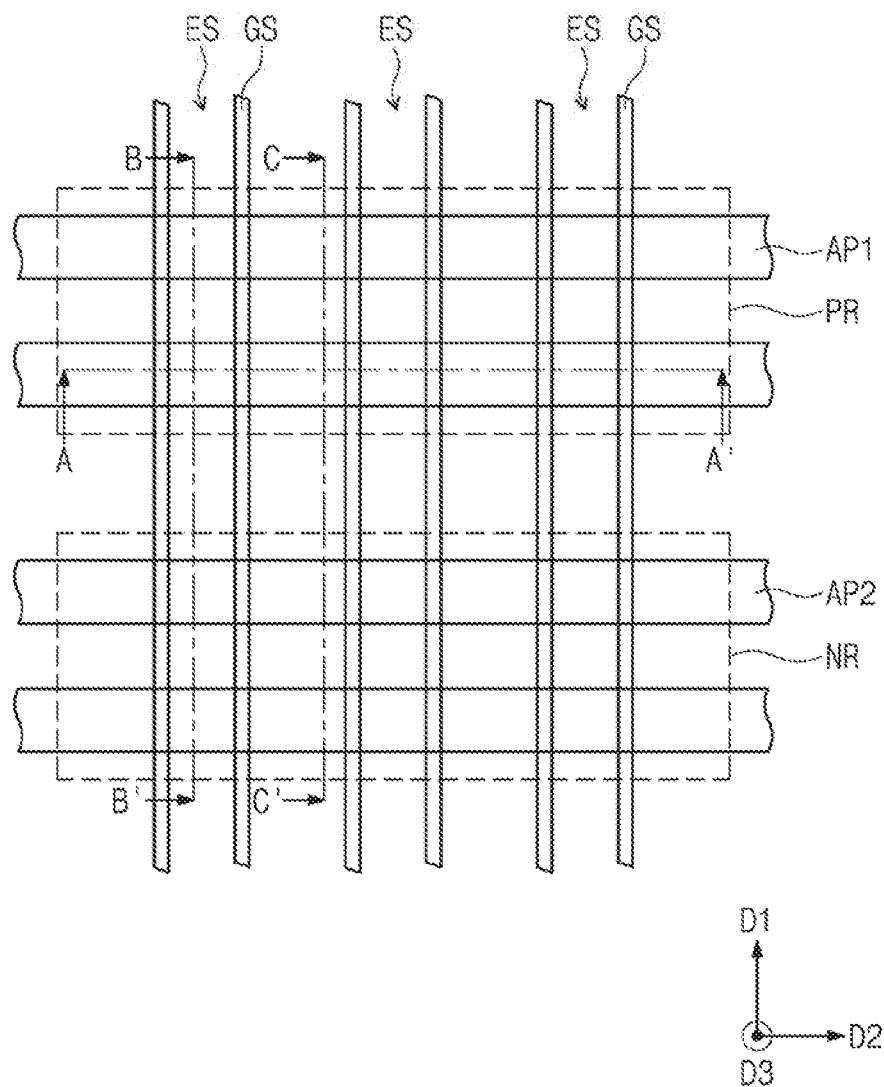
Figure 15A:
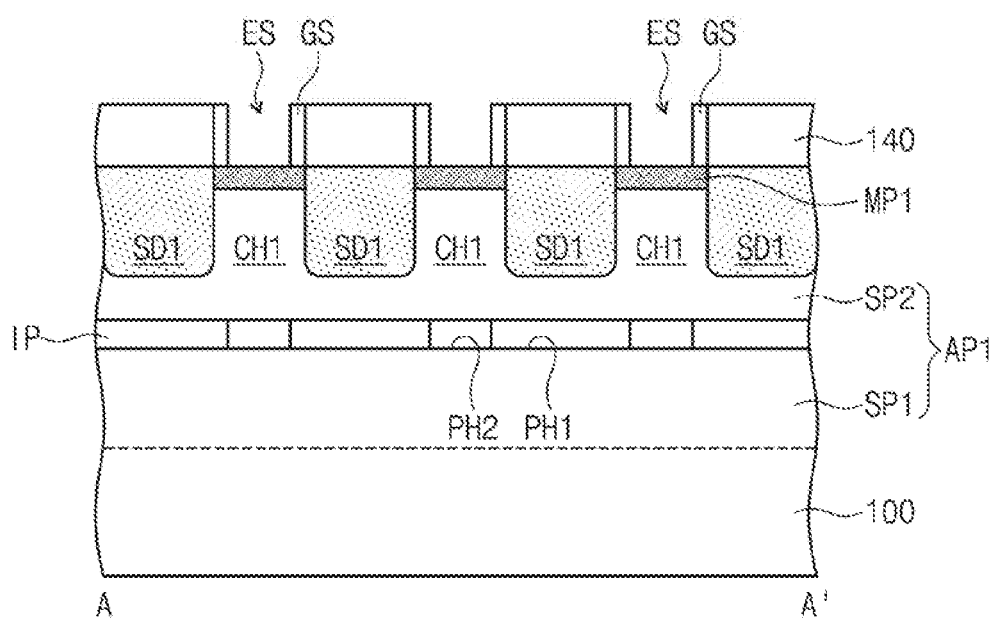
Figure 15A:
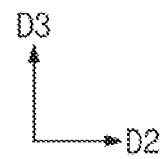
Figure 15B:
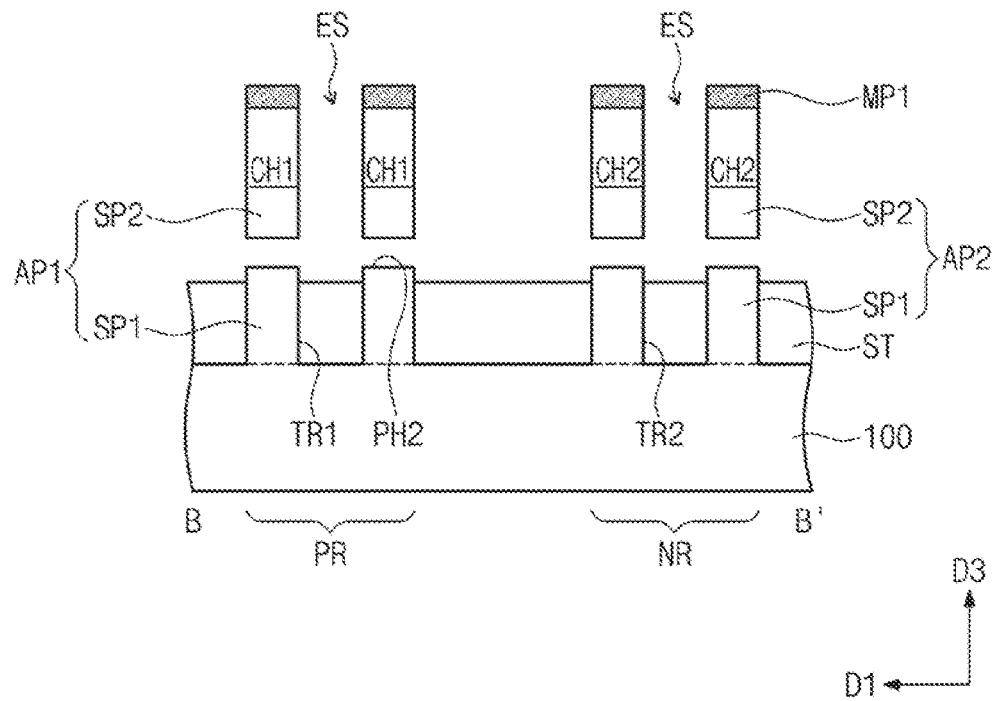
Figure 15C:
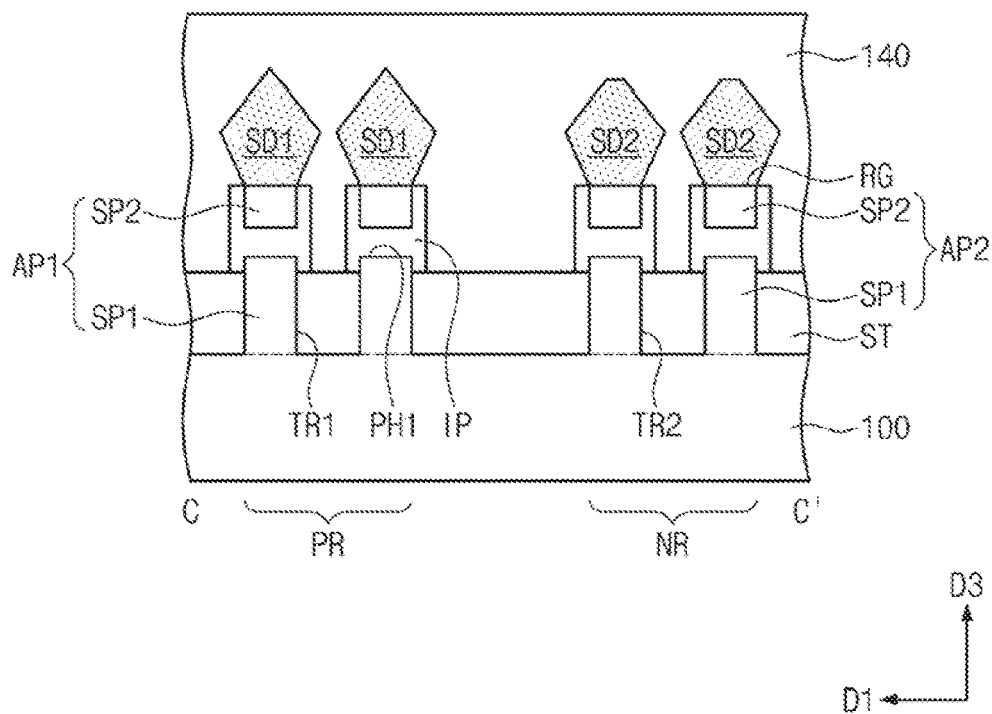
Figure 16:
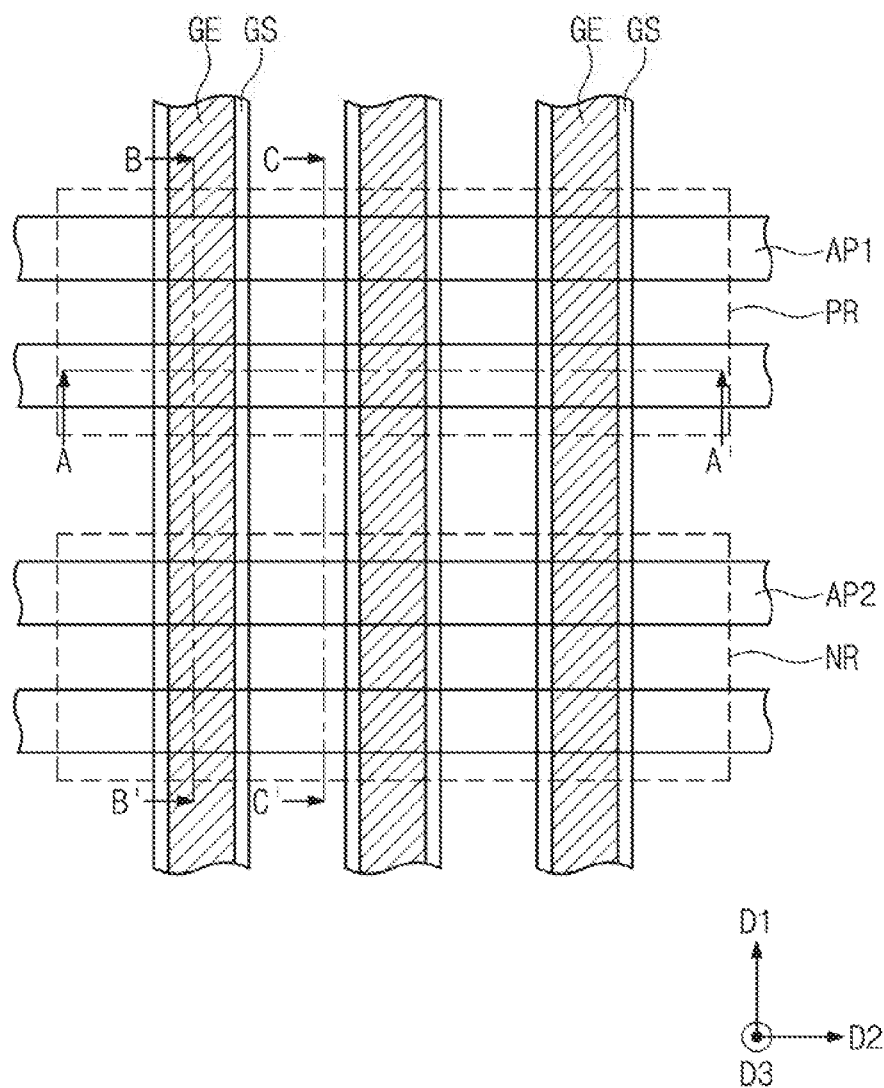
Figure 17A:
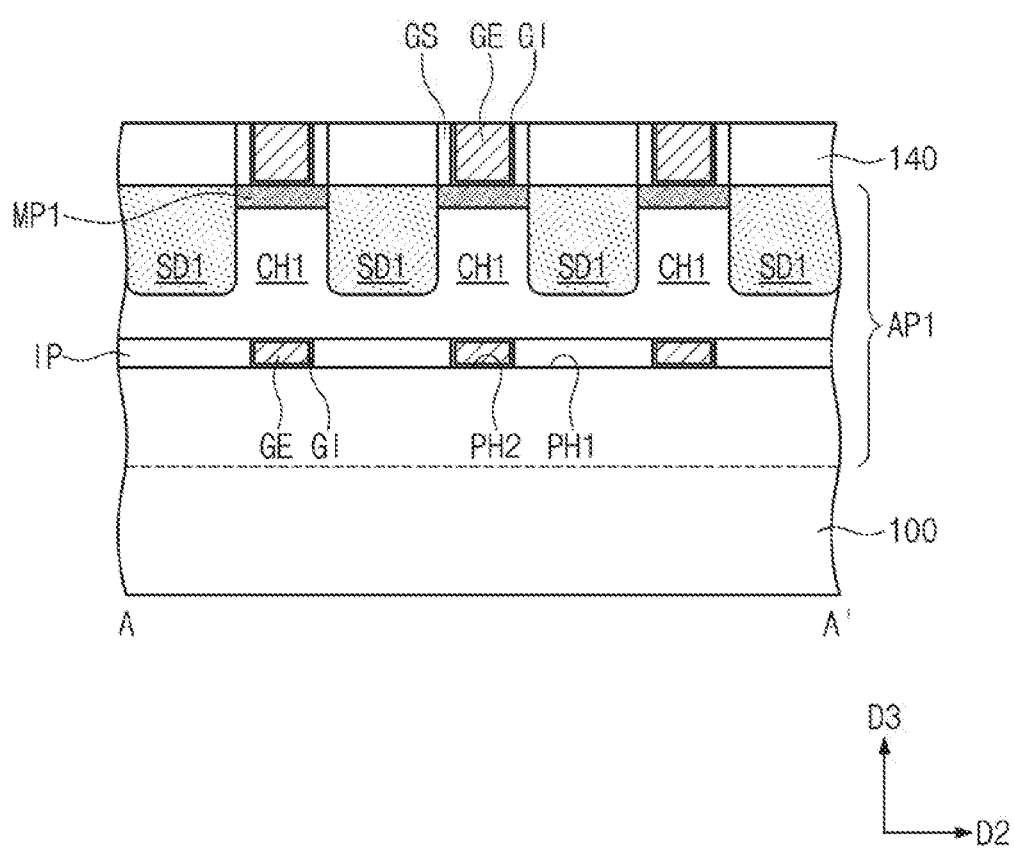
Figure 17B:
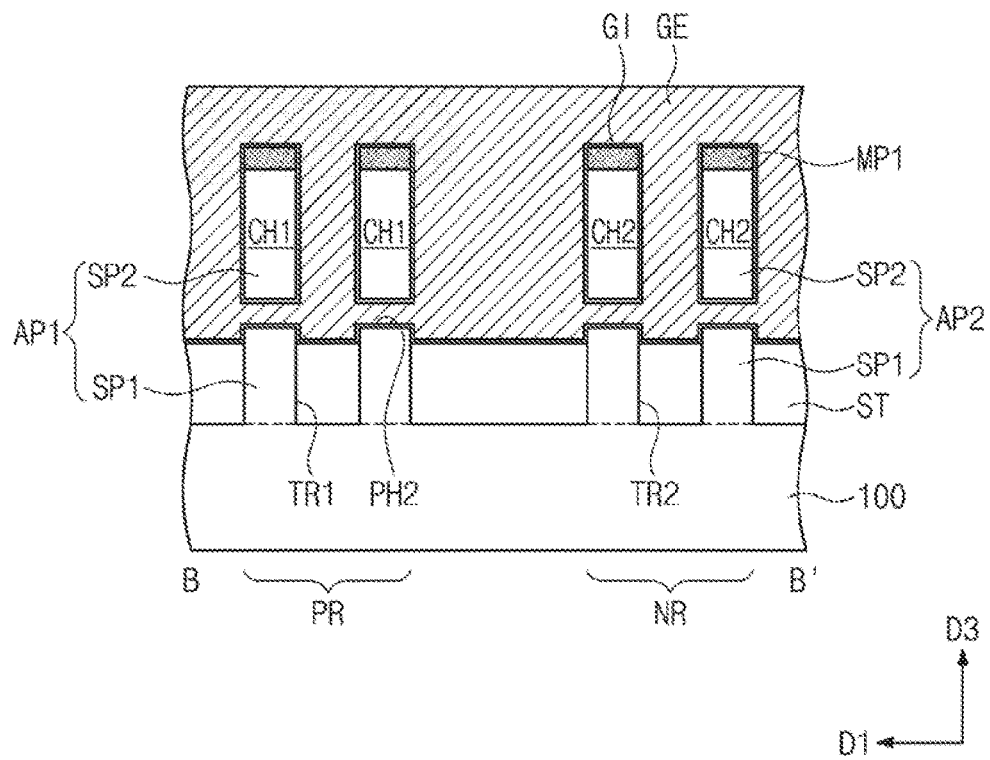
Figure 17C:
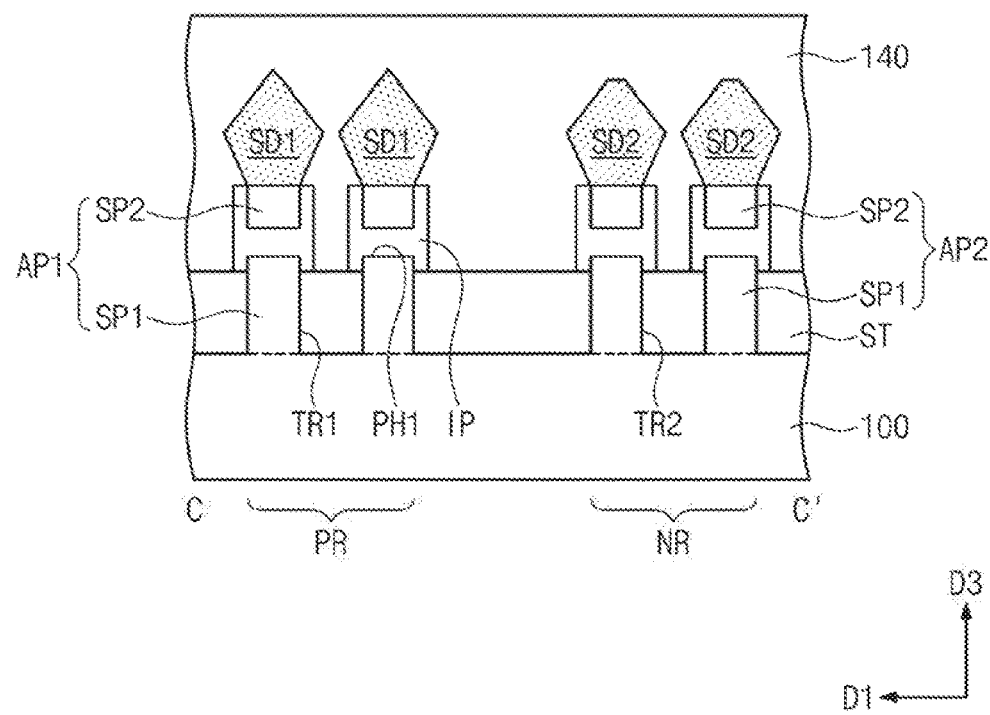

Referring to FIGS. 4, 5A, and 5B, a sacrificial layer and a semiconductor layer may be sequentially formed on a substrate 100. In exemplary embodiments of the inventive concept, the substrate 100 may be a silicon substrate. The sacrificial layer may include a germanium layer, a silicon-germanium layer, or a silicon oxide layer. The semiconductor layer may include a silicon layer. The sacrificial layer may have an etch selectivity with respect to the semiconductor layer and the substrate 100.

First mask patterns MP1 may be formed on the semiconductor layer. The semiconductor layer, the sacrificial layer, and the substrate 100 may be sequentially etched using the first mask patterns MP1 as etch masks to form first and second active patterns AP1 and AP2. The first and second active patterns AP1 and AP2 may have linear shapes extending in the second direction D2. The first active patterns AP1 may be formed on a PMOSFET region PR of the substrate 100, and the second active patterns AP2 may be formed on an NMOSFET region NR of the substrate 100. For example, the first mask patterns MP1 may include SiCN, SiCON, or SiN.

Each of the first and second active patterns AP1 and AP2 may include a first semiconductor pattern SP1 formed by patterning an upper portion of the substrate 100, a sacrificial pattern SA formed by patterning the sacrificial layer, and a second semiconductor pattern SP2 formed by patterning the semiconductor layer. The sacrificial pattern SA may be disposed between the first and second semiconductor patterns SP1 and SP2.

During the etching process, first trenches TR1 may be formed between the first active patterns AP1, and second trenches TR2 may be formed between the second active patterns AP2. Device isolation layers ST may be formed in the first and second trenches TR1 and TR2. For example, an insulating layer (e.g., a silicon oxide layer) may be formed to completely fill the first and second trenches TR1 and TR2. Thereafter, the insulating layer may be recessed to expose the first mask patterns MP1, the second semiconductor patterns SP2, and the sacrificial patterns SA. Top surfaces of the device isolation layers ST may be lower than top surfaces of the first semiconductor patterns SP1.

Referring to FIGS. 6 and 7A to 7C, preliminary gate patterns PP may be formed to intersect the first and second active patterns AP1 and AP2. Each of the preliminary gate patterns PP may have a line or bar shape extending in the first direction D1. For example, the formation of the preliminary gate patterns PP may include forming a preliminary gate layer on an entire surface of the substrate 100, forming second mask patterns MP2 on the preliminary gate layer, and etching the preliminary gate layer using the second mask patterns MP2 as etch masks. The preliminary gate layer may include a poly-silicon layer.

Referring to FIGS. 8 and 9A to 9C, the sacrificial patterns SA exposed by the preliminary gate patterns PP may be selectively removed to form the first cavities PH1. For example, the preliminary gate patterns PP may cover portions of the sacrificial patterns SA and may expose other portions of the sacrificial patterns SA. An isotropic etching process may be performed on the sacrificial patterns SA to remove the exposed portions of the sacrificial patterns SA. At this time, the covered portions of the sacrificial patterns SA may be protected by the preliminary gate patterns PP. A width, in the second direction D2, of the sacrificial pattern SA remaining after the isotropic etching process may be smaller than a width of the preliminary gate pattern PP in the second direction D2.

A spacer layer GSL may be conformally formed on an entire surface of the substrate 100. The spacer layer GSL may cover sidewalls of the preliminary gate patterns PP and sidewalls of the second semiconductor patterns SP2. The spacer layer GSL may fill the first cavities PH1. For example, the spacer layer GSL may include SiCN, SiCON, or SiN. In exemplary embodiments of the inventive concept, the spacer layer GSL may have a multi-layered structure including SiCN, SiCON, or SiN.

Referring to FIGS. 10 and 11A to 11C, the spacer layer GSL may be anisotropically etched to form gate spacers GS and insulating patterns IP. The anisotropic etching process may be performed until the first mask patterns MP1 and upper portions of the second semiconductor patterns SP2 are exposed. The gate spacers GS may cover the sidewalls of the preliminary gate patterns PP. The insulating patterns IP may cover lower portions of the sidewalls of the second semiconductor patterns SP2. The insulating patterns IP may fill the first cavities PH1.

Referring to FIGS. 12 and 13A to 13C, first source/drain patterns SD1 may be formed at both sides of each of the preliminary gate patterns PP disposed on the PMOSFET region PR. For example, the first mask patterns MP1 and upper portions of the second semiconductor patterns SP2, which are exposed, may be etched using the second mask patterns MP2 and the gate spacers GS as etch masks. Thus, recess regions RG may be formed in the upper portion of the second semiconductor pattern SP2 at both sides of each of the preliminary gate patterns PP. The first source/drain patterns SD1 may be formed by performing an SEG process using inner surfaces of the recess regions RG of the first active patterns AP1 as seed layers. For example, the SEG process may include a chemical vapor deposition (CVD) process or a molecular beam epitaxy (MBE) process.

Since the first source/drain patterns SD1 are formed, a first channel pattern CH1 may be disposed between a pair of the first source/drain patterns SD1 under the preliminary gate pattern PP. Each of the first source/drain patterns SD1 may include a semiconductor element with a lattice constant greater than that of a semiconductor element of the second semiconductor pattern SP2. For example, the first source/drain patterns SD1 may include silicon-germanium (SiGe). The first source/drain patterns SD1 may be doped with dopants (e.g., boron) by an in-situ method during the SEG process. Additionally, the first source/drain patterns SD1 may be doped with dopants after the SEG process.

Second source/drain patterns SD2 may be formed at both sides of each of the preliminary gate patterns PP disposed on the NMOSFET region NR. A method of forming the second source/drain patterns SD2 may be similar to the method of forming the first source/drain patterns SD1. Since the second source/drain patterns SD2 are formed, a second channel pattern CH2 may be disposed between a pair of the second source/drain patterns SD2 under the preliminary gate pattern PP. Each of the second source/drain patterns SD2 may include a semiconductor element with a lattice constant equal to or smaller than that of the semiconductor element of the second semiconductor pattern SP2. For example, the second source/drain patterns SD2 may include the same semiconductor element (e.g., silicon) as the second semiconductor pattern SP2. The second source/drain patterns SD2 may be doped with dopants (e.g., phosphorus).

The first source/drain patterns SD1 may not be formed simultaneously with the second source/drain patterns SD2. For example, the first source/drain patterns SD1 may be formed after forming a hard mask on the NMOSFET region NR. The second source/drain patterns SD2 may be formed after forming a hard mask on the PMOSFET region PR.

Referring to FIGS. 14 and 15A to 15C, a first interlayer insulating layer 140 may be formed on an entire surface of the substrate 100 to cover the first and second source/drain patterns SD1 and SD2, the second mask patterns MP2, and the gate spacers GS. For example, the first interlayer insulating layer 140 may include a silicon oxide layer.

The first interlayer insulating layer 140 may be planarized until top surfaces of the preliminary gate patterns PP are exposed. The planarization process of the first interlayer insulating layer 140 may be performed using an etch-back process or a chemical mechanical polishing (CMP) process. The second mask patterns MP2 may be completely removed during the planarization process. As a result, a top surface of the first interlayer insulating layer 140 may be substantially coplanar with the top surfaces of the preliminary gate patterns PP and top surfaces of the gate spacers GS. The exposed preliminary gate patterns PP may be selectively removed. Empty spaces ES may be formed by the removal of the preliminary gate patterns PP.

The empty spaces ES may expose the sacrificial patterns SA of the first and second active patterns AP1 and AP2. The sacrificial patterns SA exposed by the empty spaces ES may be selectively removed to form second cavities PH2. Each of the second cavities PH2 may be defined by a top surface of the first semiconductor pattern SP1, a bottom surface of the second semiconductor pattern SP2, and sidewalls of the insulating patterns IP adjacent to each other. The second cavities PH2 may be connected to the empty spaces ES. The selective removal of the sacrificial patterns SA may be performed by an isotropic etching process.

Referring to FIGS. 16 and 17A to 17C, a gate dielectric pattern GI and a gate electrode GE may be formed in each of the empty spaces ES. The gate dielectric pattern GI and the gate electrode GE may fill the second cavities PH2.

For example, the gate dielectric pattern GI may be conformally formed in the empty space ES to partially fill the empty space ES. The gate dielectric pattern GI may be formed using an atomic layer deposition (ALD) process or a chemical oxidation process. For example, the gate dielectric pattern GI may include a high-k dielectric material. For example, the high-k dielectric material may include hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate electrode layer may be formed to completely fill the empty space ES, and a planarization process may be performed on the gate electrode layer to form the gate electrode GE. For example, the gate electrode layer may include a conductive metal nitride (e.g., titanium nitride or tantalum nitride) or a metal material (e.g., titanium, tantalum, tungsten, copper, or aluminum).

Referring again to FIGS. 1 and 2A to 2C, upper portions of the gate electrodes GE may be recessed. Remaining first mask patterns MP1 may act as etch masks when the gate electrodes GE are recessed. The first and second channel patterns CH1 and CH2 may be protected by the first mask patterns MP1, and the gate electrodes GE and the gate dielectric patterns GI may be selectively etched by using the first mask patterns MP1 as etch masks.

The recessing process may be performed until top surfaces of the gate electrodes GE are disposed at substantially the same level as or a lower level than bottom surfaces of the first mask patterns MP1. In exemplary embodiments of the inventive concept, the recessing process may be performed until the top surfaces of the gate electrodes GE are disposed at substantially the same level as or a lower level than top surfaces of the first and second channel patterns CH1 and CH2. Recessed top surfaces RS may be formed at the gate electrodes GE by the recessing process. The recessed top surfaces RS may be formed between the channel patterns adjacent to each other in the first direction D1. The recessed top surfaces RS may be concave toward the substrate 100.

In exemplary embodiments of the inventive concept, the height H4 of the gate electrode GE between a pair of the first channel patterns CH1 adjacent to each other in the first direction D1 may be greater than the height H2 of the gate electrode GE between the first channel pattern CH1 and the second channel pattern CH2. Since a distance between the first channel pattern CH1 and the second channel pattern CH2 is greater than a distance between the pair of first channel patterns CH1, an exposed area of the gate electrode GE between the first and second channel patterns CH1 and CH2 may be greater than an exposed area of the gate electrode GE between the pair of first channel patterns CH1. Thus, an etching degree of the gate electrode GE between the first and second channel patterns CH1 and CH2 may be greater than an etching degree of the gate electrode GE between the pair of first channel patterns CH1.

The gate capping patterns GP may be formed on the recessed gate electrodes GE, respectively. The gate capping patterns GP may be formed to cover the recessed top surfaces RS of the gate electrodes GE and the first mask patterns MP1. For example, the gate capping patterns GP may include SiON, SiCN, SiCON, or SiN.

The second interlayer insulating layer 150 may be formed on the first interlayer insulating layer 140 and the gate capping patterns GP. The second interlayer insulating layer 150 may include a silicon oxide layer or a low-k oxide layer. For example, the low-k oxide layer may include a silicon oxide layer doped with carbon, e.g., SiCOH. The second interlayer insulating layer 150 may be formed by a CVD process.

The contacts AC may be formed to penetrate the second and first interlayer insulating layers 150 and 140. The contacts AC may be connected to the first and second source/drain patterns SD1 and SD2. The formation of the contacts AC may include forming contact holes exposing the first and second source/drain patterns SD1 and SD2, forming barrier layers 160 partially filling the contact holes, and forming conductive pillars 165 completely filling the contact holes. For example, the barrier layer 160 may include metal nitrides such as titanium nitride (TiN), tantalum nitride (TaN), or tungsten nitride (WN). For example, the conductive pillar 165 may include metal materials such as aluminum, copper, tungsten, molybdenum, or cobalt.

The contact AC may be formed to have a bottom surface disposed at the first level LV1. The highest point of the gate electrode GE may be disposed at the second level LV2 through the recessing process. The second level LV2 may be substantially the same as or lower than the first level LV1. However, in exemplary embodiments of the inventive concept, the gate electrode GE may be lower than the contact AC, and thus, a parasitic capacitance therebetween may be reduced. As a result, an operating speed and electrical characteristics of the semiconductor device can be increased.

Figure 18:
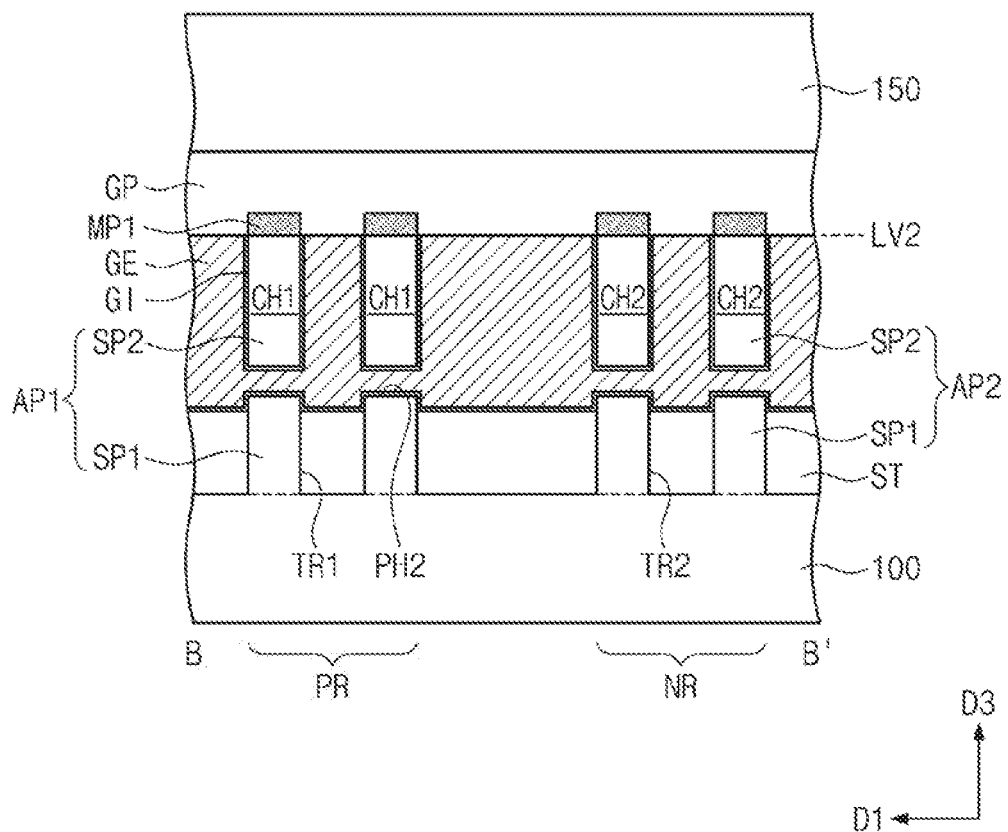
FIGS. 18, 19, and 20 are cross-sectional views taken along the line B-B' of FIG. 1 to illustrate semiconductor devices according to exemplary embodiments of the inventive concept.
Figure 19:
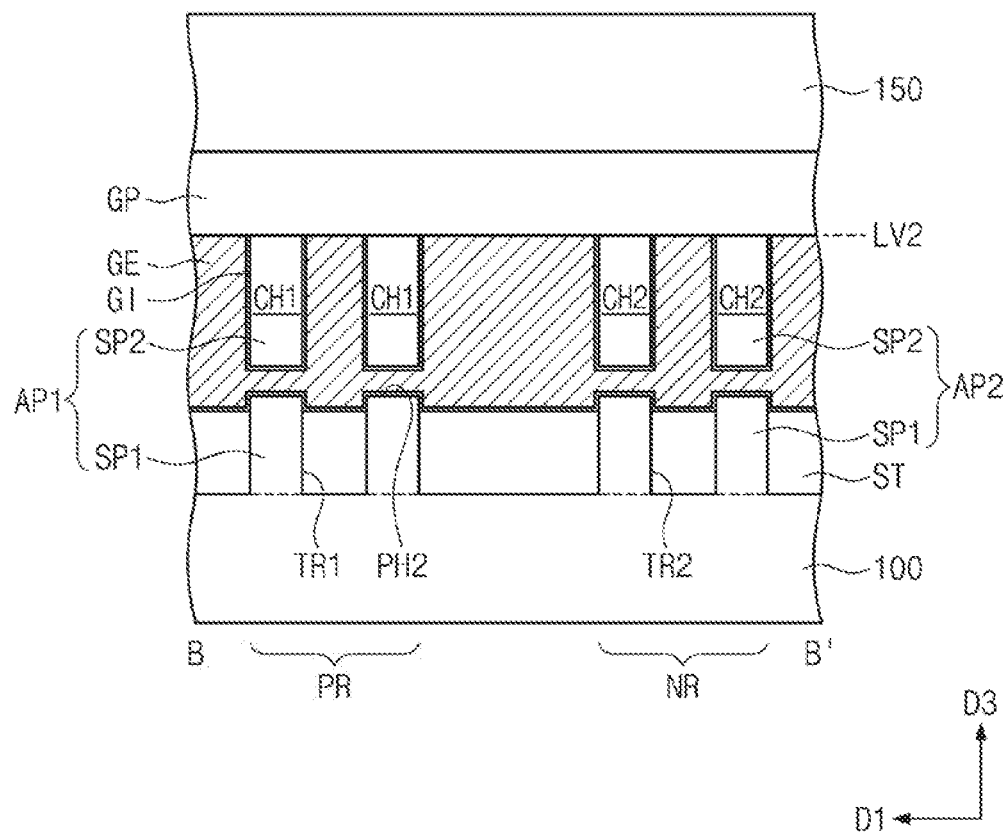
Figure 20:
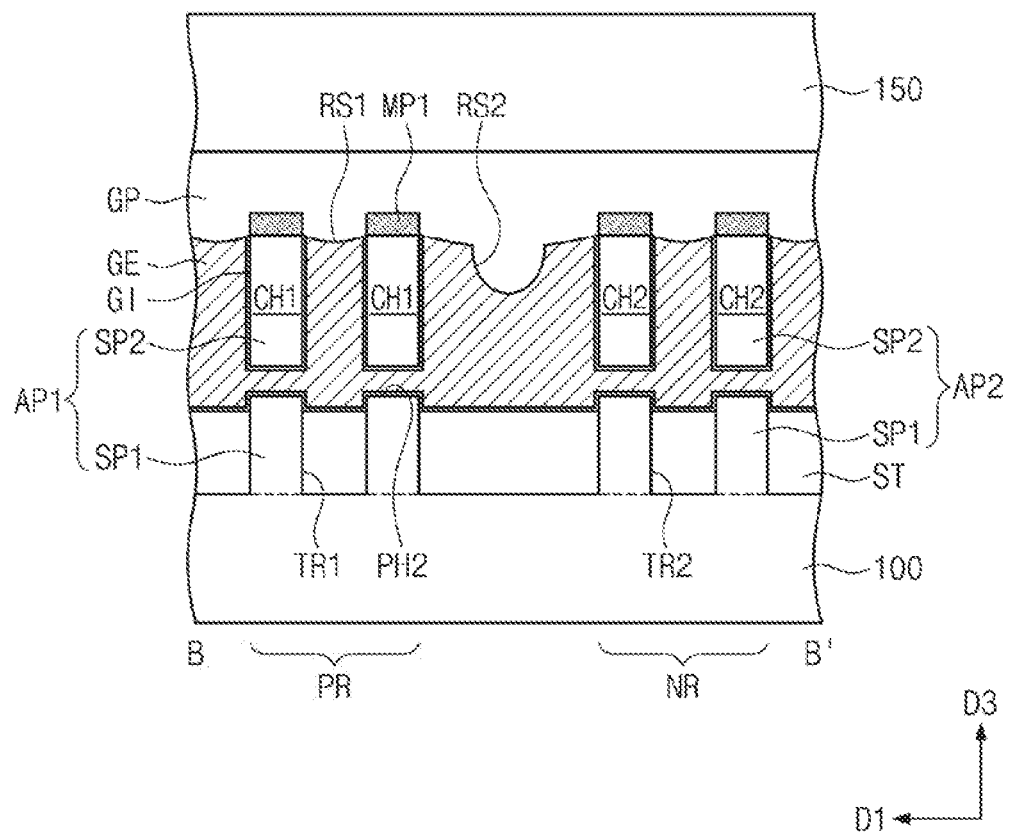

FIGS. 18, 19, and 20 are cross-sectional views taken along the line B-B' of FIG. 1 to illustrate semiconductor devices according to exemplary embodiments of the inventive concept. In the embodiments of FIGS. 18, 19 and 20, the descriptions regarding the same technical features as in the embodiments of FIGS. 1, 2A to 2C, 3A, and 3B will be omitted for the purpose of ease and convenience in explanation. In other words, differences between the embodiments of FIGS. 18, 19 and 20 and the embodiments of FIGS. 1, 2A to 2C, 3A, and 3B will be mainly described hereinafter.

Referring to FIGS. 1, 2A, 2C, and 18, a top surface of each of gate electrodes GE may be flat. For example, a height of the gate electrode GE may be substantially uniform from the first channel pattern CH1 to the second channel pattern CH2. A second level LV2 of the top surface of the gate electrode GE may be substantially the same as or lower than the first level LV1 of the bottom surface of the contact AC.

Referring to FIGS. 1, 2A, 2C, and 19, the first mask patterns MP1 may be omitted from the top surfaces of the first and second channel patterns CH1 and CH2. The top surface of each of the gate electrodes GE may be flat. The top surface of the gate electrode GE may be substantially coplanar with or lower than the top surfaces of the first and second channel patterns CH1 and CH2. The top surfaces of the first and second channel patterns CH1 and CH2 may be in direct contact with a bottom surface of the gate capping pattern GP. The second level LV2 of the top surface of the gate electrode GE may be substantially the same as or lower than the first level LV1 of the bottom surface of the contact AC.

Referring to FIGS. 1, 2A, 2C, and 20, each of gate electrodes GE may include a first recessed top surface RS1 and a second recessed top surface RS2. The second recessed top surface RS2 may be formed between the PMOSFET region PR and the NMOSFET region NR when viewed in a plan view. The second recessed top surface RS2 may extend away from the first recessed top surface RS1 toward the substrate 100. The second recessed top surface RS2 may be concave away from the first recessed top surface RS1 and protruded toward the substrate 100.

Figure 21A:
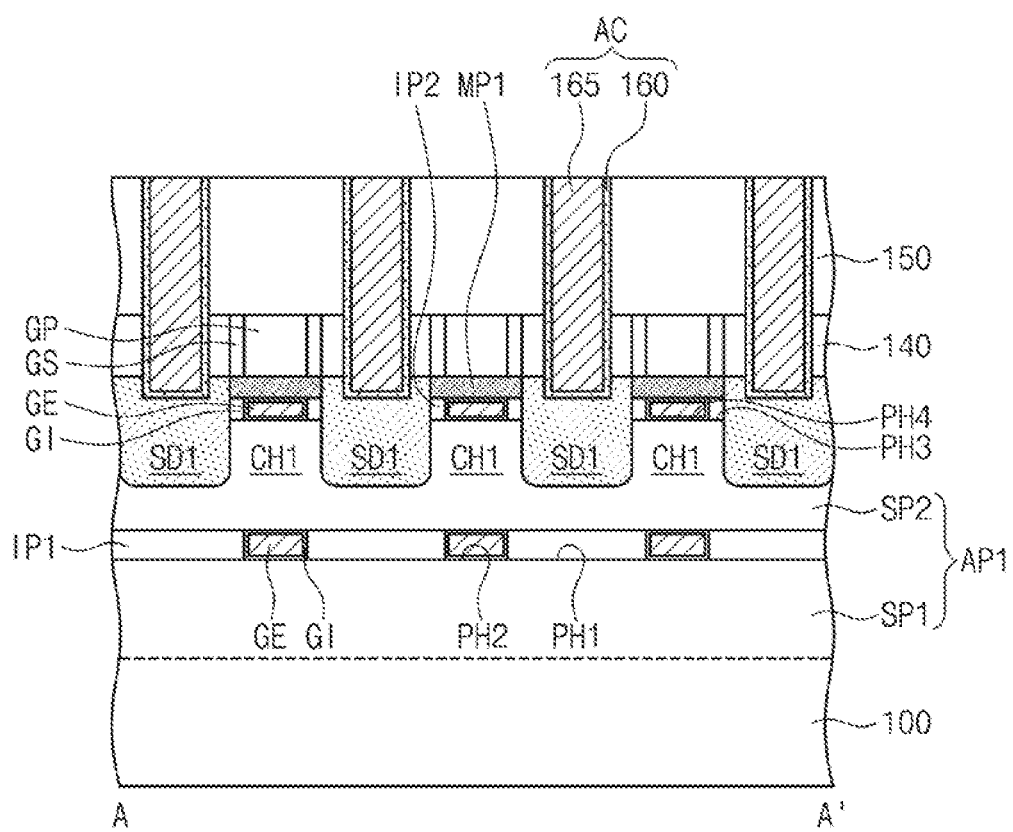
FIGS. 21A, 21B, and 21C are cross-sectional views taken along the lines A-A', B-B', and C-C' of FIG. 1, respectively, to illustrate a semiconductor device according to exemplary embodiments of the inventive concept.
Figure 21A:
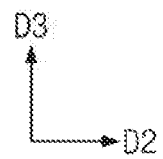
Figure 21B:
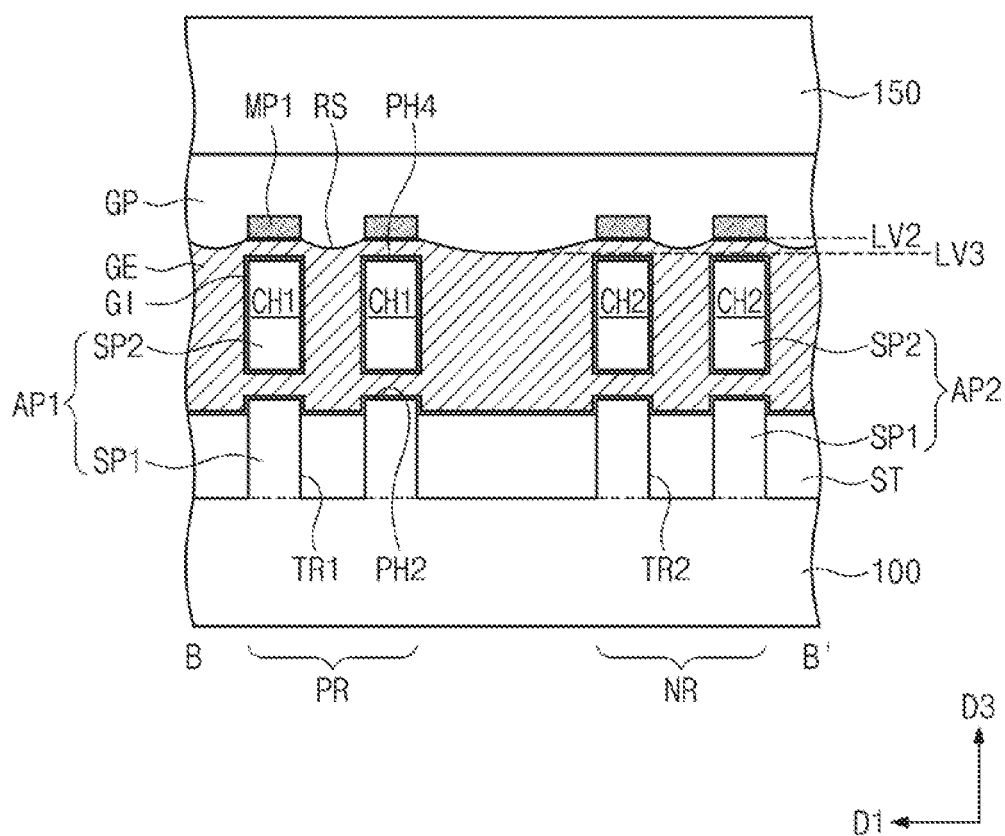
Figure 21C:
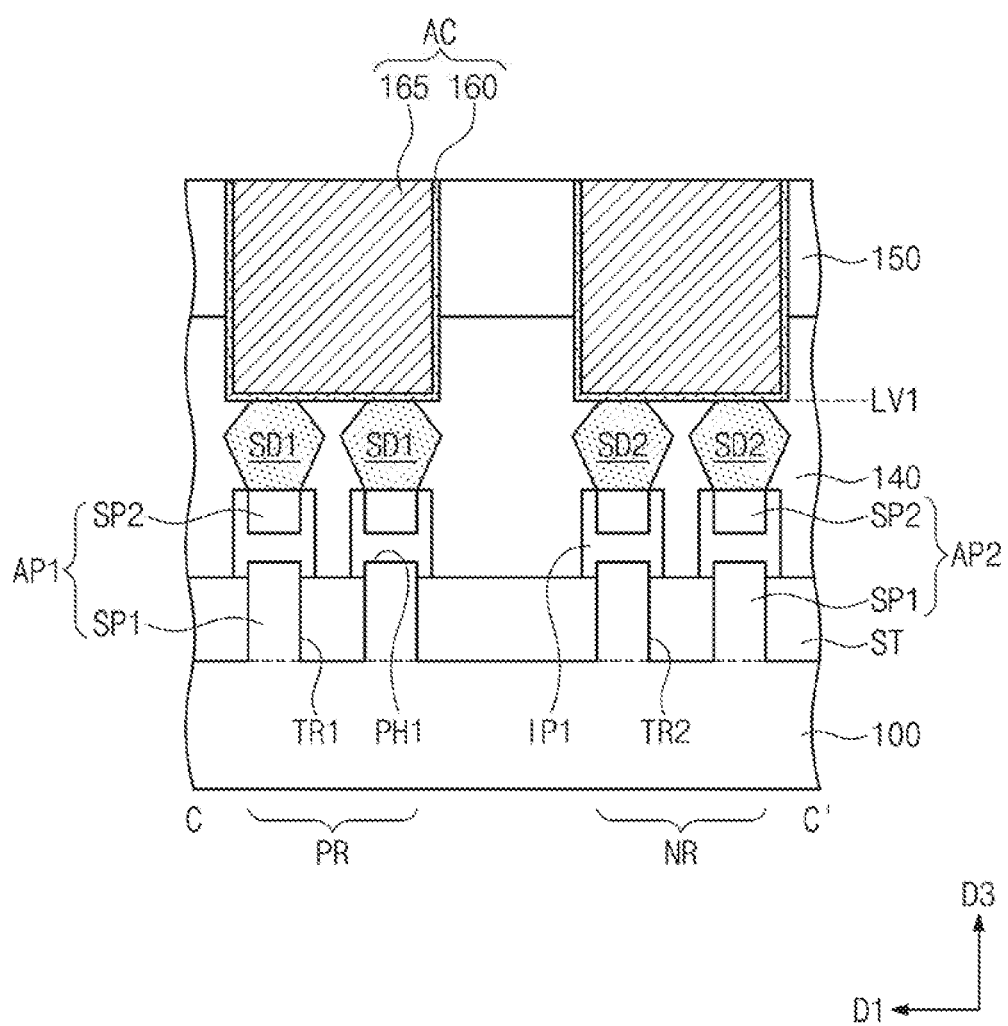
Figure 22:
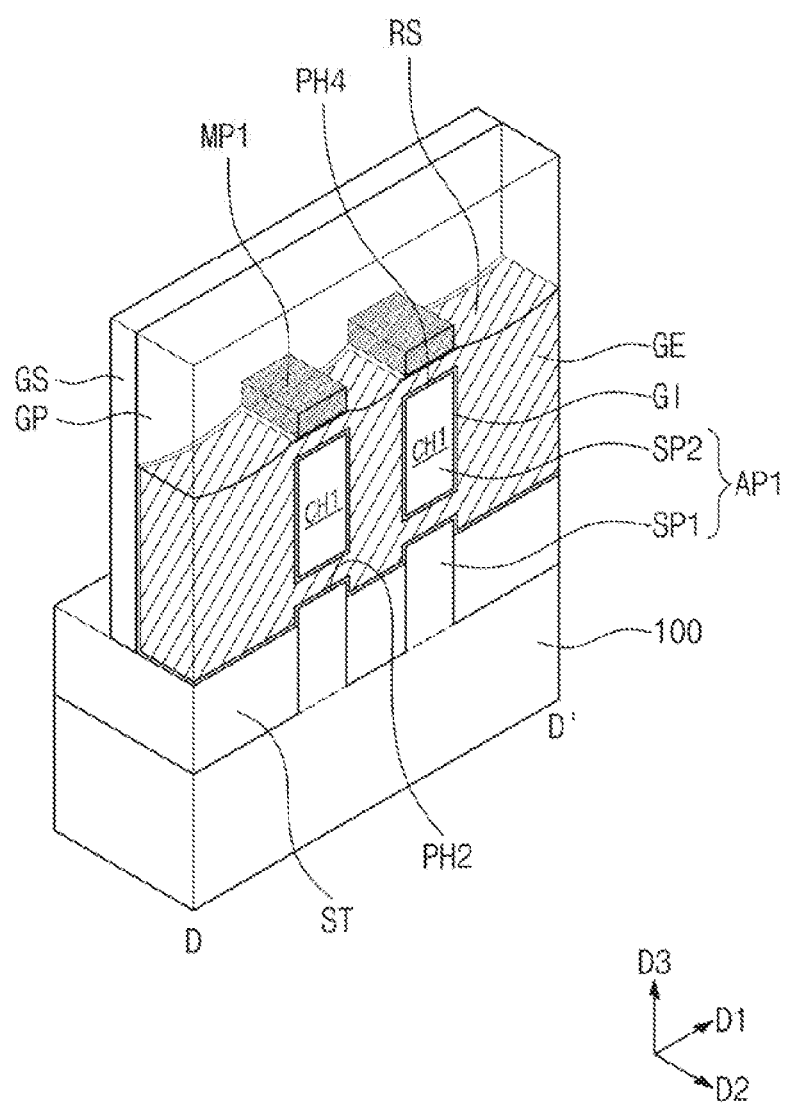
FIG. 22 is a perspective view taken along the line D-D' of FIG. 3A to illustrate a semiconductor device according to exemplary embodiments of the inventive concept.

FIGS. 21A, 21B, and 21C are cross-sectional views taken along the lines A-A', B-B', and C-C' of FIG. 1, respectively, to illustrate a semiconductor device according to exemplary embodiments of the inventive concept. FIG. 22 is a perspective view taken along the line D-D' of FIG. 3A to illustrate a semiconductor device according to exemplary embodiments of the inventive concept. In the embodiments of FIGS. 21A, 21B, 21C and 22, the descriptions regarding the same technical features as in the embodiments of FIGS. 1, 2A to 2C, 3A, and 3B will be omitted or mentioned briefly for the purpose of ease and convenience in explanation. In other words, differences between the embodiments of FIGS. 21A, 21B, 21C and 22 and the embodiments of FIGS. 1, 2A to 2C, 3A, and 3B will be mainly described hereinafter.

Referring to FIGS. 1, 3A, 21A, 21B, 21C, and 22, third cavities PH3 and fourth cavities PH4 may be defined between the second semiconductor pattern SP2 and the first mask patterns MP1. The third and fourth cavities PH3 and PH4 on the first active pattern AP1 may correspond to a space surrounded by the first channel pattern CH1, a pair of first source/drain patterns SD1, and the first mask pattern MP1. The third and fourth cavities PH3 and PH4 on the second active pattern AP2 may correspond to a space surrounded by the second channel pattern CH2, a pair of second source/drain patterns SD2, and the first mask pattern MP1. The fourth cavity PH4 may be disposed between a pair of the third cavities PH3 on each of the first and second channel patterns CH1 and CH2. The first mask patterns MP1 may be vertically spaced apart from the first and second channel patterns CH1 and CH2 by the third and fourth cavities PH3 and PH4. Heights (or lengths) of the third and fourth cavities PH3 and PH4 in a third direction D3 may be substantially equal to or different from heights (or lengths) of the first and second cavities PH1 and PH2 in the third direction D3. The third direction D3 may be substantially perpendicular to the top surface of the substrate 100.

First insulating patterns IP1 may be provided to fill the first cavities PH1, and second insulating patterns IP2 may be provided to fill the third cavities PH3. The first and second insulating patterns IP1 and IP2 may include the same material as the gate spacer GS.

Each of the gate electrodes GE and each of the gate dielectric patterns GI may fill the fourth cavities PH4. In other words, a first portion of the gate electrode GE and a first portion of the gate dielectric pattern GI may be disposed between the first channel pattern CH1 and the first mask pattern MP1. A second portion of the gate electrode GE and a second portion of the gate dielectric pattern GI may be disposed between the second channel pattern CH2 and the first mask pattern MP1. The gate electrode GE and the gate dielectric pattern GI may be spaced apart from the first and second source/drain patterns SD1 and SD2 with the second insulating patterns IP2 interposed therebetween.

The gate electrode GE may surround the top surface, both sidewalls and the bottom surface of each of the first and second channel patterns CH1 and CH2, as illustrated in FIG. 21B. In other words, the semiconductor device according to the present embodiment may include a gate-all-around-type field effect transistor that includes a channel pattern with an outer circumferential surface surrounded by the gate electrode GE.

The bottom surface of the contact AC may be disposed at the first level LV1. The highest point of the top surface of the gate electrode GE may be disposed at the second level LV2. The lowest point of the top surface of the gate electrode GE may be disposed at the third level LV3. In exemplary embodiments of the inventive concept, the second level LV2 may be substantially the same as or lower than the first level LV1. The third level LV3 may be lower than the first level LV1.

FIGS. 23A, 24A, 25A, 26A, 27A, 28A, and 29A are cross-sectional views taken along the lines A-A' of FIGS. 4, 6, 8, 10, 12, 14, and 16, respectively, to illustrate a method for manufacturing a semiconductor device according to exemplary embodiments of the inventive concept. FIGS. 23B, 24B, 25B, 26B, 27B, 28B, and 29B are cross-sectional views taken along the lines B-B' of FIGS. 4, 6, 8, 10, 12, 14, and 16, respectively, to illustrate a method for manufacturing a semiconductor device according to exemplary embodiments of the inventive concept. FIGS. 24C, 25C, 26C, 27C, 28C, and 29C are cross-sectional views taken along the lines C-C' of FIGS. 6, 8, 10, 12, 14, and 16, respectively, to illustrate a method for manufacturing a semiconductor device according to exemplary embodiments of the inventive concept. In the following embodiments, the descriptions regarding the same technical features as in the embodiments of FIGS. 4 to 17C will be omitted or mentioned briefly for the purpose of ease and convenience in explanation. In other words, differences between the following embodiments and the embodiments of FIGS. 4 to 17C will be mainly described hereinafter.

Figure 23A:
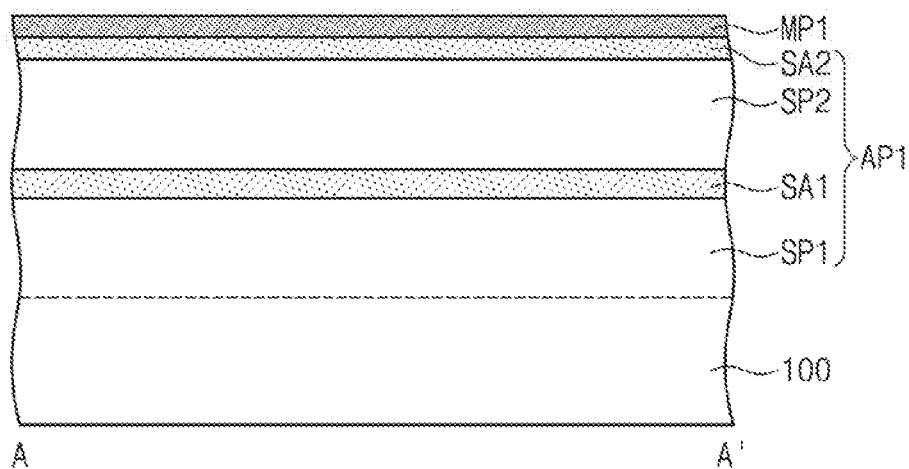
FIGS. 23A, 24A, 25A, 26A, 27A, 28A, and 29A are cross-sectional views taken along the lines A-A' of FIGS. 4, 6, 8, 10, 12, 14, and 16, respectively, to illustrate a method for manufacturing a semiconductor device according to exemplary embodiments of the inventive concept.
Figure 23A:
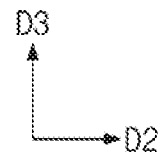
Figure 23B:
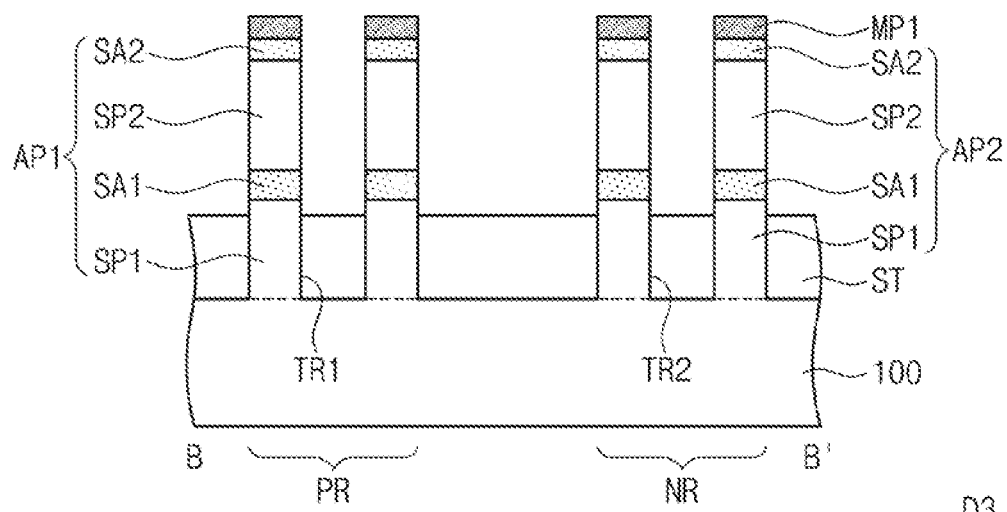
FIGS. 23B, 24B, 25B, 26B, 27B, 28B, and 29B are cross-sectional views taken along the lines B-B' of FIGS. 4, 6, 8, 10, 12, 14, and 16, respectively, to illustrate a method for manufacturing a semiconductor device according to exemplary embodiments of the inventive concept.
Figure 23B:
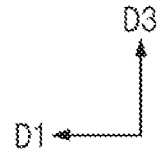
Figure 24A:
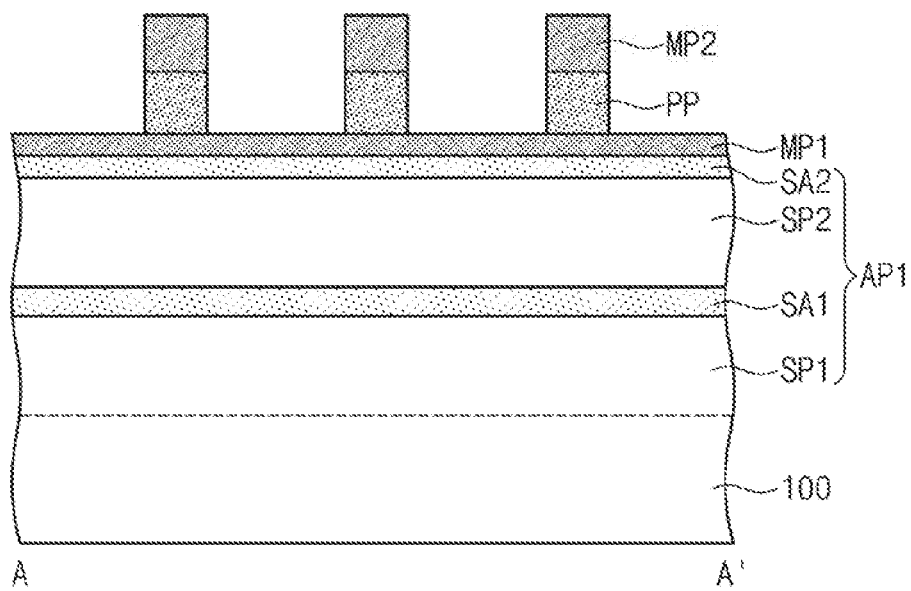
Figure 24B:
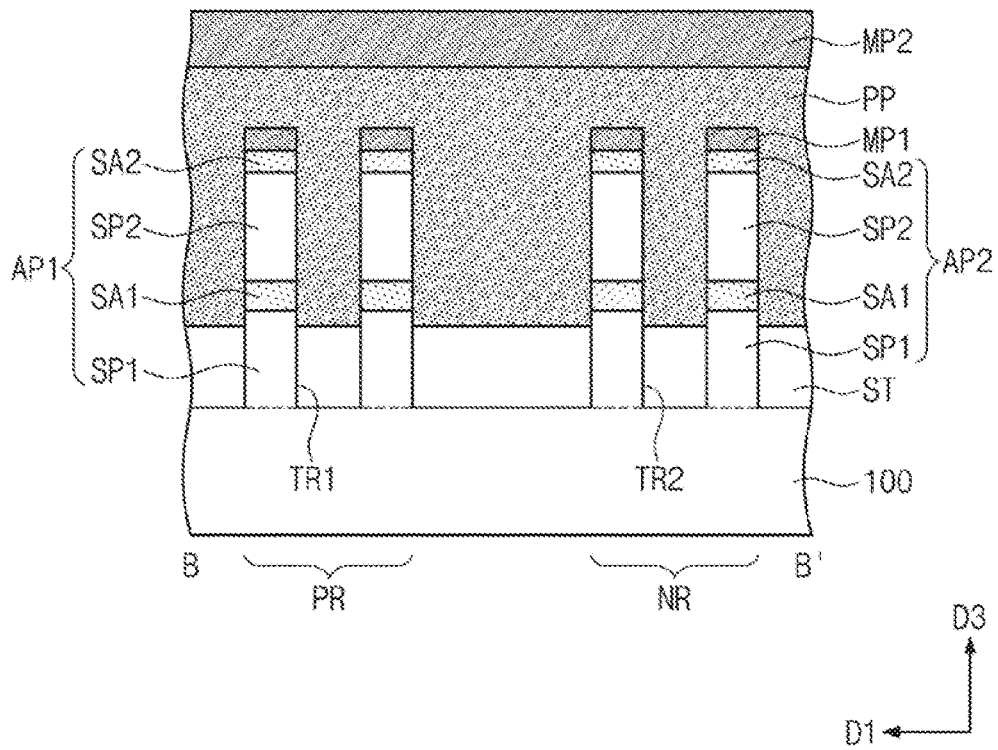
Figure 24C:
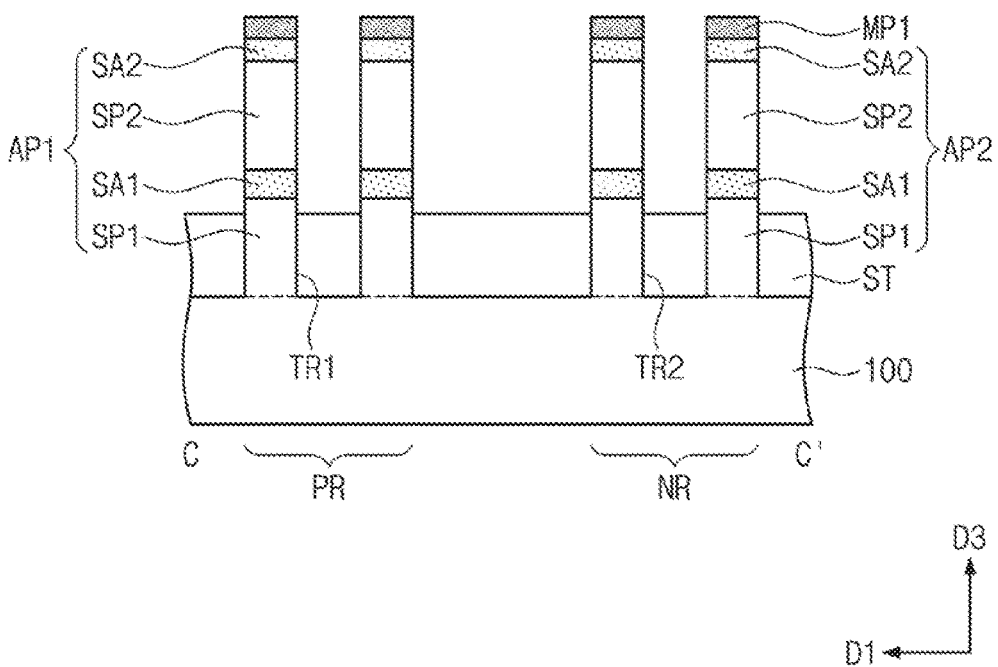
FIGS. 24C, 25C, 26C, 27C, 28C, and 29C are cross-sectional views taken along the lines C-C' of FIGS. 6, 8, 10, 12, 14, and 16, respectively, to illustrate a method for manufacturing a semiconductor device according to exemplary embodiments of the inventive concept.
Figure 25A:
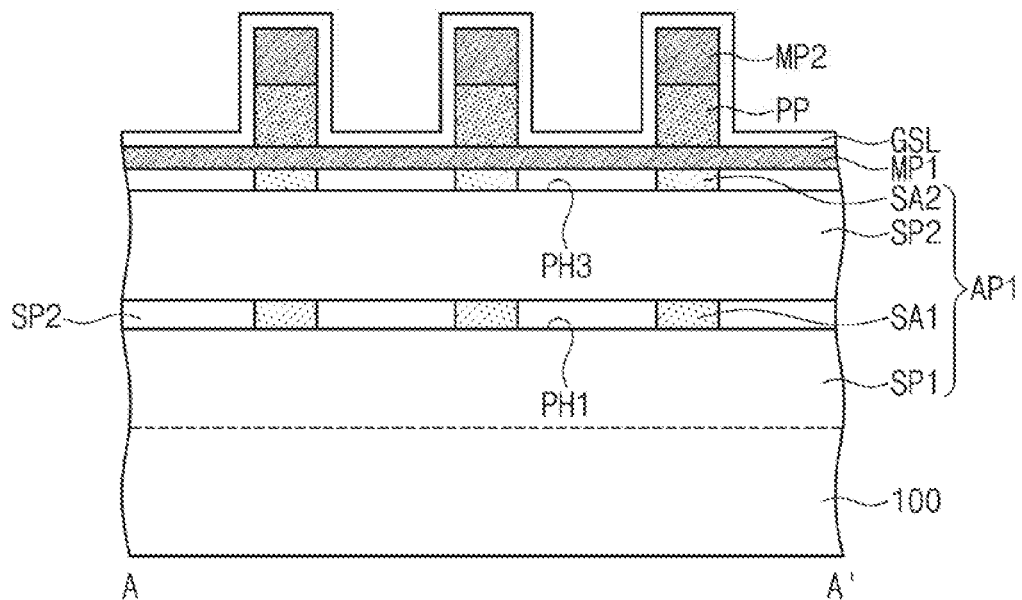
Figure 25A:
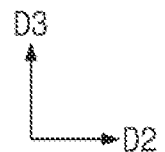
Figure 25B:
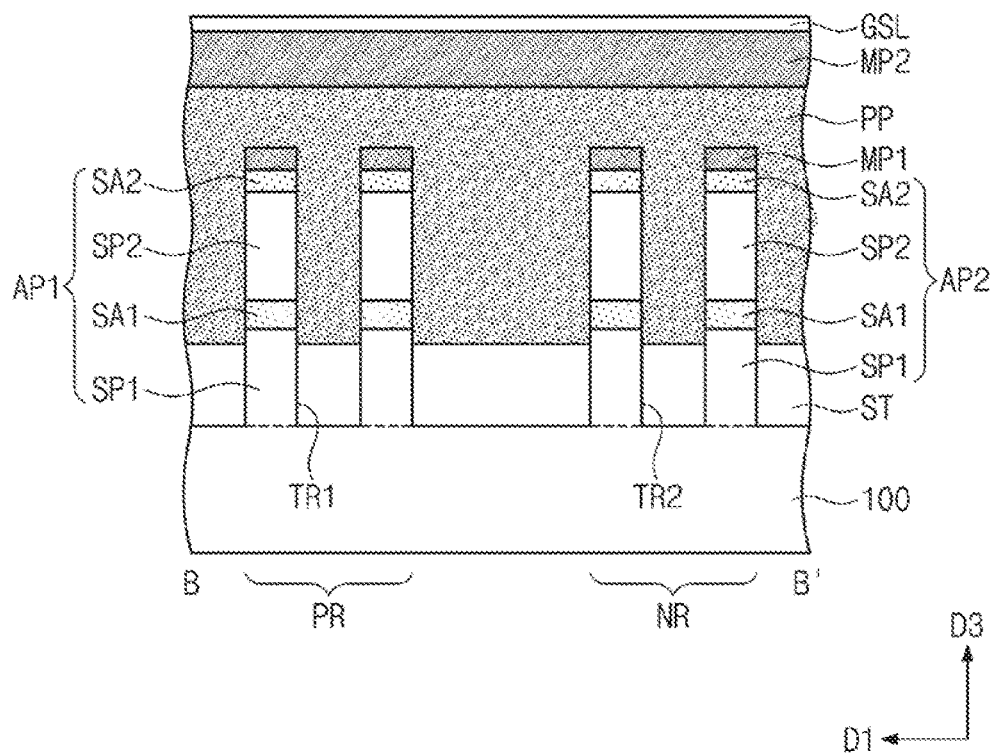
Figure 25C:
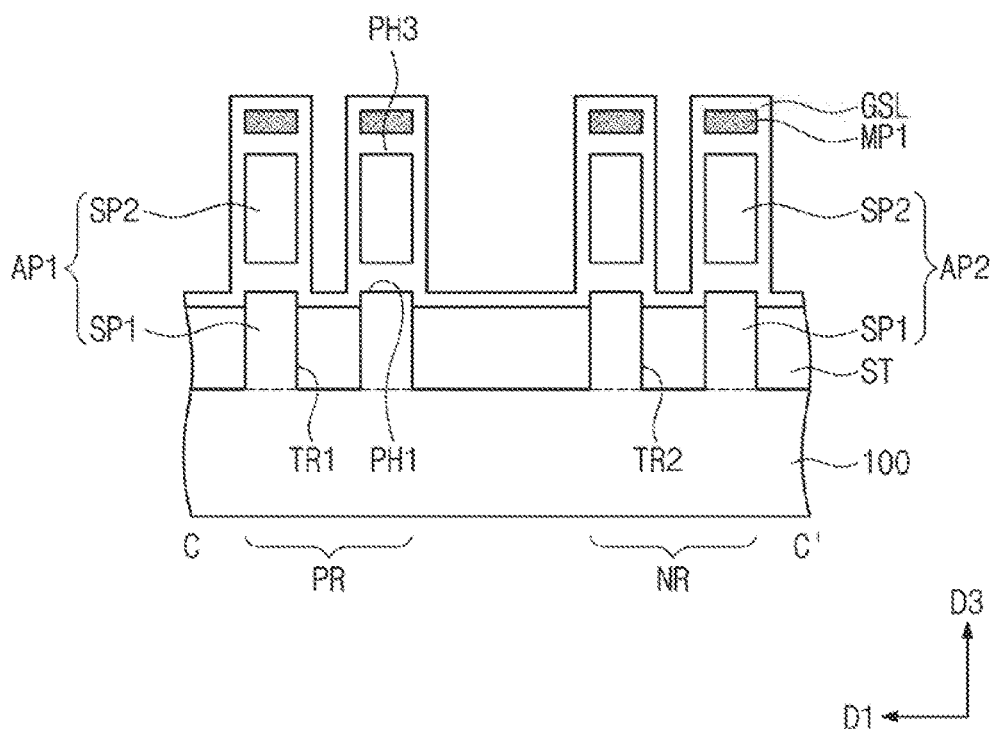
Figure 26A:
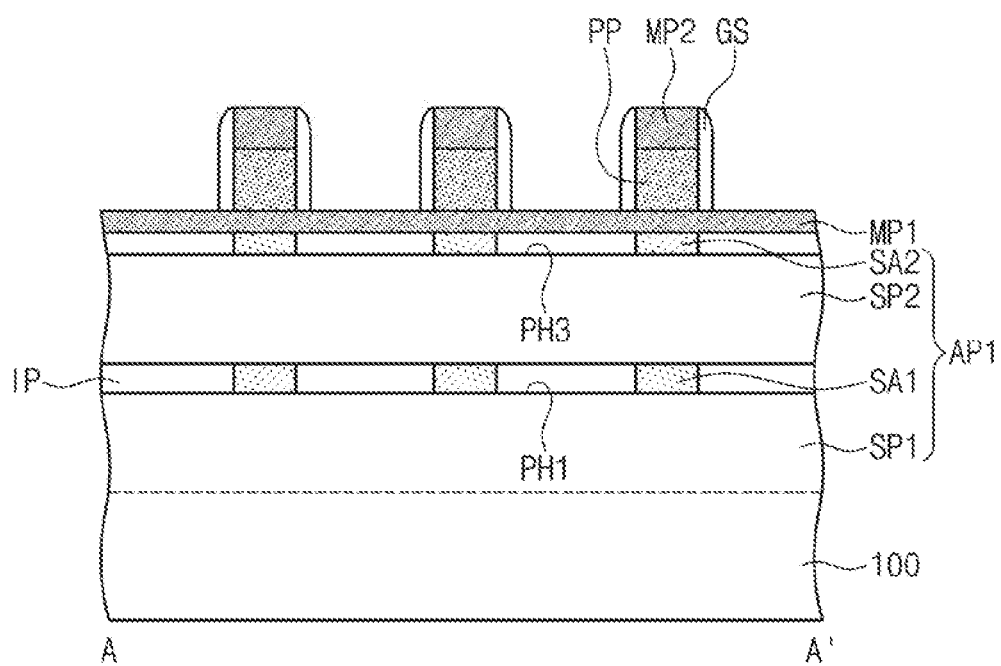
Figure 26A:
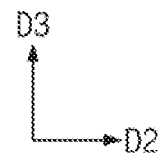
Figure 26B:
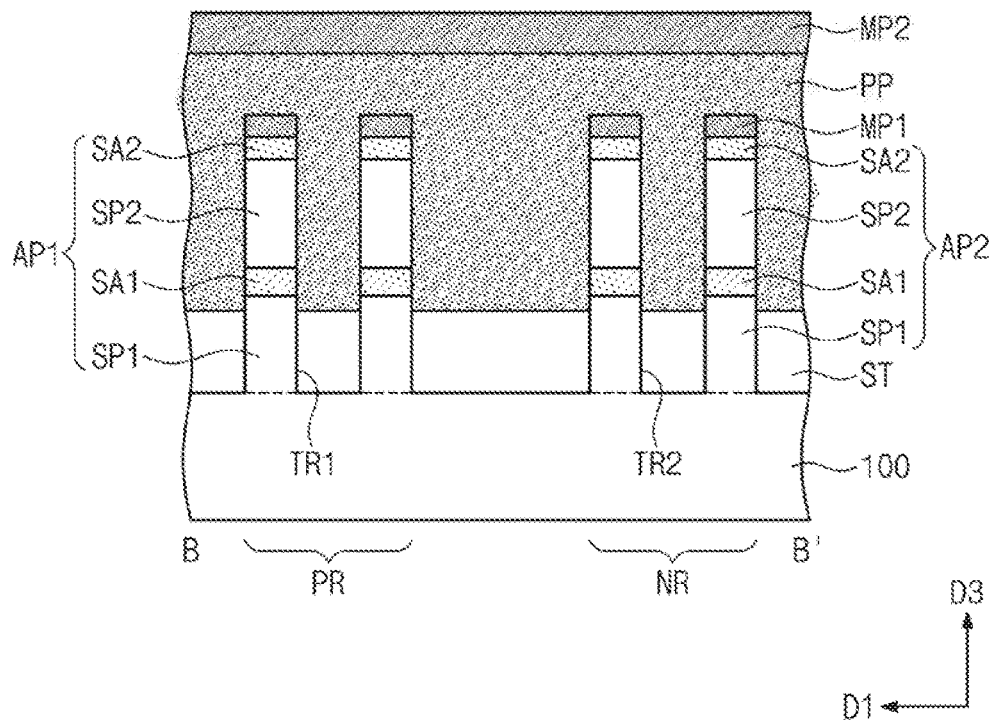
Figure 26C:
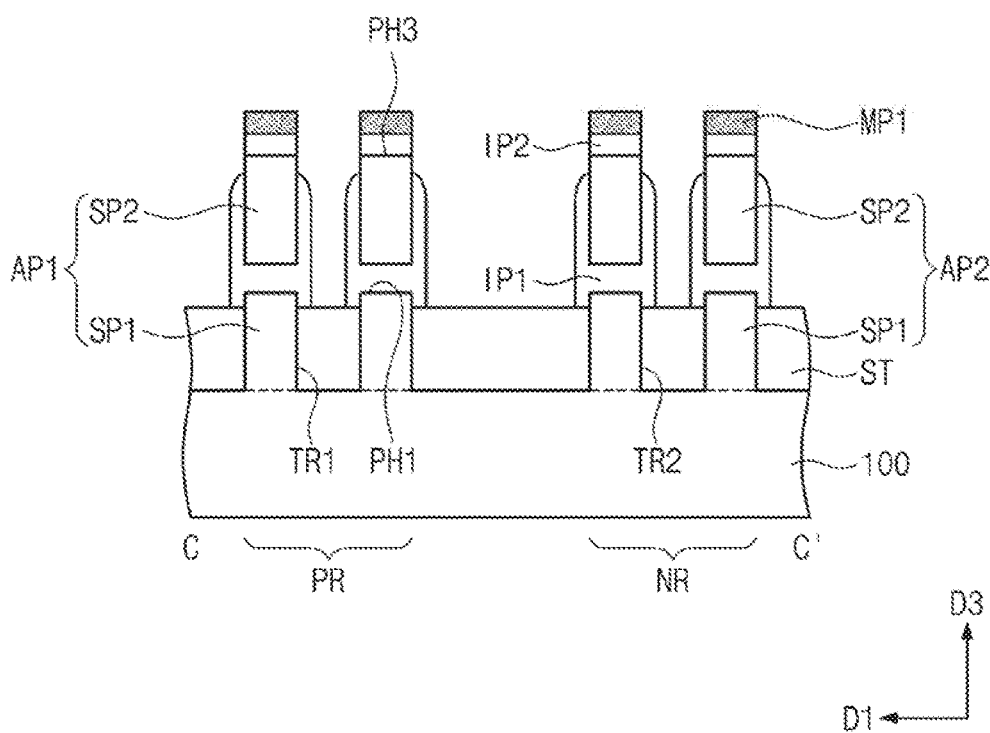
Figure 27A:
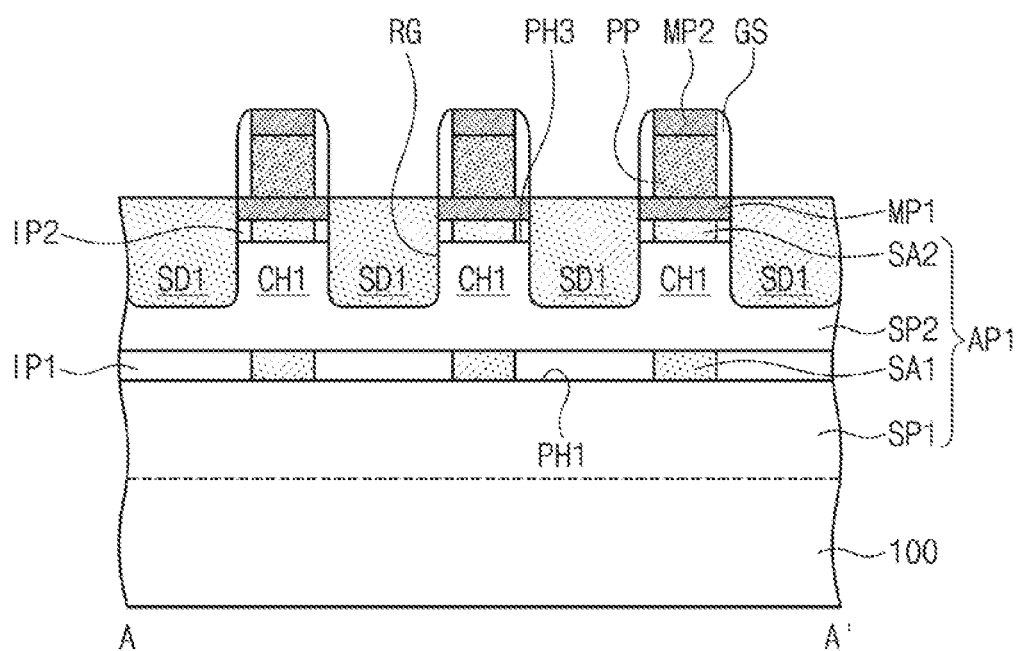
Figure 27A:
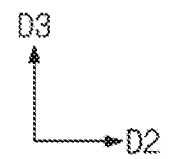
Figure 27B:
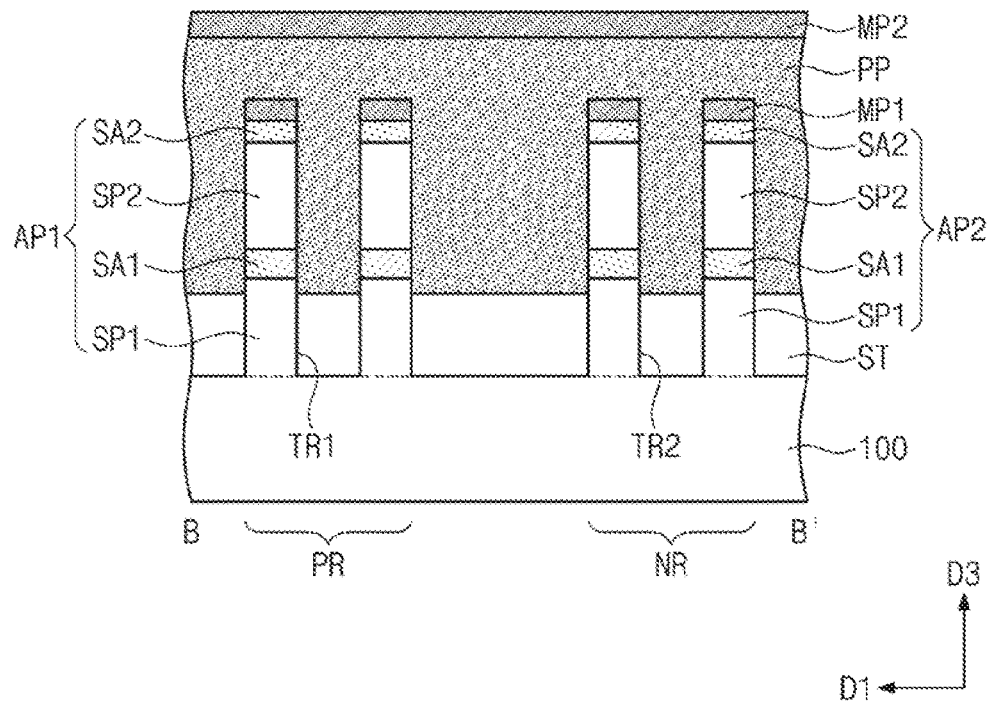
Figure 27C:
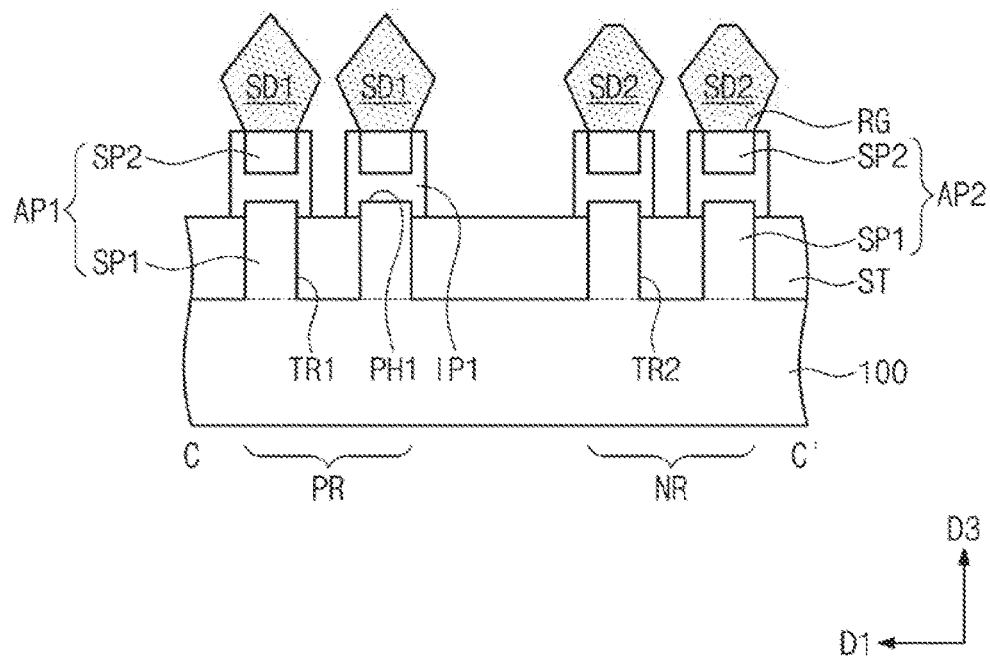
Figure 28A:
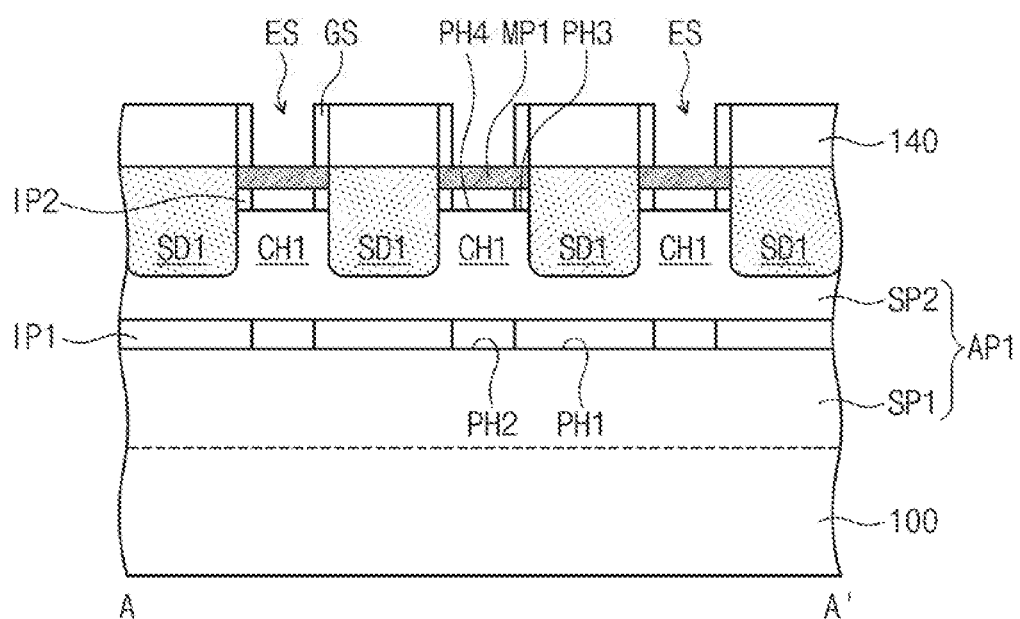
Figure 28A:
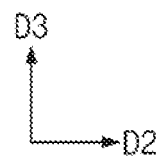
Figure 28B:
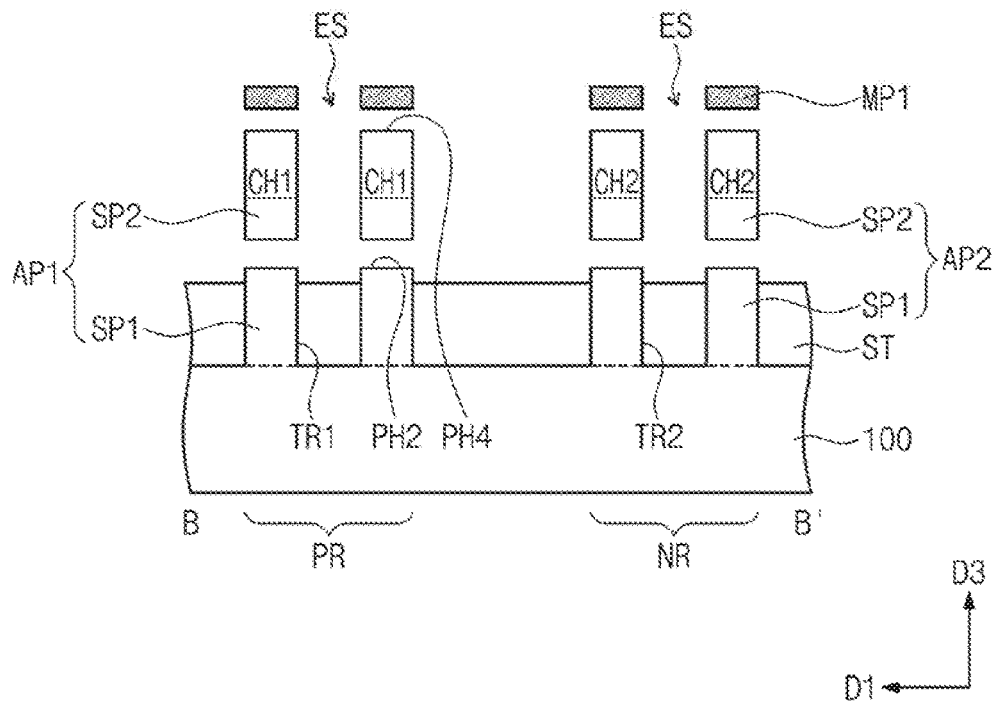
Figure 28C:
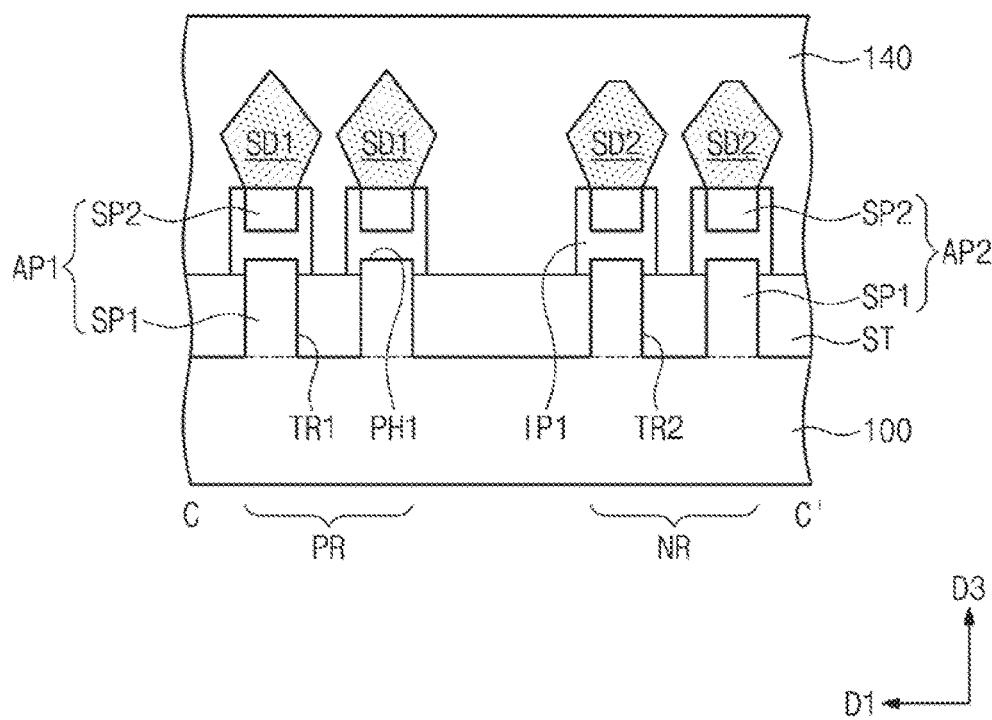
Figure 29A:
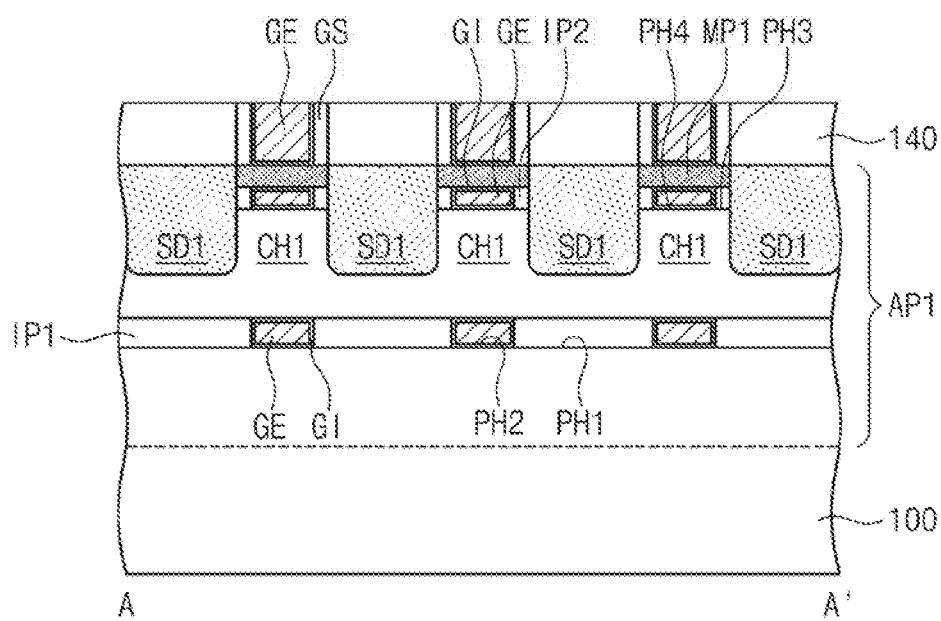
Figure 29A:
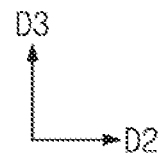
Figure 29B:
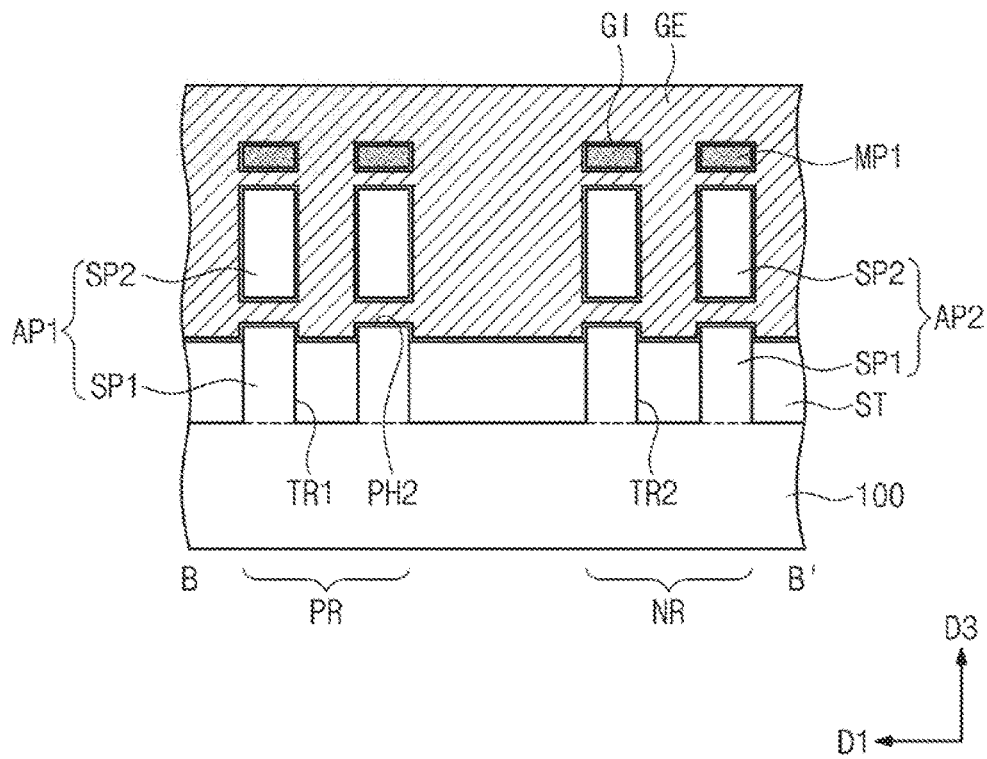
Figure 29C:
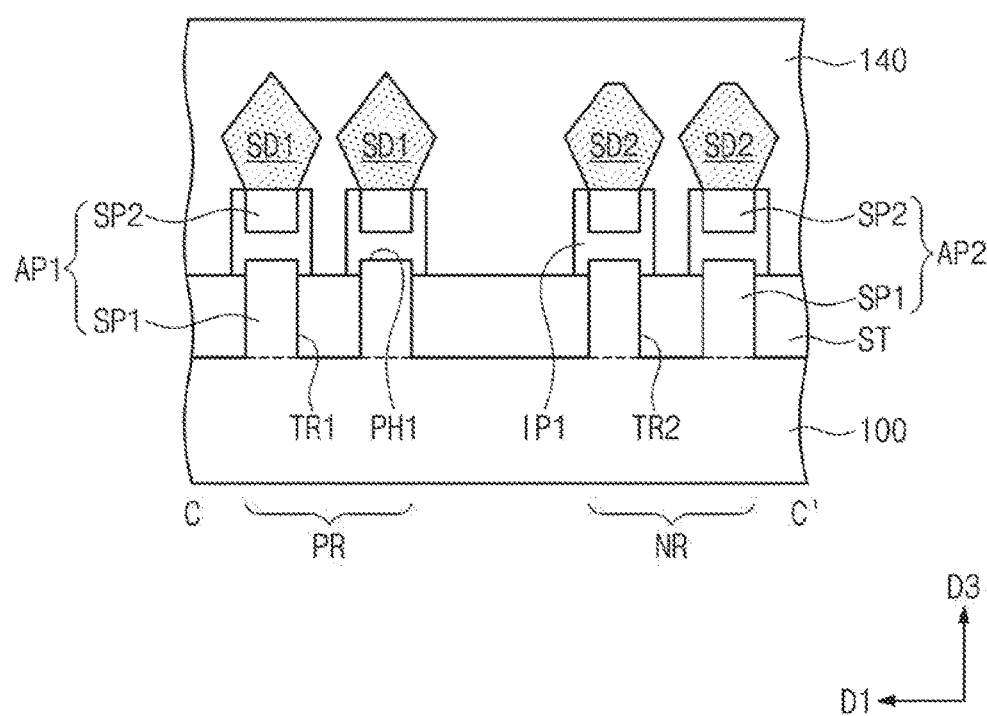

Referring to FIGS. 4, 23A, and 23B, a first sacrificial layer, a semiconductor layer, and a second sacrificial layer may be sequentially formed on a substrate 100. Each of the first and second sacrificial layers may include a germanium layer, a silicon-germanium layer, or a silicon oxide layer. In exemplary embodiments of the inventive concept, the first and second sacrificial layers may include the same material. In exemplary embodiments of the inventive concept, the first and second sacrificial layers may include different materials.

First mask patterns MP1 may be formed on the second sacrificial layer. The second sacrificial layer, the semiconductor layer, the first sacrificial layer, and the substrate 100 may be sequentially etched using the first mask patterns MP1 as etch masks to form first and second active patterns AP1 and AP2.

Each of the first and second active patterns AP1 and AP2 may include a first semiconductor pattern SP1 formed by patterning an upper portion of the substrate 100, a first sacrificial pattern SA1 formed by patterning the first sacrificial layer, a second semiconductor pattern SP2 formed by patterning the semiconductor layer, and a second sacrificial pattern SA2 formed by patterning the second sacrificial layer. The first sacrificial pattern SA1 may be disposed between the first and second semiconductor patterns SP1 and SP2, and the second sacrificial pattern SA2 may be disposed between the first mask pattern MP1 and the second semiconductor pattern SP2.

Device isolation layers ST may be formed in the first trench TR1 between the first active patterns AP1, the second trench TR2 between the second active patterns AP2, and the trench between the first and second active patterns AP1 and AP2.

Referring to FIGS. 6 and 24A to 24C, second mask patterns MP2 and preliminary gate patterns PP may be formed to intersect the first and second active patterns AP1 and AP2.

Referring to FIGS. 8 and 25A to 25C, the first sacrificial patterns SA1 exposed by the preliminary gate patterns PP may be selectively removed to form first cavities PH1, and the second sacrificial patterns SA2 exposed by the preliminary gate patterns PP may be selectively removed to form third cavities PH3. The first and second sacrificial patterns SA1 and SA2 covered by the preliminary gate patterns PP may remain. In other words, the first and second sacrificial patterns SA1 and SA2 under the second mask patterns MP2 may remain.

A spacer layer GSL may be conformally formed on an entire surface of the substrate 100. The spacer layer GSL may cover sidewalls of the preliminary gate patterns PP and sidewalls of the second semiconductor patterns SP2. The spacer layer GSL may fill the first and third cavities PH1 and PH3.

Referring to FIGS. 10 and 26A to 26C, the spacer layer GSL may be anisotropically etched to form gate spacers GS, first insulating patterns IP1, and second insulating patterns IP2. The anisotropic etching process may be performed until the first insulating patterns IP1 expose upper portions of the second semiconductor patterns SP2. The first mask patterns MP1 and the second insulating patterns IP2 may be exposed by the first insulating patterns IP1. The first insulating patterns IP1 may fill the first cavities PH1, and the second insulating patterns IP2 may fill the third cavities PH3.

Referring to FIGS. 12 and 27A to 27C, first source/drain patterns SD1 may be formed at both sides of each of the preliminary gate patterns PP disposed on the PMOSFET region PR. For example, the first mask patterns MP1, the second insulating patterns IP2 and upper portions of the second semiconductor patterns SP2, which are exposed, may be etched using the second mask patterns MP2 and the gate spacers GS as etch masks. Thus, recess regions RG may be formed in the upper portion of the second semiconductor pattern SP2 at both sides of each of the preliminary gate patterns PP. A selective epitaxial growth (SEG) process may be performed to form the first source/drain patterns SD1 filling the recess regions RG of the first active patterns AP1.

Second source/drain patterns SD2 may be formed at both sides of each of the preliminary gate patterns PP disposed on the NMOSFET region NR. A method of forming the second source/drain patterns SD2 may be similar to the method of forming the first source/drain patterns SD1.

Referring to FIGS. 14 and 28A to 28C, a first interlayer insulating layer 140 may be formed on an entire surface of the substrate 100 to cover the first and second source/drain patterns SD1 and SD2, the second mask patterns MP2, and the gate spacers GS. The first interlayer insulating layer 140 may be planarized until top surfaces of the preliminary gate patterns PP are exposed. The exposed preliminary gate patterns PP may be selectively removed. Empty spaces ES may be formed by the removal of the preliminary gate patterns PP.

The empty spaces ES may expose the first and second sacrificial patterns SA1 and SA2 of the first and second active patterns AP1 and AP2. The first sacrificial patterns SA1 exposed by the empty spaces ES may be removed to form second cavities PH2, and the second sacrificial patterns SA2 exposed by the empty spaces ES may be removed to form fourth cavities PH4. Each of the fourth cavities PH4 may be defined by a top surface of the second semiconductor pattern SP2, a bottom surface of the first mask pattern MP1, and sidewalls of the second insulating patterns IP2 adjacent to each other. The second and fourth cavities PH2 and PH4 may be connected to the empty spaces ES.

Referring to FIGS. 16 and 29A to 29C, a gate dielectric pattern GI and a gate electrode GE may be formed in each of the empty spaces ES. The gate dielectric pattern GI and the gate electrode GE may fill the second and fourth cavities PH2 and PH4.

Referring again to FIGS. 1 and 21A to 21C, upper portions of the gate electrodes GE may be recessed using the first mask patterns MP1 as etch masks. The gate electrodes GE and the gate dielectric patterns GI in the fourth cavities PH4 may be protected by the first mask patterns MP1. The recessing process may be performed until top surfaces of the gate electrodes GE are disposed at substantially the same level as or a lower level than the bottom surfaces of the first mask patterns MP1. The recessed top surfaces RS of the gate electrodes GE may be formed by the recessing process.

The gate capping patterns GP may be formed on the recessed gate electrodes GE, respectively. The gate capping patterns GP may cover the recessed top surfaces RS of the gate electrodes GE and the first mask patterns MP1. The second interlayer insulating layer 150 may be formed on the first interlayer insulating layer 140 and the gate capping patterns GP. The contacts AC may be formed to penetrate the second and first interlayer insulating layers 150 and 140. The contacts AC may be connected to the first and second source/drain patterns SD1 and SD2.

Figure 30A:
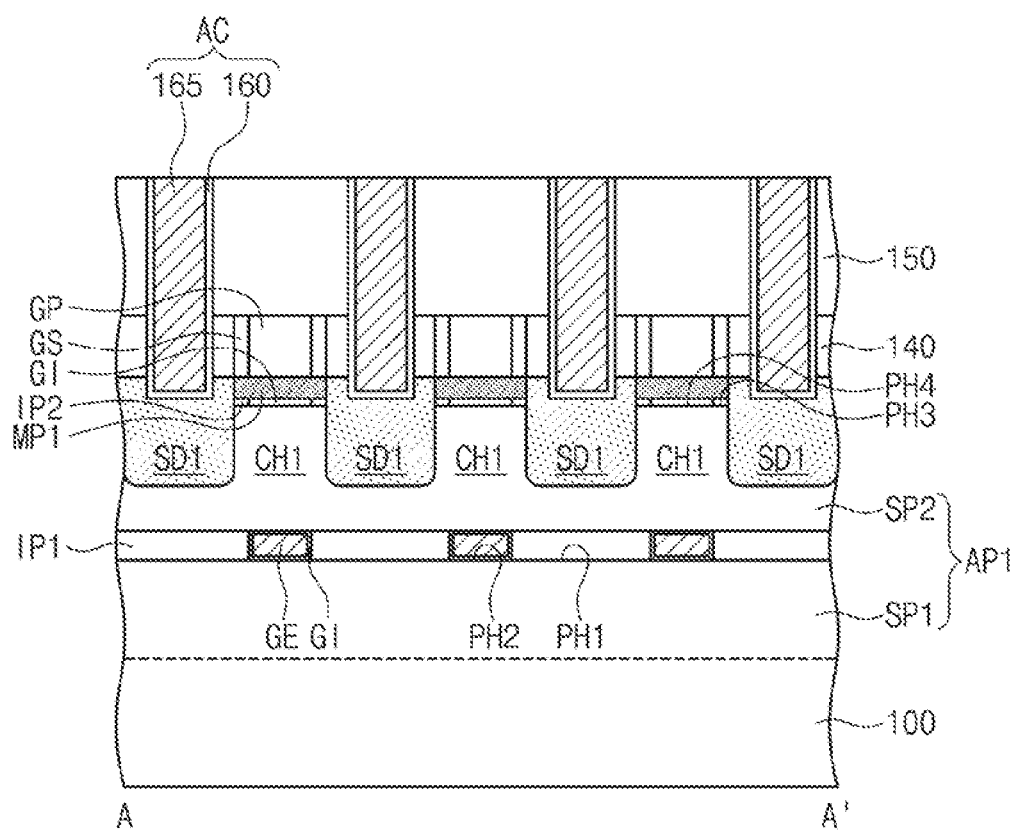
FIGS. 30A and 30B are cross-sectional views taken along the lines A-A' and B-B' of FIG. 1, respectively, to illustrate a semiconductor device according to exemplary embodiments of the inventive concept.
Figure 30B:
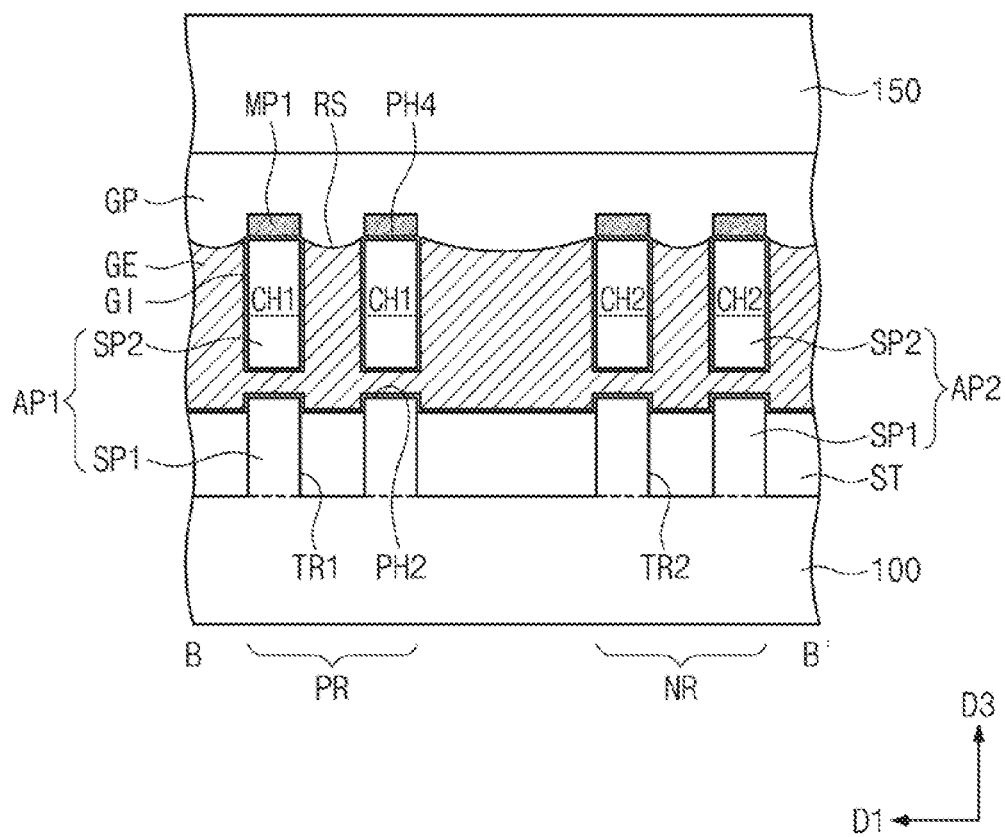

FIGS. 30A and 30B are cross-sectional views taken along the lines A-A' and B-B' of FIG. 1, respectively, to illustrate a semiconductor device according to exemplary embodiments of the inventive concept. In the embodiment of FIGS. 30A and 30B, the descriptions regarding the same technical features as in the above embodiments of FIGS. 1 and 21A to 21C will be omitted. Differences between the embodiment of FIGS. 30A and 30B and the embodiments of FIGS. 1 and 21A to 21C will be mainly described.

Referring to FIGS. 1, 21C, 30A, and 30B, only the gate dielectric patterns GI may fill the fourth cavities PH4. Heights (or lengths) of the third and fourth cavities PH3 and PH4 in the third direction D3 may be smaller than the heights (or lengths) of the first and second cavities PH1 and PH2 in the third direction D3. Only the gate dielectric patterns GI may be disposed between the first mask patterns MP1 and the second semiconductor patterns SP2. The gate electrode GE may surround both sidewalls and the bottom surface of each of the first and second channel patterns CH1 and CH2.

Figure 31A:
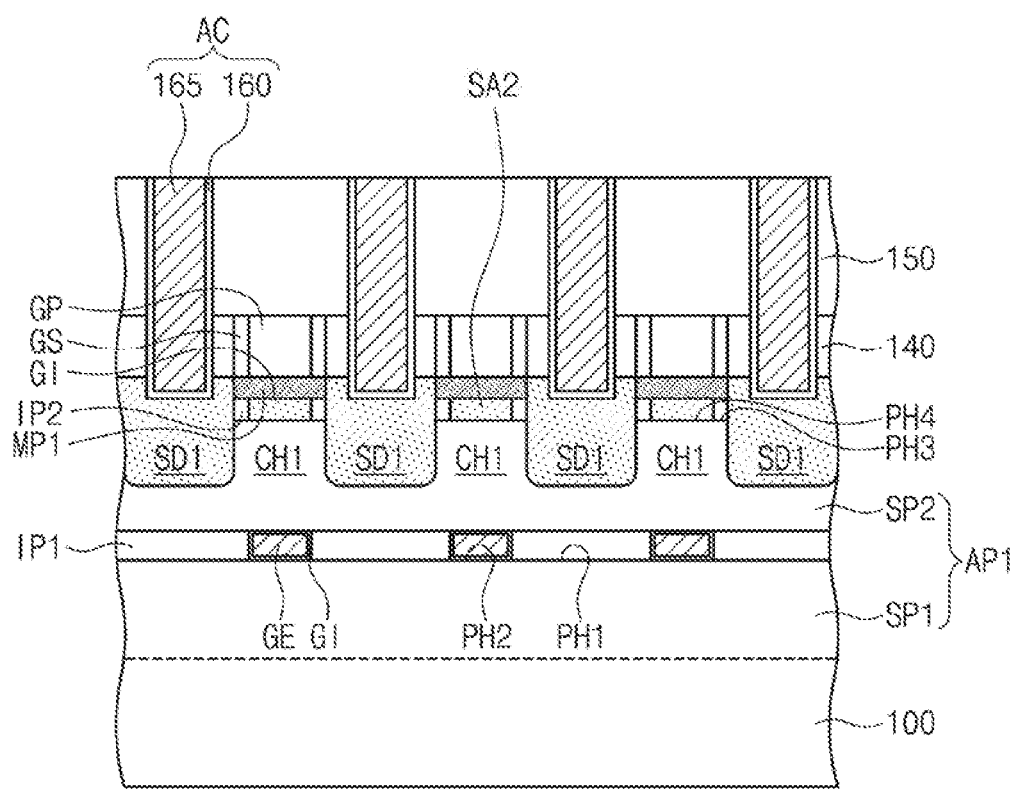
FIGS. 31A and 31B are cross-sectional views taken along the lines A-A' and B-B' of FIG. 1, respectively, to illustrate a semiconductor device according to exemplary embodiments of the inventive concept.
Figure 31A:
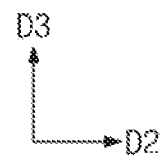
Figure 31B:
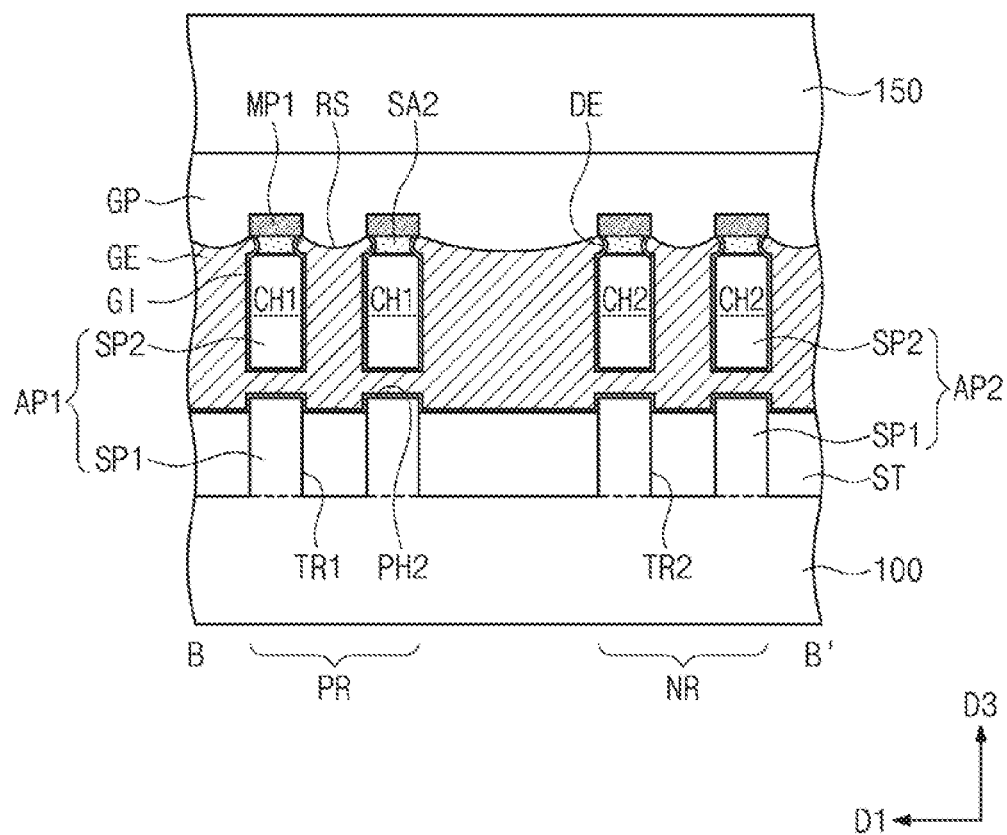

FIGS. 31A and 31B are cross-sectional views taken along the lines A-A' and B-B' of FIG. 1, respectively, to illustrate a semiconductor device according to exemplary embodiments of the inventive concept. In the embodiment of FIGS. 31A and 31B, the descriptions regarding the same technical features as in the above embodiments of FIGS. 1 and 21A to 21C will be omitted. Differences between the embodiment of FIGS. 31A and 31B and the embodiments of FIGS. 1 and 21A to 21C will be mainly described.

Referring to FIGS. 1, 21C, 31A, and 31B, the second sacrificial patterns SA2 may fill the fourth cavities PH4, respectively. In other words, each of the second sacrificial patterns SA2 may be disposed between the second semiconductor pattern SP2 and each of the first mask patterns MP1. As illustrated in FIG. 31B, both sidewalls of each of the second sacrificial patterns SA2 may have dents DE when viewed in a cross-sectional view defined by the first and third directions D1 and D3. For example, the sidewalls of the second sacrificial patterns SA2 may be protruded inward towards a center point between a first mask pattern MP1 and channel pattern. A width of each of the second sacrificial patterns SA2 in the first direction D1 may be smaller than a width of the first mask pattern MP1 in the first direction D1. In addition, a width of each of the second sacrificial patterns SA2 in the first direction D1 may be smaller than a width of the second semiconductor pattern SP2 in the first direction D1. The gate dielectric patterns GI may cover the sidewalls of the first and second channel patterns CH1 and CH2 and may extend onto sidewalls of the second sacrificial patterns SA2. The gate electrode GE may surround both sidewalls and the bottom surface of each of the first and second channel patterns CH1 and CH2. For example, the second sacrificial patterns SA2 may include silicon oxide.

To manufacture the semiconductor device according to the embodiment of FIGS. 31A and 31B, for example, the first and second sacrificial layers described above with reference to FIGS. 4, 23A, and 23B may be formed of different materials. For example, the first sacrificial layer may be formed of a silicon-germanium layer and the second sacrificial layer may be formed of a silicon oxide layer. In the etching process described above with reference to FIGS. 14 and 28A to 28C, the first sacrificial patterns SA1 exposed by the empty spaces ES may be selectively removed; however, the second sacrificial patterns SA2 exposed by the empty spaces ES may remain. When the first sacrificial patterns SA1 are removed, exposed sidewalls of the second sacrificial patterns SA2 may be partially etched to form the dents DE.

Figure 32:
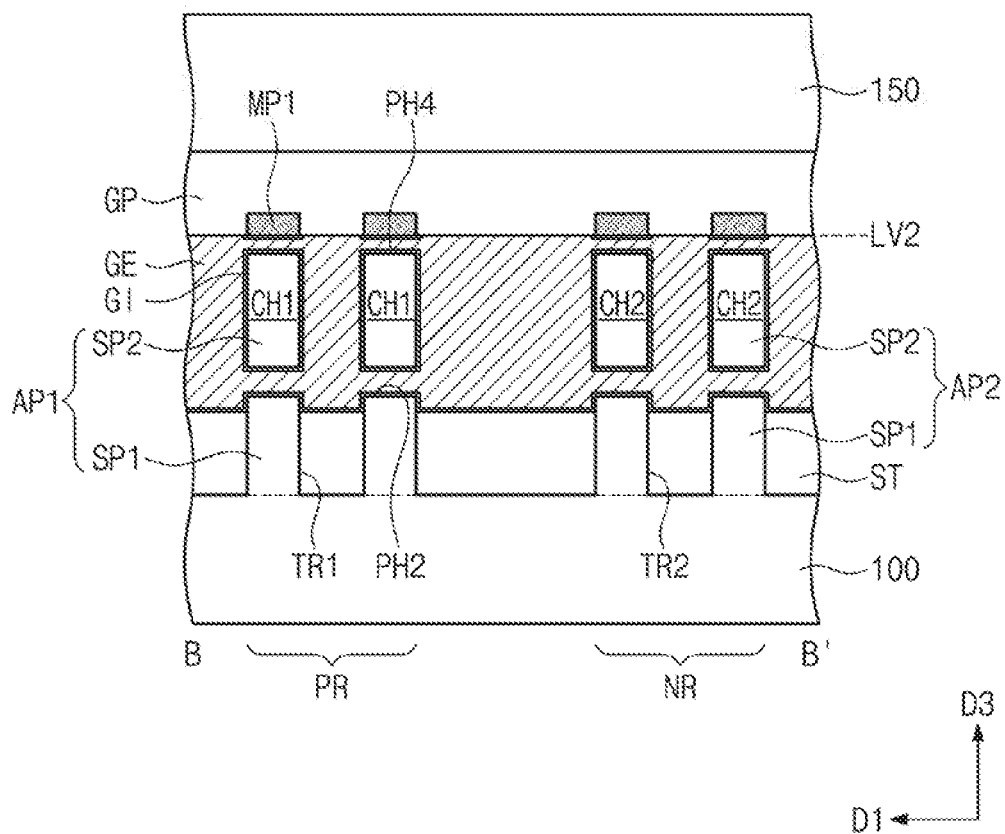
FIGS. 32, 33, and 34 are cross-sectional views taken along the line B-B' of FIG. 1 to illustrate semiconductor devices according to exemplary embodiments of the inventive concept.
Figure 33:
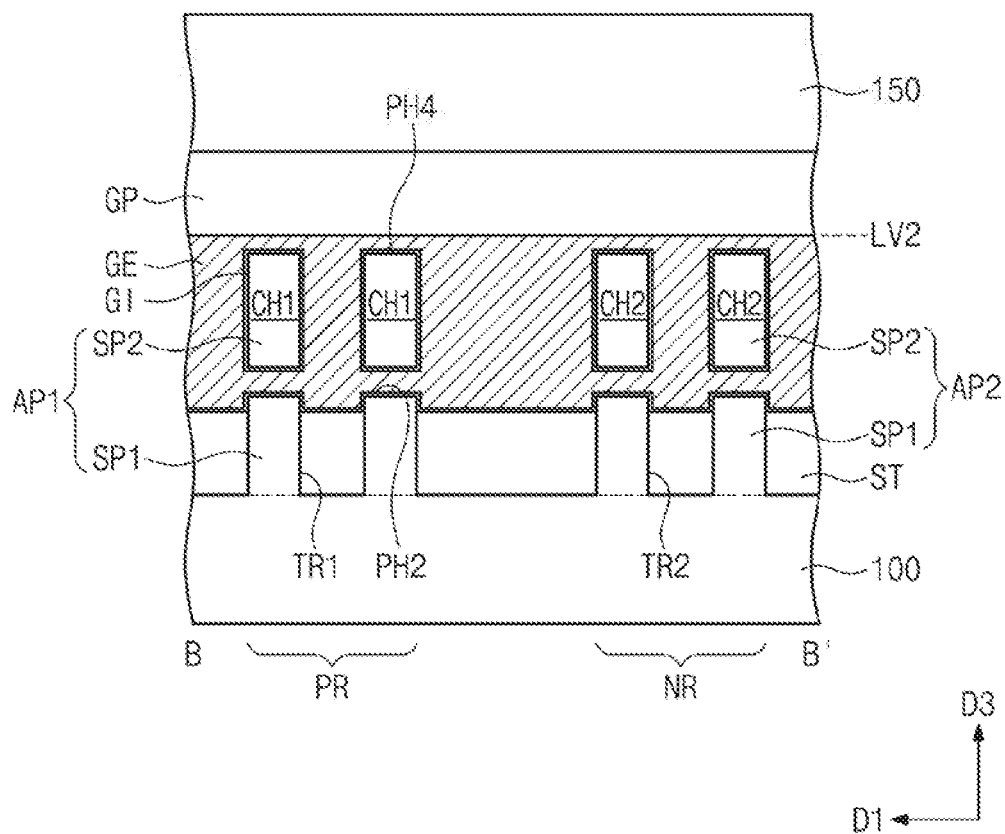
Figure 34:
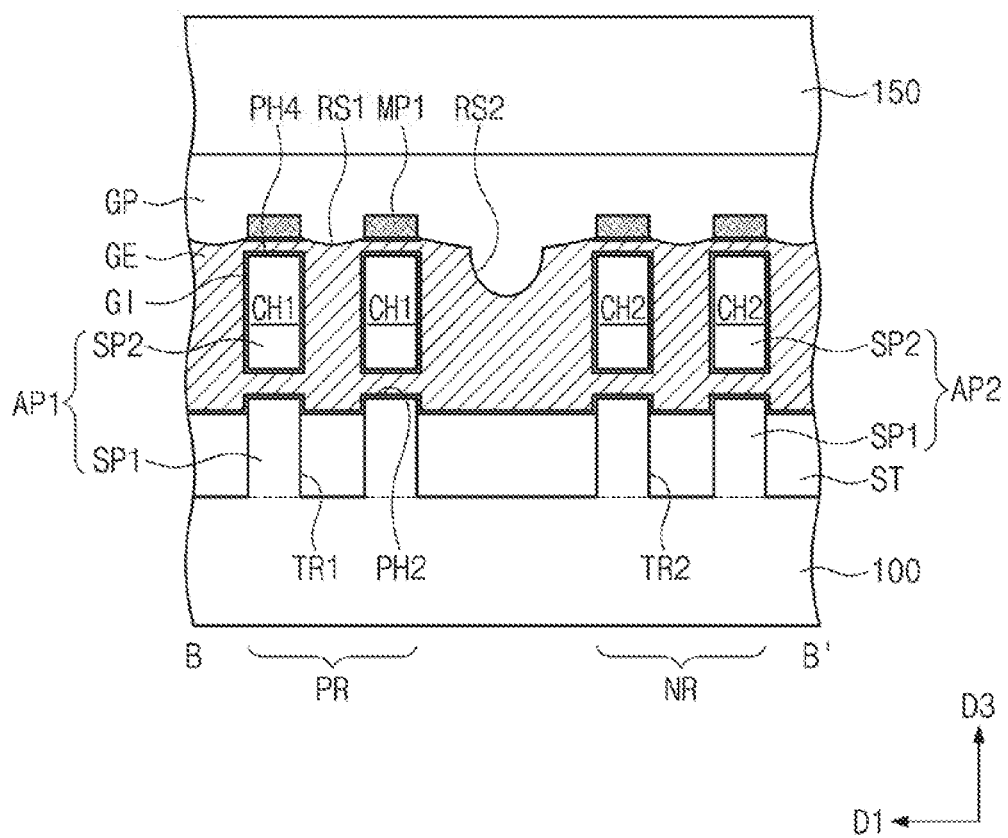

FIGS. 32, 33, and 34 are cross-sectional views taken along the line B-B' of FIG. 1 to illustrate semiconductor devices according to exemplary embodiments of the inventive concept. In the embodiments of FIGS. 32, 33 and 34, the descriptions regarding the same technical features as in the above embodiments of FIGS. 1 and 21A to 21C will be omitted. Difference between the embodiments of FIGS. 32, 33 and 34 and the embodiments of FIGS. 1 and 21A to 21C will be mainly described.

Referring to FIGS. 1, 21A, 21C, and 32, a top surface of each of gate electrodes GE may be flat. For example, a height of the gate electrode GE may be substantially uniform from the first channel pattern CH1 to the second channel pattern CH2. The second level LV2 of the top surface of the gate electrode GE may be substantially the same as or lower than the first level LV1 of the bottom surface of the contact AC.

Referring to FIGS. 1, 21A, 21C, and 33, the first mask patterns MP1 on the first and second channel patterns CH1 and CH2 may be omitted. The top surface of each of the gate electrodes GE may be flat. The top surface of the gate electrode GE may be higher than the top surfaces of the first and second channel patterns CH1 and CH2. The second level LV2 of the top surface of the gate electrode GE may be substantially the same as or lower than the first level LV1 of the bottom surface of the contact AC.

Referring to FIGS. 1, 21A, 21C, and 34, each of gate electrodes GE may include a first recessed top surface RS1 and a second recessed top surface RS2. The second recessed top surface RS2 may be formed between the PMOSFET region PR and the NMOSFET region NR when viewed in a plan view. The second recessed top surface RS2 may extend away from the first recessed top surface RS1 toward the substrate 100. The second recessed top surface RS2 may be concave away from the first recessed top surface RS1 and protruded toward the substrate 100.

Figure 35A:
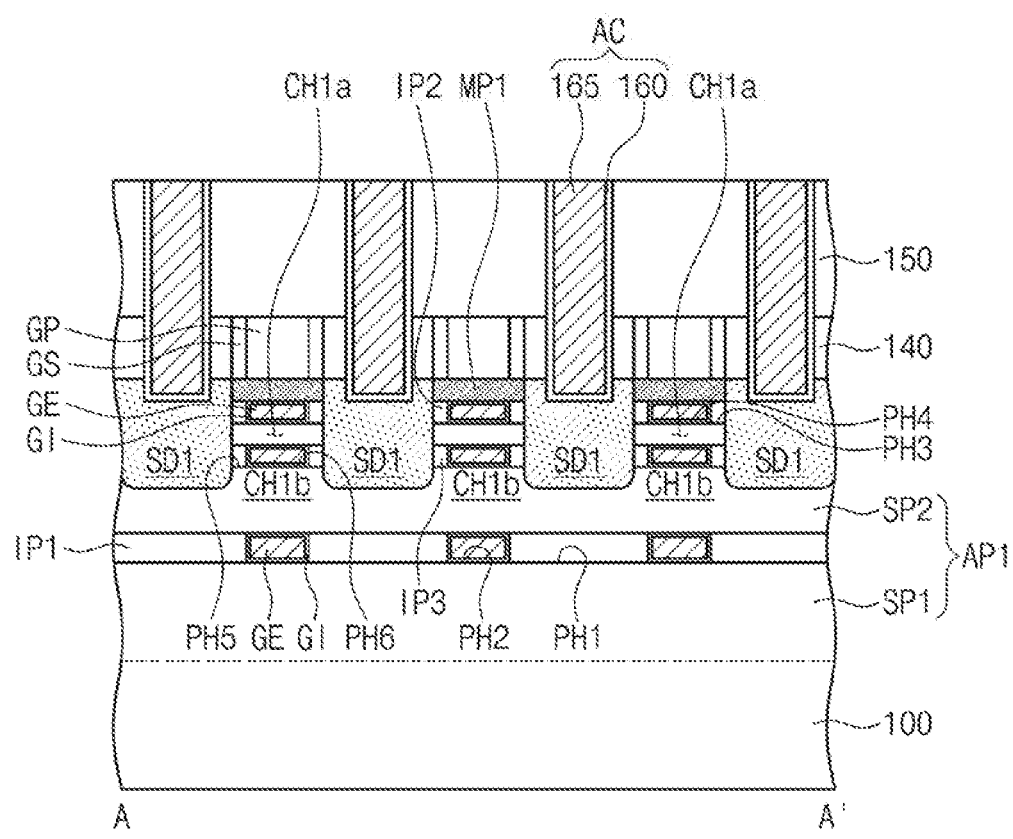
FIGS. 35A, 35B, and 35C are cross-sectional views taken along the lines A-A', B-B', and C-C' of FIG. 1, respectively, to illustrate a semiconductor device according to exemplary embodiments of the inventive concept.
Figure 35B:
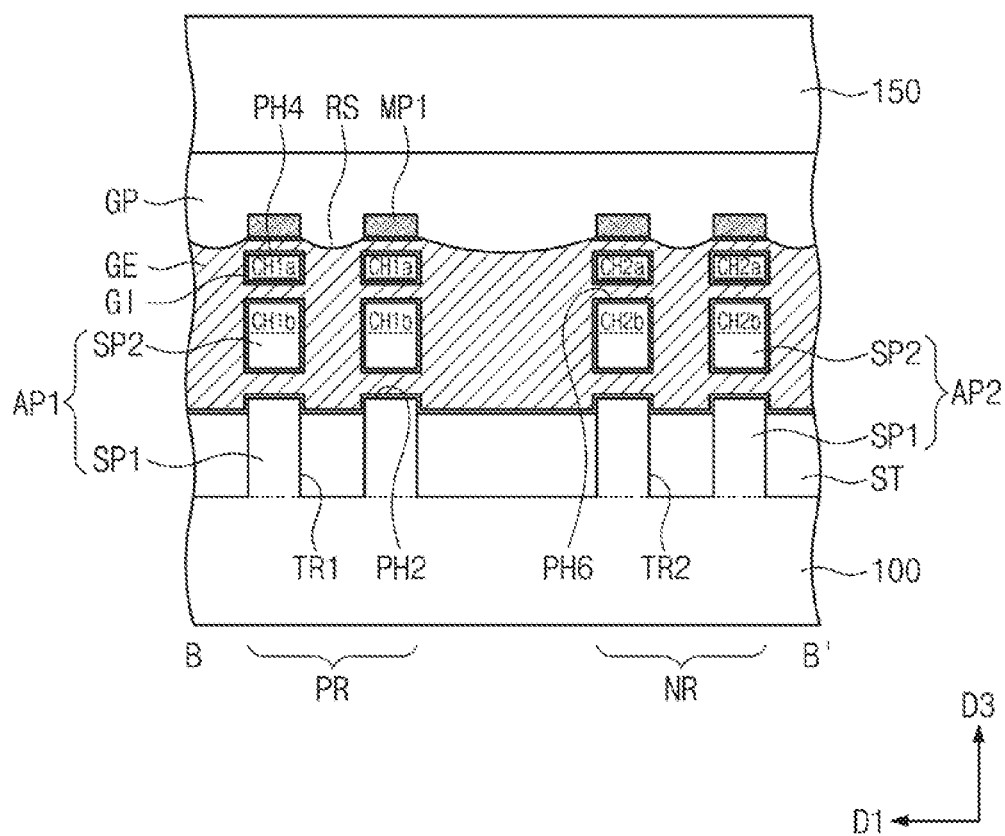
Figure 35C:
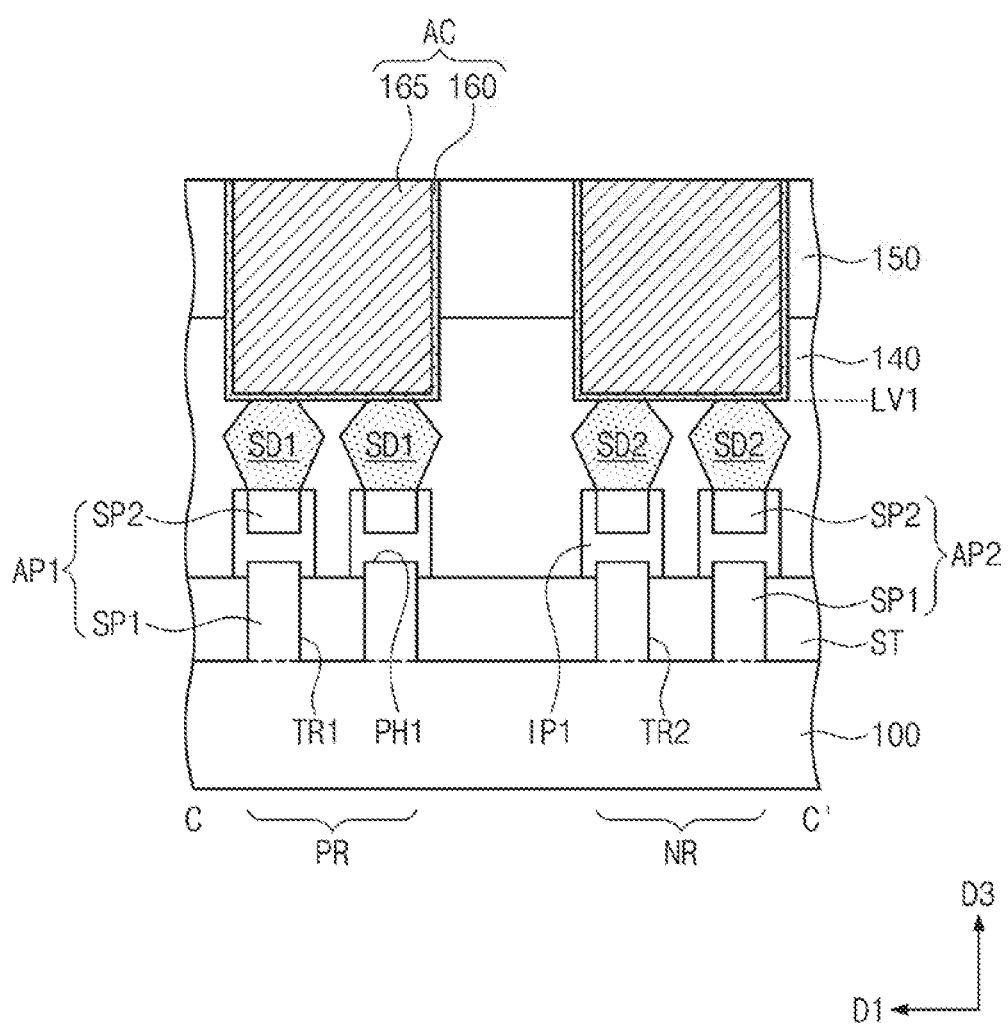
Figure 36:
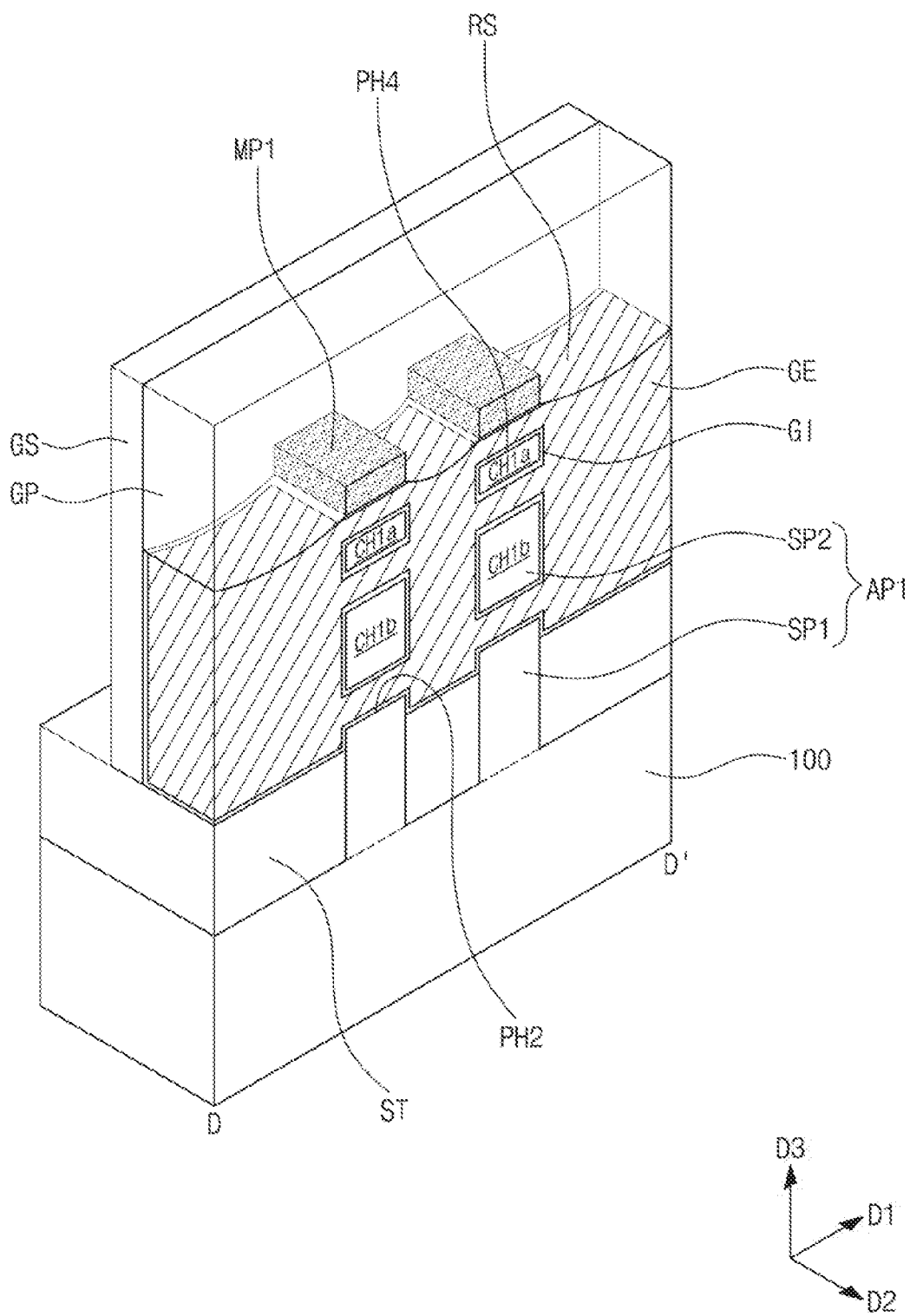
FIG. 36 is a perspective view taken along the line D-D' of FIG. 3A to illustrate a semiconductor device according to exemplary embodiments of the inventive concept.
Figure 37A:
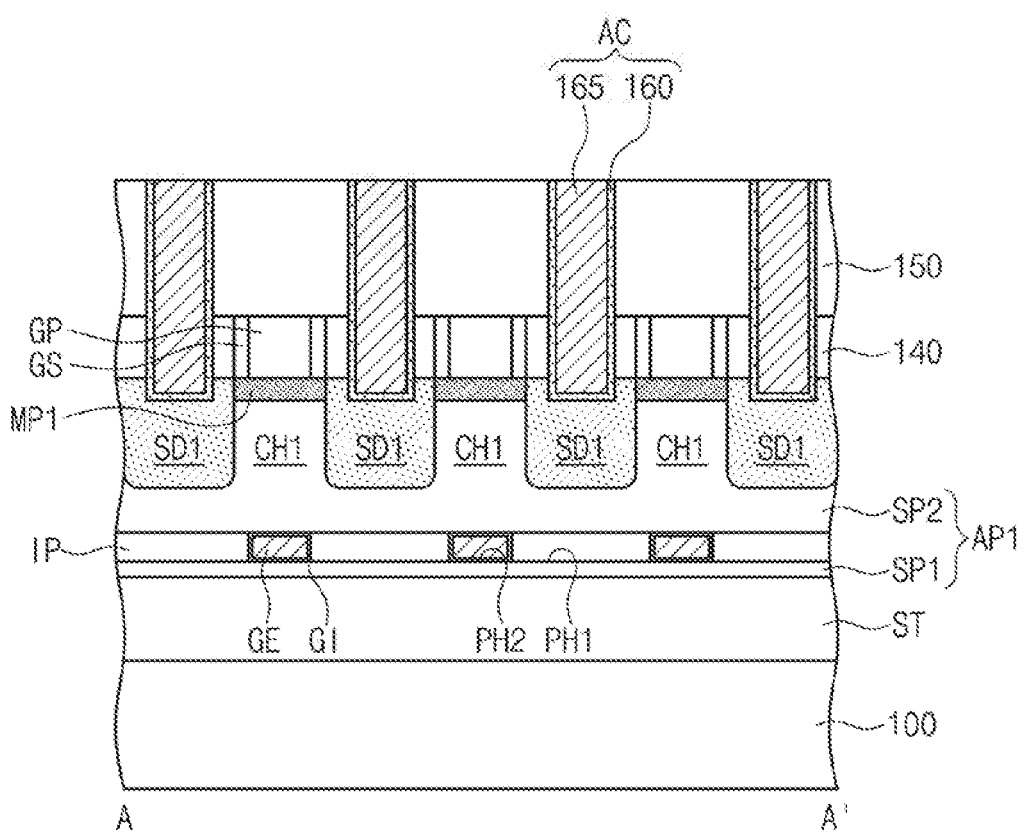
FIGS. 37A, 37B, 37C, 38A, 38B, 38C, 39A, 39B, 39C, 40A, 40B, 40C, 41A, 41B, 41C, 42A, 42B and 42C are cross-sectional views taken along the lines A-A', B-B', and C-C' of FIG. 1 to illustrate semiconductor devices according to exemplary embodiments of the inventive concept.
Figure 37B:
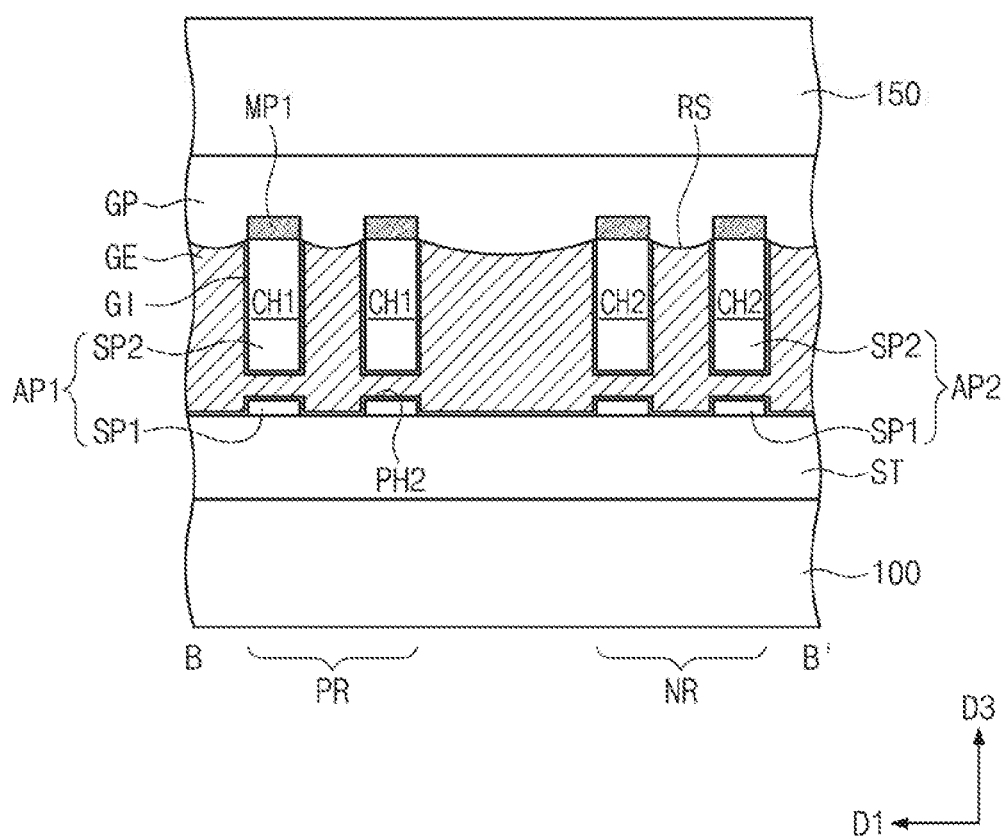
Figure 37C:
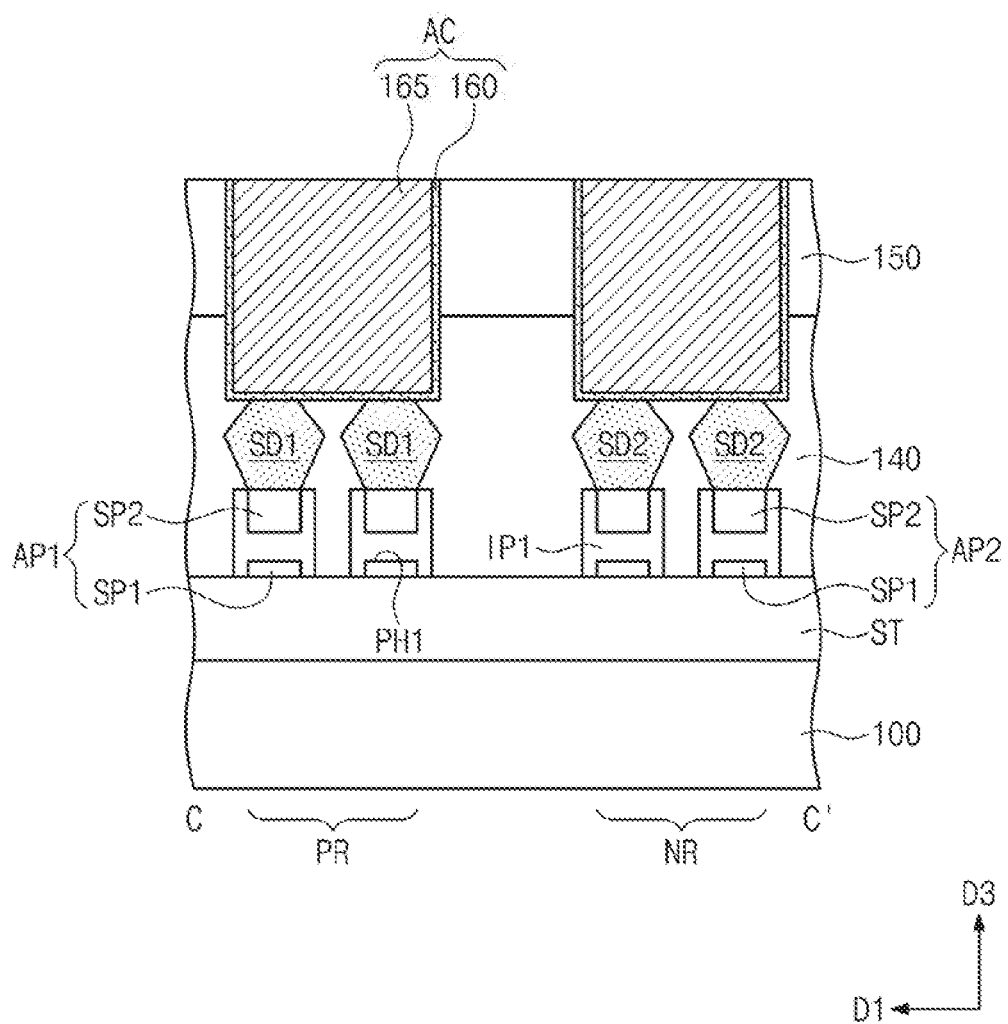
Figure 38A:
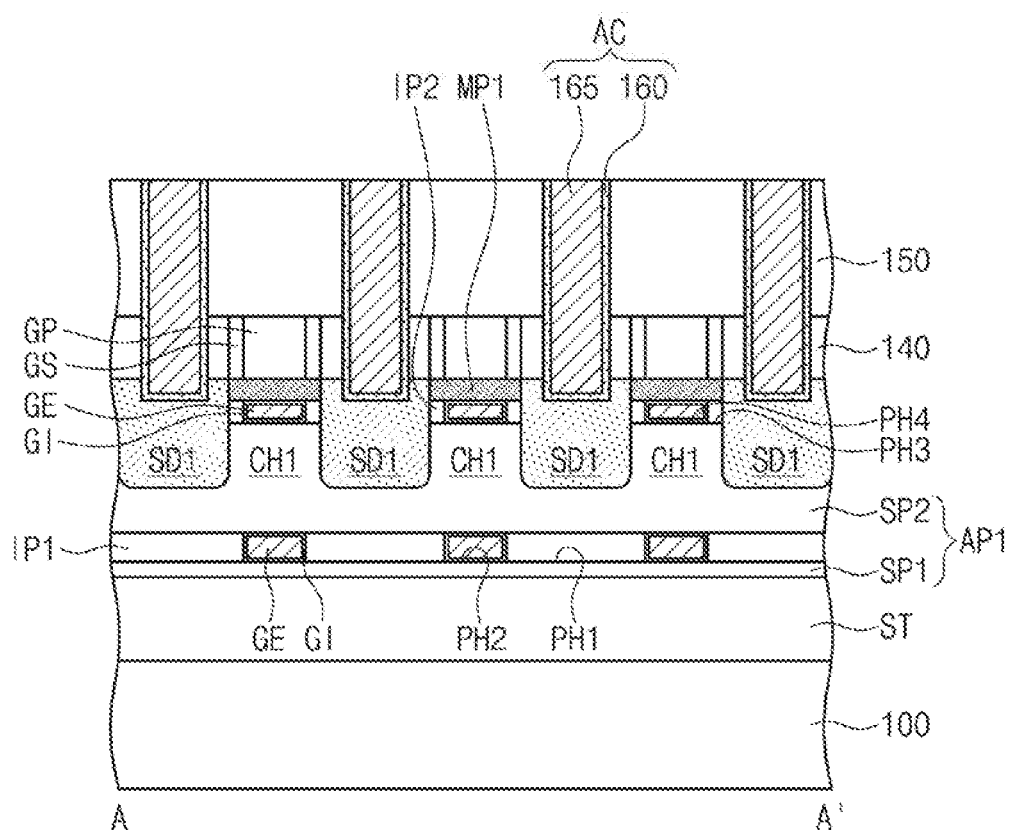
Figure 38A:
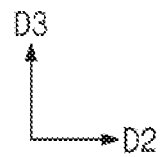
Figure 38B:
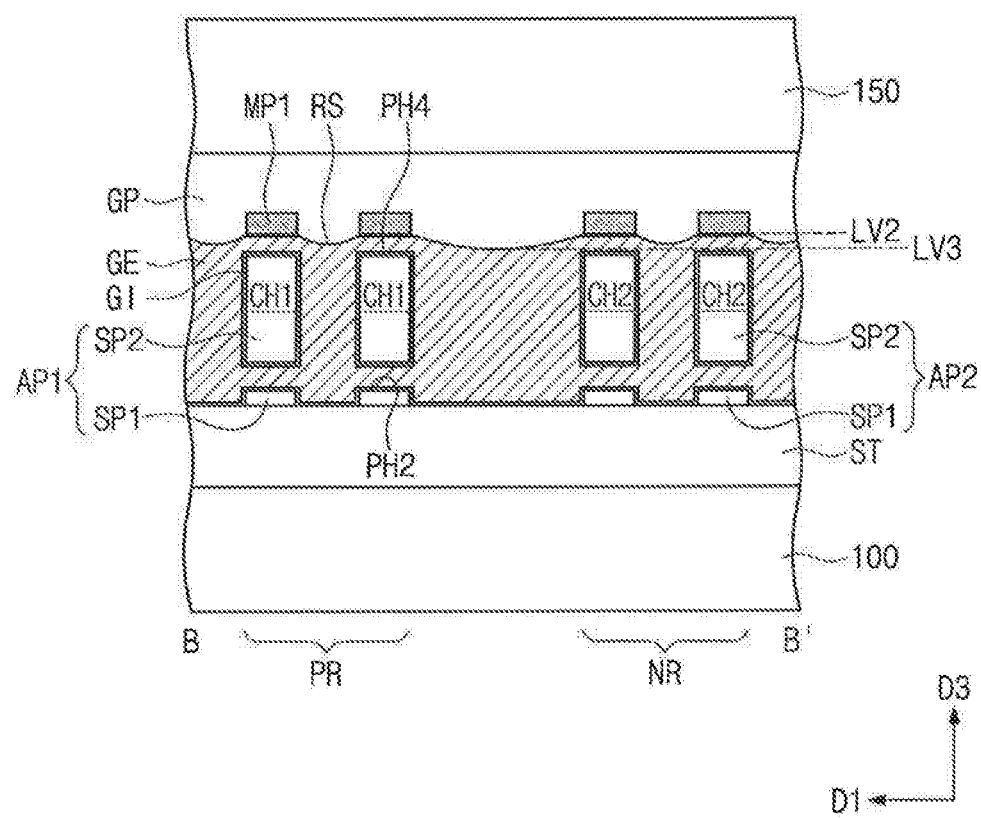
Figure 38C:
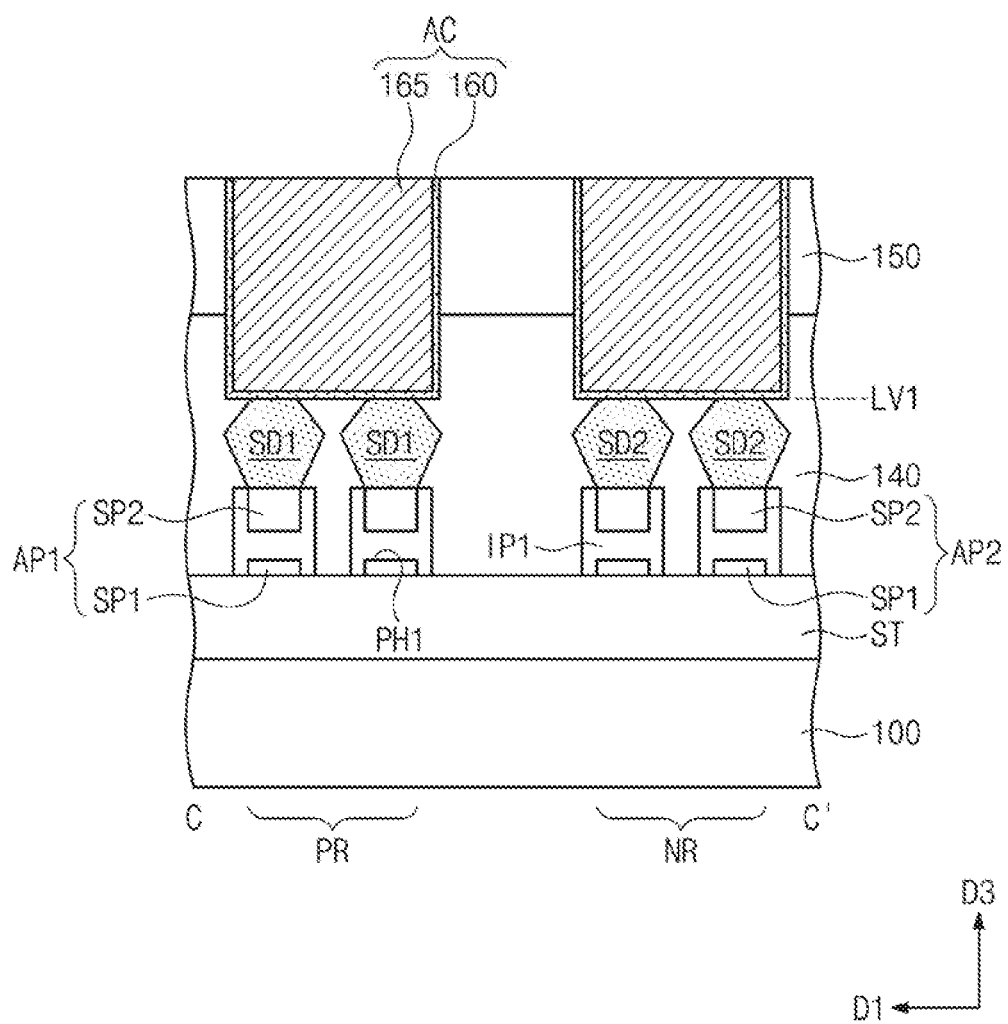
Figure 39A:
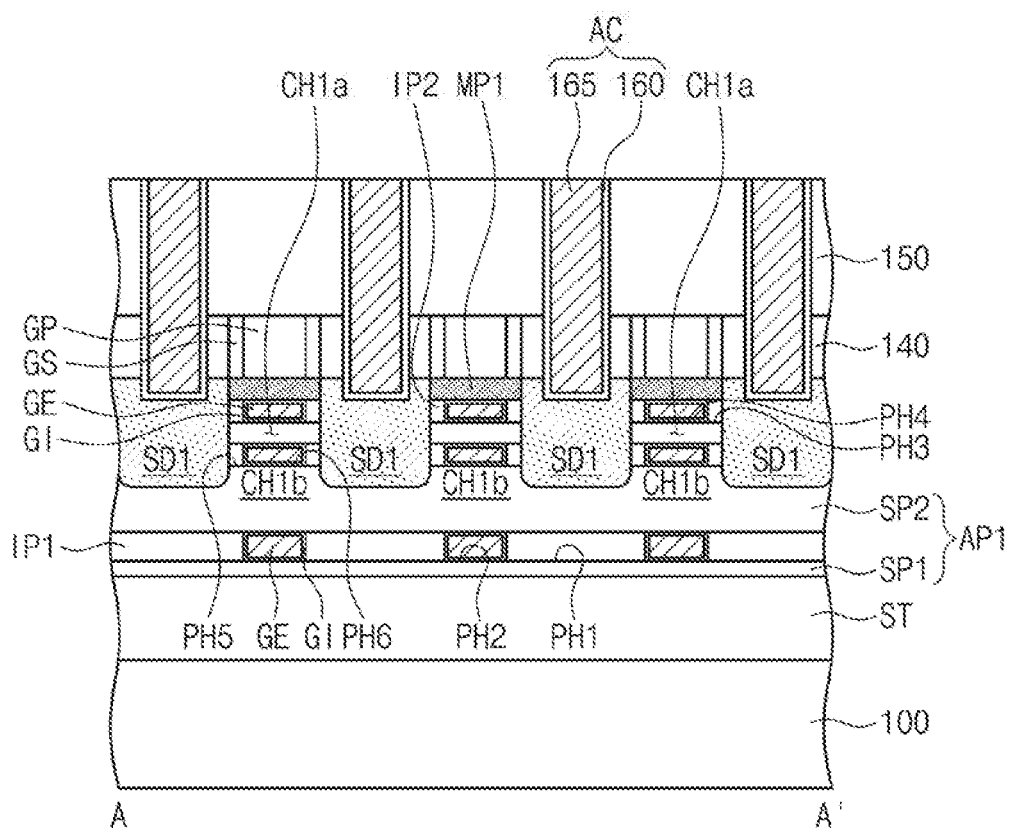
Figure 39B:
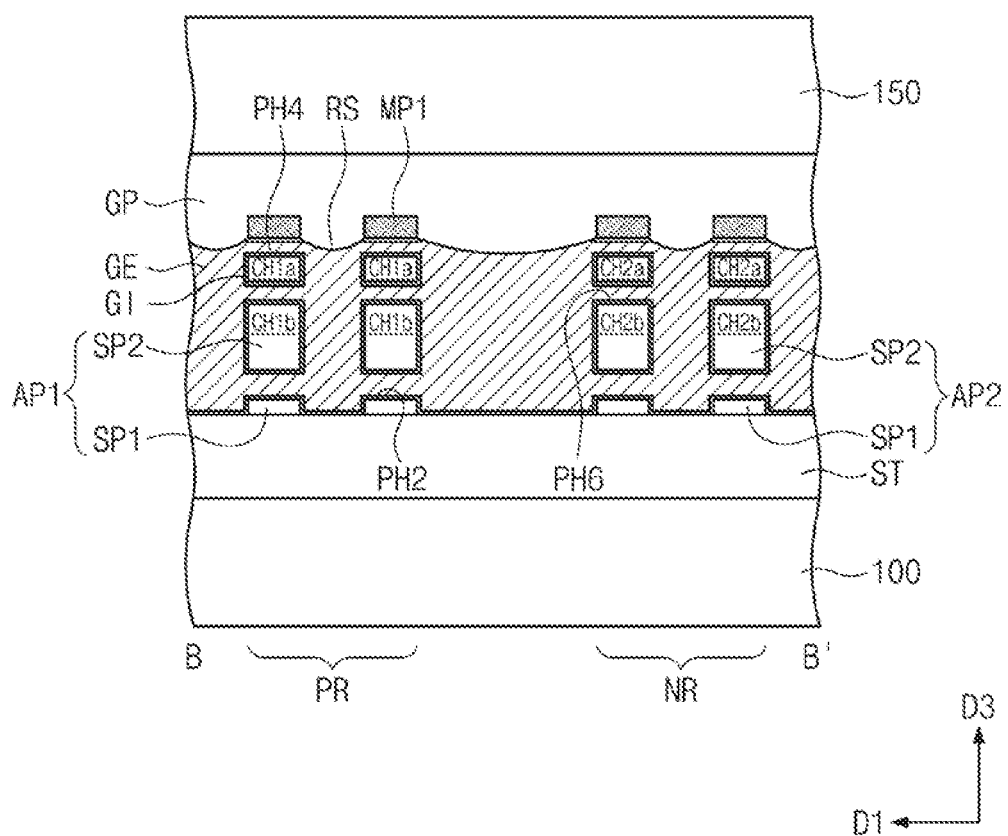
Figure 39C:
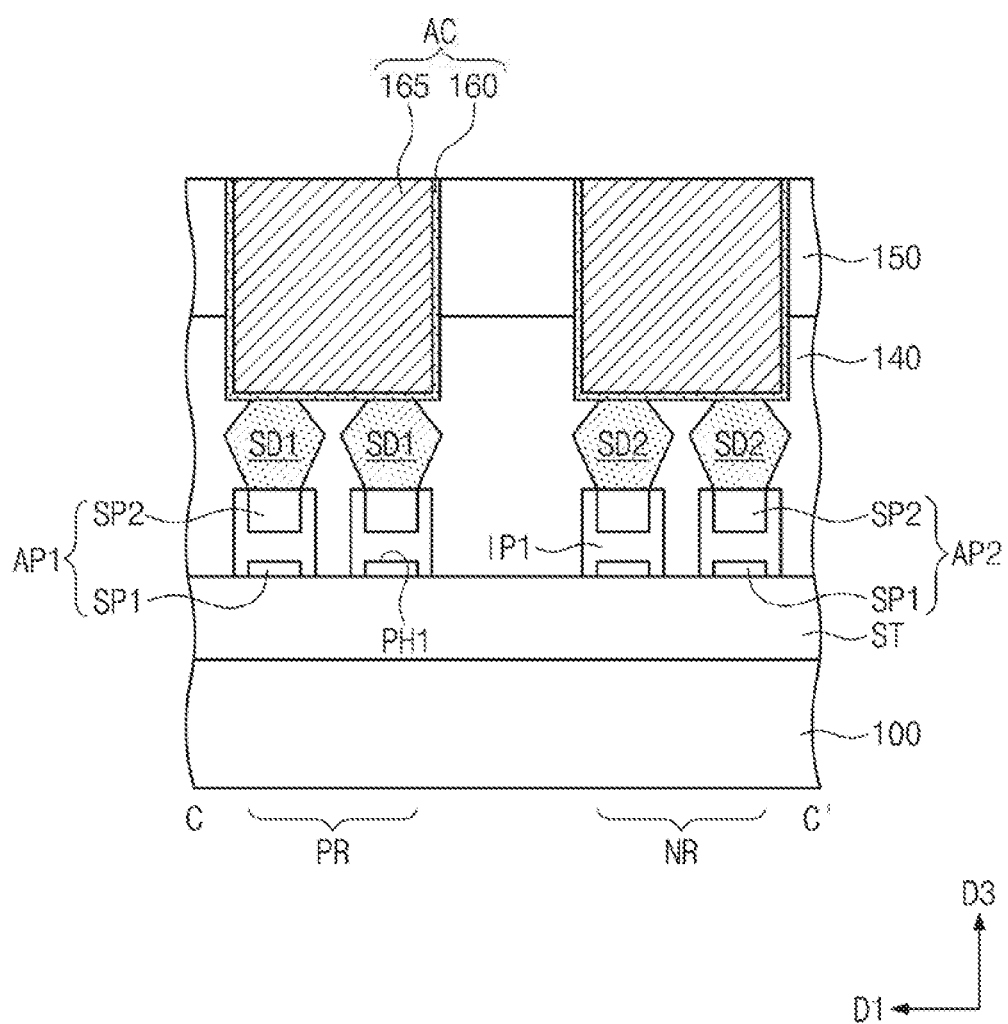
Figure 40A:
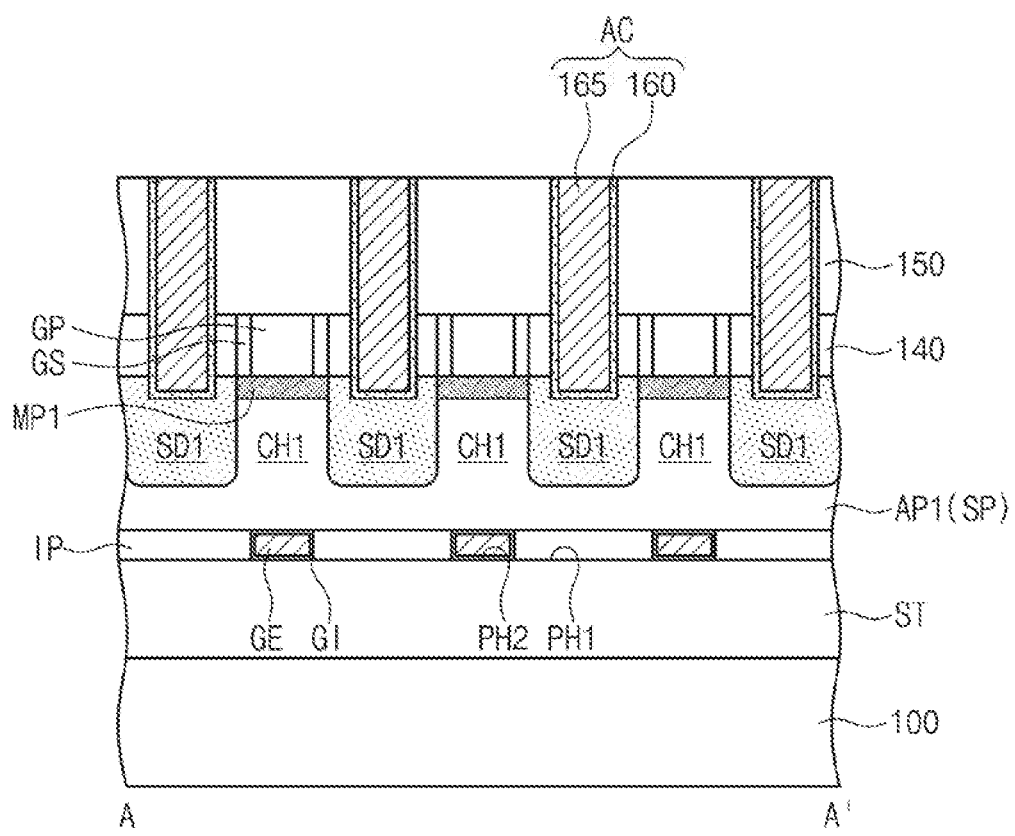
Figure 40A:
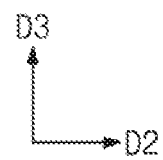
Figure 40B:
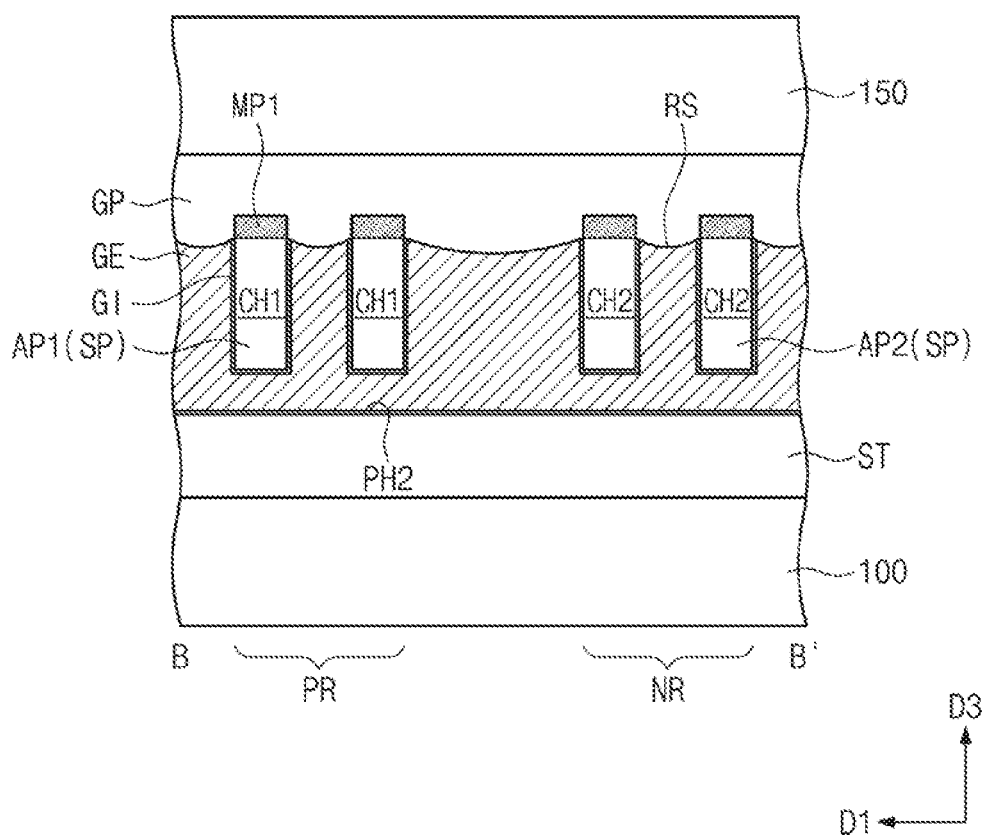
Figure 40C:
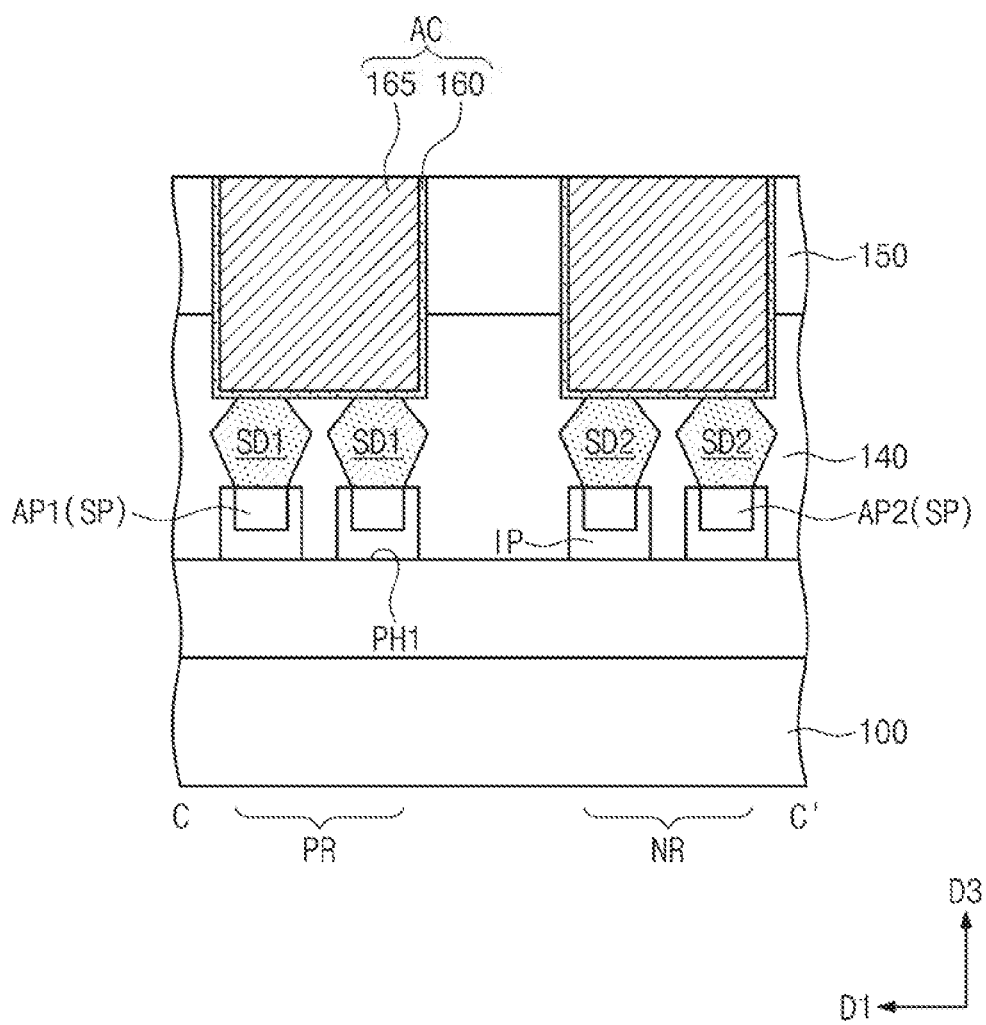
Figure 41A:
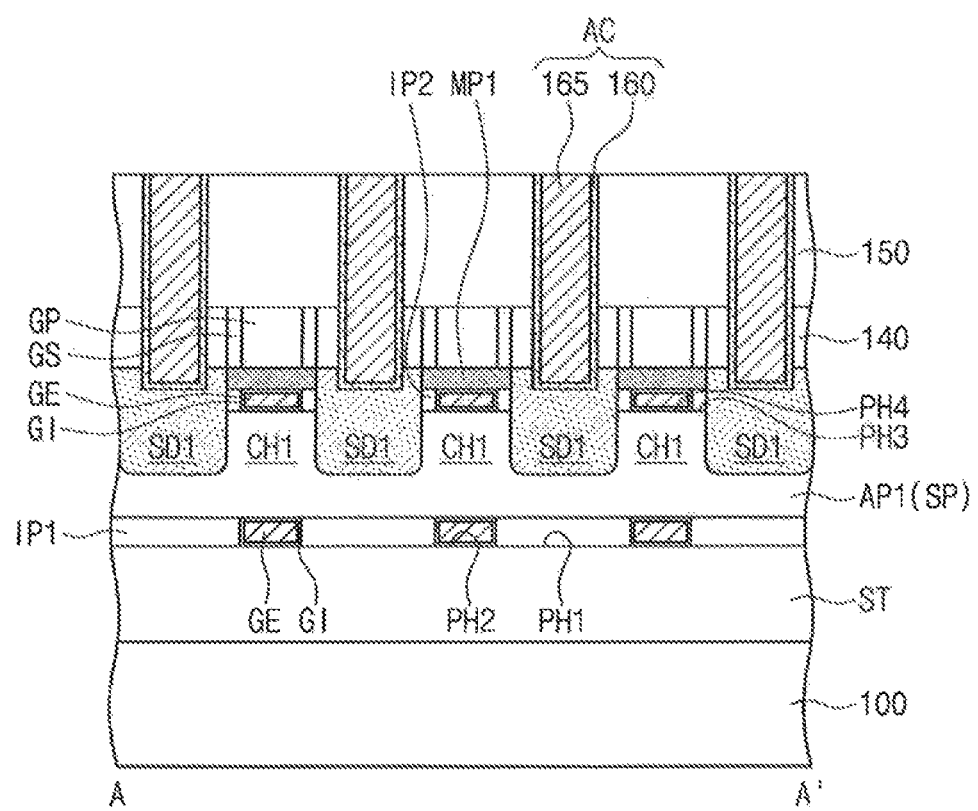
Figure 41A:
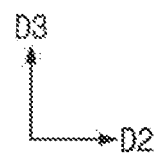
Figure 41B:
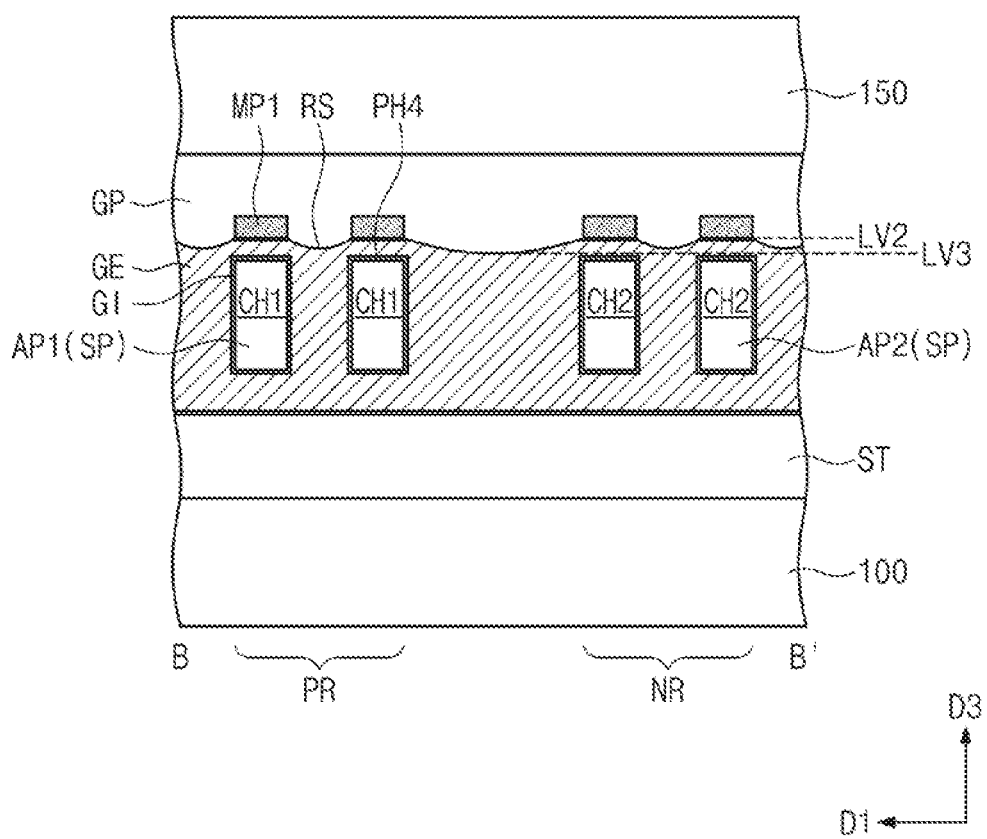
Figure 41C:
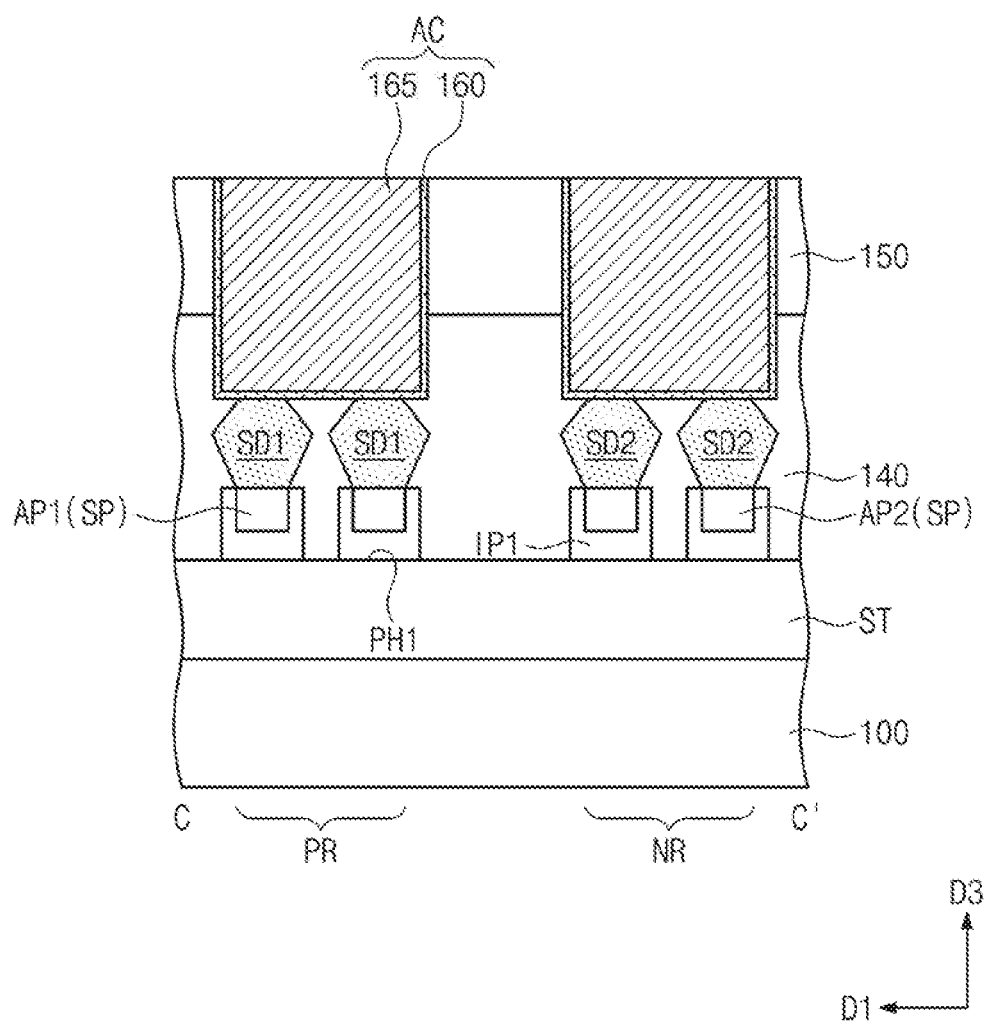
Figure 42A:
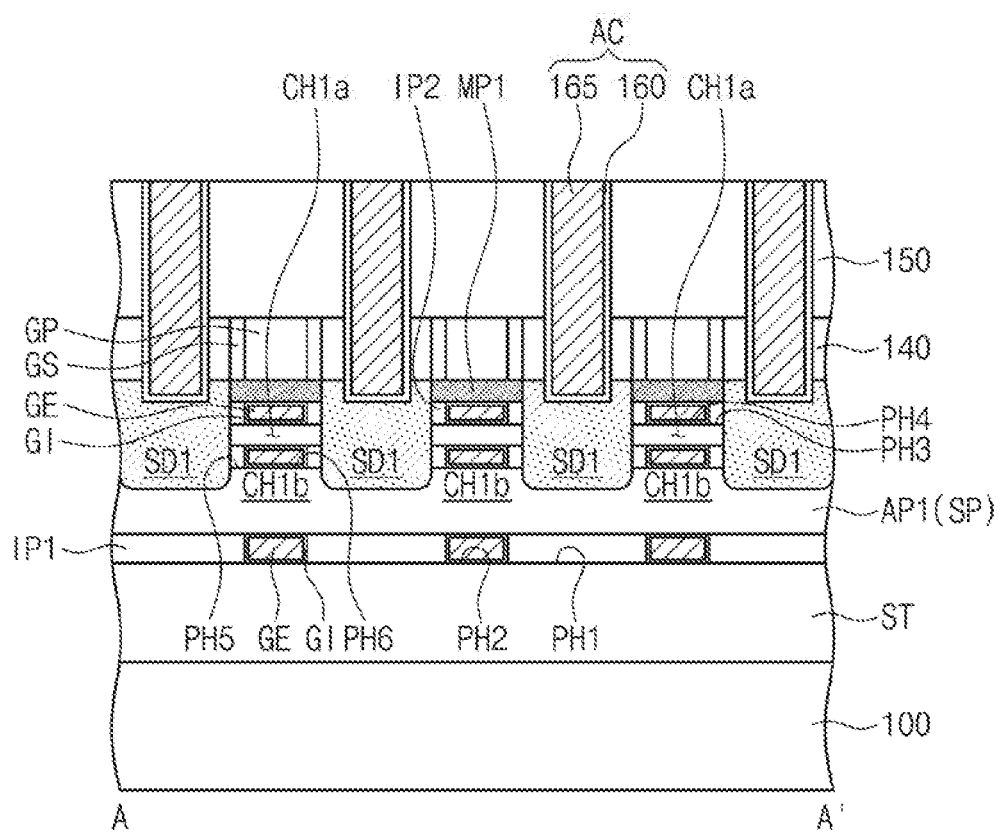
Figure 42A:
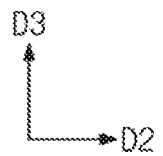
Figure 42B:
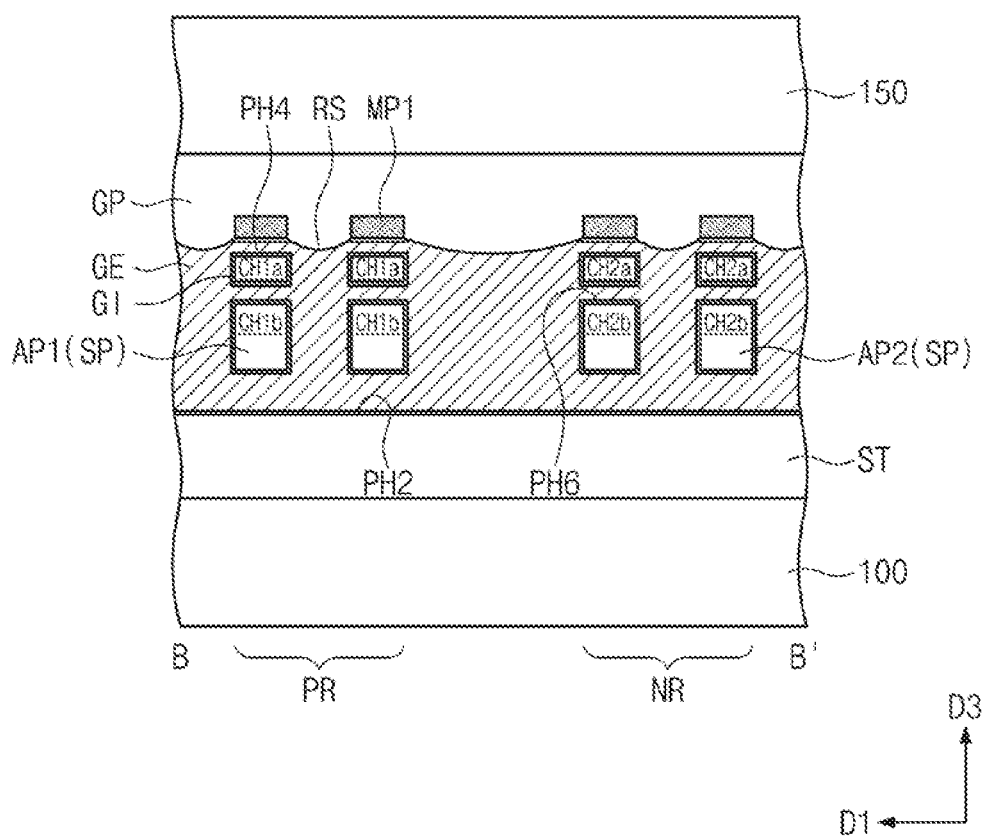
Figure 42C:
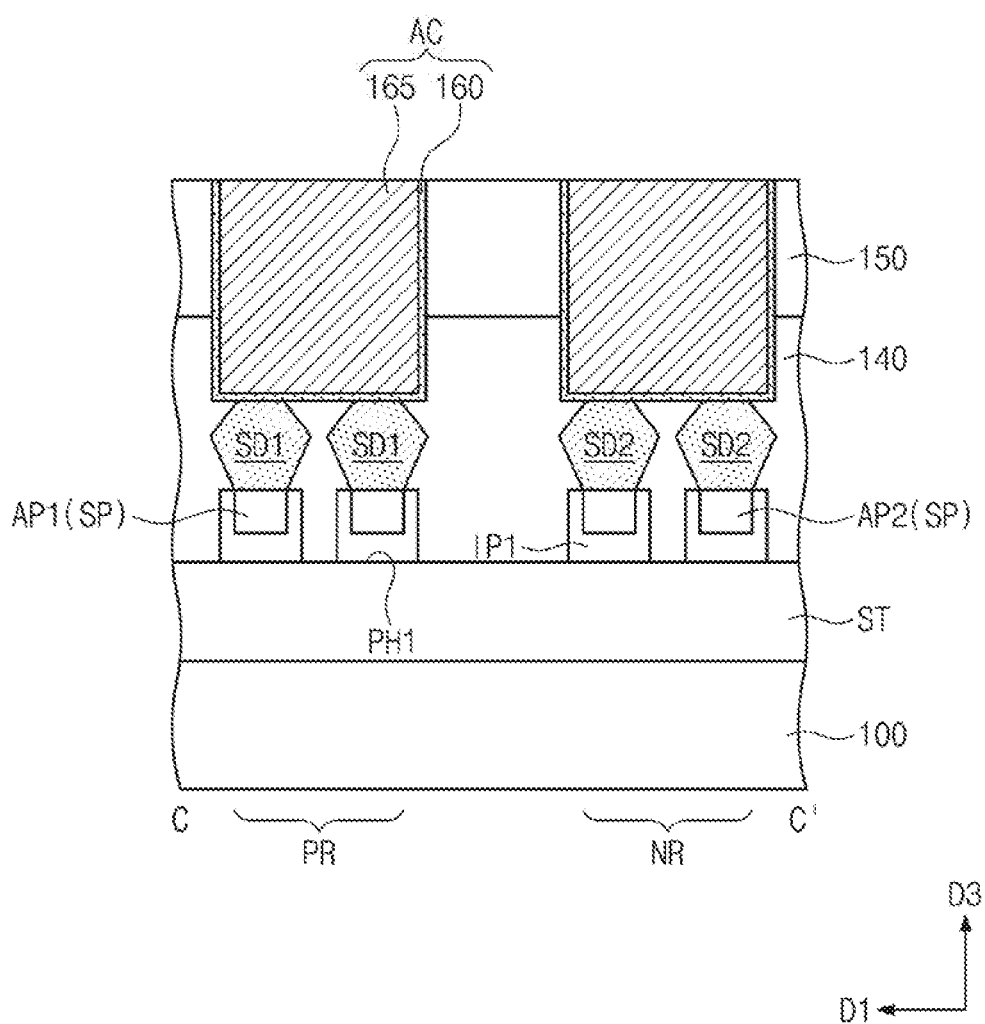

FIGS. 35A, 35B, and 35C are cross-sectional views taken along the lines A-A', B-B', and C-C' of FIG. 1, respectively, to illustrate a semiconductor device according to exemplary embodiments of the inventive concept. FIG. 36 is a perspective view taken along the line D-D' of FIG. 3A to illustrate a semiconductor device according to exemplary embodiments of the inventive concept. In the embodiment of FIGS. 35A, 35B, 35C and 36, the descriptions regarding the same technical features as in the embodiments of FIGS. 1, 3A, 21A, 21B, 21C, and 22 will be omitted. Differences between the embodiment of FIGS. 35A, 35B, 35C and 36 and the embodiments of FIGS. 1, 3A, 21A, 21B, 21C, and 22 will be mainly described hereinafter.

Referring to FIGS. 1, 3A, 35A, 35B, 35C, and 36, fifth cavities PH5 and sixth cavities PH6 may be defined in the second semiconductor pattern SP2 of each of the first and second active patterns AP1 and AP2. The fifth and sixth cavities PH5 and PH6 in the first active pattern AP1 may divide the first channel pattern CH1 into a first upper channel pattern CH1a and a first lower channel pattern CH1b. The fifth and sixth cavities PH5 and PH6 of the first active pattern AP1 may correspond to a space surrounded by the first upper channel pattern CH1a, a pair of first source/drain patterns SD1, and the first lower channel pattern CH1b. The fifth and sixth cavities PH5 and PH6 in the second active pattern AP2 may divide the second channel pattern CH2 into a second upper channel pattern CH2a and a second lower channel pattern CH2b. The fifth and sixth cavities PH5 and PH6 of the second active pattern AP2 may correspond to a space surrounded by the second upper channel pattern CH2a, a pair of second source/drain patterns SD2, and the second lower channel pattern CH2b. Heights (or lengths) of the fifth and sixth cavities PH5 and PH6 in the third direction D3 may be substantially equal to or different from the heights (or lengths) of the first and second cavities PH1 and PH2 in the third direction D3.

Third insulating patterns IP3 may be provided to fill the fifth cavities PH5, respectively. The first to third insulating patterns IP1, IP2, and IP3 may include the same material as the gate spacer GS.

Each of the gate electrodes GE and each of the gate dielectric patterns GI may fill the sixth cavities PH6. In other words, a first portion of the gate electrode GE and a first portion of the gate dielectric pattern GI may be disposed between the first upper channel pattern CH1a and the first lower channel pattern CH1b. A second portion of the gate electrode GE and a second portion of the gate dielectric pattern GI may be disposed between the second upper channel pattern CH2a and the second lower channel pattern CH2b. The gate electrode GE and the gate dielectric pattern GI may be spaced apart from the first and second source/drain patterns SD1 and SD2 with the third insulating patterns IP3 interposed therebetween.

The gate electrode GE may surround a top surface, both sidewalls and a bottom surface of each of the first upper and lower channel patterns CH1a and CH1b, as illustrated in FIG. 35B. In addition, the gate electrode GE may surround a top surface, both sidewalls and a bottom surface of each of the second upper and lower channel patterns CH2a and CH2b, as illustrated in FIG. 35B. In other words, the semiconductor device according to the present embodiment may include a gate-all-around-type field effect transistor that includes channel patterns with outer circumferential surfaces surrounded by the gate electrode GE.

To manufacture the semiconductor device according to the present embodiment, a third sacrificial layer may be formed between the first and second sacrificial layers described above with reference to FIGS. 4, 23A, and 23B. In the semiconductor device according to the present embodiment, two channel patterns may be disposed between a pair of the source/drain patterns adjacent to each other. However, exemplary embodiments of the inventive concept are not limited thereto. In exemplary embodiments of the inventive concept, three or more channel patterns may be disposed between the pair of source/drain patterns adjacent to each other.

In the semiconductor device according to the present embodiment, a plurality of the channel patterns vertically spaced apart from each other may be disposed between the pair of source/drain patterns. Since each of the plurality of channel patterns is surrounded by the gate electrode, the mobility of carriers in the plurality of channel patterns may be increased.

FIGS. 37A to 37C, 38A to 38C, 39A to 39C, 40A to 40C, 41A to 41C, and 42A to 42C are cross-sectional views taken along the lines A-A', B-B', and C-C' of FIG. 1 to illustrate semiconductor devices according to exemplary embodiments of the inventive concept. In the embodiments of FIGS. 37A to 37C, 38A to 38C, 39A to 39C, 40A to 40C, 41A to 41C, and 42A to 42C, the descriptions regarding the same technical features in the embodiments described above will be omitted. Differences between the embodiments of FIGS. 37A to 37C, 38A to 38C, 39A to 39C, 40A to 40C, 41A to 41C, and 42A to 42C and the above embodiments will be mainly described.

Referring to FIGS. 1 and 37A to 37C, a substrate 100 may be a silicon on insulator (SOI) substrate. An insulator of the SOI substrate may include a device isolation layer ST. A silicon layer of the SOI substrate may include first semiconductor patterns SP1. For example, the first semiconductor patterns SP1 may be formed by patterning the silicon layer of the SOI substrate using the first mask patterns MP1 as etch masks. Other components of the semiconductor device according to the embodiment of FIGS. 37A to 37C may be substantially the same as corresponding components of the semiconductor device described with reference to FIGS. 1, 2A to 2C, 3A, and 3B.

Referring to FIGS. 1 and 38A to 38C, a substrate 100 may be the SOI substrate. Except for this, other components of the semiconductor device according to the embodiment of FIGS. 38A to 38C may be substantially the same as corresponding components of the semiconductor device described with reference to FIGS. 1, 3A, 21A, 21B, 21C, and 22.

Referring to FIGS. 1 and 39A to 39C, a substrate 100 may be the SOI substrate. Except for this, other components of the semiconductor device according to the embodiment of FIGS. 39A to 39C may be substantially the same as corresponding components of the semiconductor device described with reference to FIGS. 1, 3A, 35A, 35B, 35C, and 36.

Referring to FIGS. 1 and 40A to 40C, a substrate 100 may be a silicon-germanium on insulator (SGOI) substrate. An insulator of the SGOI substrate may include a device isolation layer ST. A silicon-germanium layer of the SGOI substrate may be used as the sacrificial layer described above with reference to FIGS. 4, 5A, and 5B. The silicon-germanium layer of the SGOI substrate may be completely removed during a manufacturing process, and a space formed by the removal of the silicon-germanium layer may be filled with the insulating patterns IP and the gate electrodes GE. Each of first and second active patterns AP1 and AP2 may include one semiconductor pattern SP vertically spaced apart from the device isolation layer ST. Other components of the semiconductor device according to the embodiment of FIGS. 40A to 40C may be substantially the same as corresponding components of the semiconductor device described with reference to FIGS. 1, 2A to 2C, 3A, and 3B.

Referring to FIGS. 1 and 41A to 41C, a substrate 100 may be the SGOI substrate. Except for this, other components of the semiconductor device according to the embodiment of FIGS. 41A to 41C may be substantially the same as corresponding components of the semiconductor device described with reference to FIGS. 1, 3A, 21A, 21B, 21C, and 22.

Referring to FIGS. 1 and 42A to 42C, a substrate 100 may be the SGOI substrate. Except for this, other components of the semiconductor device according to the embodiment of FIGS. 42A to 42C may be substantially the same as corresponding components of the semiconductor device described with reference to FIGS. 1, 3A, 35A, 35B, 35C, and 36.

In the semiconductor device according to exemplary embodiments of the inventive concept, the gate electrode may be positioned to be lower than the contact. As a result, the parasitic capacitance between the gate electrode and the contact may be reduced to increase the operating speed and the electrical characteristics of the semiconductor device.

While the inventive concept has been described with reference to exemplary embodiments thereof, it will be apparent to those skilled in the art that various changes and modifications may be made thereto without departing from the spirit and scope of the inventive concept. Therefore, it should be understood that the above embodiments are not limiting, but illustrative.

What is claimed is:

1. A semiconductor device, comprising:
   an active pattern on a substrate, the active pattern including: a first semiconductor pattern; and a second semiconductor pattern vertically spaced apart from the first semiconductor pattern; and
   a gate electrode intersecting the active pattern and extending in a first direction,
   wherein the second semiconductor pattern includes a channel pattern and a source/drain pattern on a side of the channel pattern,
   wherein at least a portion of the gate electrode is between the first semiconductor pattern and the channel pattern, and
   wherein the gate electrode includes a recessed top surface adjacent to the channel pattern.

2. The semiconductor device of claim 1, further comprising:
   a contact connected to the source/drain pattern,
   wherein a lowest point of a top surface of the gate electrode is lower than a bottom surface of the contact.

3. The semiconductor device of claim 1, further comprising:
   a device isolation layer on both sidewalls of a lower portion of the first semiconductor pattern, wherein an upper portion of the first semiconductor pattern protrudes above a top surface of the device isolation layers.

4. The semiconductor device of claim 1, further comprising:
an insulating pattern between the first semiconductor pattern and the source/drain pattern,
wherein the at least a portion of the gate electrode overlaps the channel pattern, and
wherein the insulating pattern overlaps the source/drain pattern.

5. The semiconductor device of claim 1, wherein the gate electrode surrounds a top surface, both sidewalls and a bottom surface of the channel pattern.

6. A semiconductor device, comprising:
a substrate including a PMOSFET region and a NMOSFET region;
a first active pattern on the PMOSFET region and a second active pattern on the NMOSFET region;
a gate electrode on the first and second active patterns; and
a gate capping pattern on the gate electrode,
wherein the first active pattern includes a first channel pattern and a second channel pattern vertically spaced apart from the first channel pattern,
wherein the second active pattern includes a third channel pattern and a fourth channel pattern vertically spaced apart from the third channel pattern,
wherein a first portion of the gate electrode is between the first and second channel patterns,
wherein a second portion of the gate electrode is between the third and fourth channel patterns, and
wherein an interface where the gate electrode meets the gate capping pattern is recessed between the second channel pattern and the fourth channel pattern.

7. The semiconductor device of claim 6, wherein the gate electrode surrounds a top surface, both sidewalls and a bottom surface of each of the first to fourth channel patterns.

8. The semiconductor device of claim 6, wherein the first active pattern further includes a first source/drain pattern on sides of first and second channel patterns, and
wherein the second active pattern further includes a second source/drain pattern on sides of third and fourth channel patterns.

9. The semiconductor device of claim 8, further comprising:
a contact connected to at least one of the first and second source/drain patterns,
wherein a lowest point of the interface between the second and fourth channel patterns is lower than a bottom surface of the contact.

10. The semiconductor device of claim 8, wherein the first source/drain pattern includes a semiconductor element different from a semiconductor element of the second source/drain pattern.

11. The semiconductor device of claim 6, wherein the first and second active patterns are spaced apart from each other in a first direction, and
wherein the gate electrode extends in the first direction.

12. The semiconductor device of claim 6, wherein a height of the interface decreases from the second channel pattern, reaches a minimum value between the second and fourth channel patterns, and then increases toward the fourth channel pattern.

13. The semiconductor device of claim 6, wherein a third portion of the gate electrode is between the gate capping pattern and the second channel pattern, and
wherein a fourth portion of the gate electrode is between the gate capping pattern and the fourth channel pattern.

14. The semiconductor device of claim 6, further comprising a device isolation layer on the substrate,
wherein the first active pattern further includes a first semiconductor pattern under the first channel pattern,
wherein the second active pattern further includes a second semiconductor pattern under the third channel pattern,
wherein the device isolation layer covers both sidewalls of each of the first and second semiconductor patterns,
wherein a third portion of the gate electrode is between the first semiconductor pattern and the first channel pattern, and
wherein a fourth portion of the gate electrode is between the second semiconductor pattern and the third channel pattern.

15. A semiconductor device, comprising:
a substrate;
a first active pattern and a second active pattern on the substrate;
a gate electrode on the first and second active patterns; and
a gate capping pattern on the gate electrode,
wherein each of the first and second active patterns includes a plurality of channel patterns that are vertically stacked and vertically spaced from each other,
wherein the gate electrode surrounds the plurality of channel patterns of each of the first and second active patterns, and
wherein an interface where the gate electrode meets the gate capping pattern is recessed between the first active pattern and the second active pattern.

16. The semiconductor device of claim 15, wherein the gate electrode surrounds a top surface, both sidewalls and a bottom surface of each of the plurality of channel patterns.

17. The semiconductor device of claim 15, wherein the first active pattern further includes a first source/drain pattern on sides of the plurality of channel patterns, and
wherein the second active pattern further includes a second source/drain pattern on sides of the plurality of channel patterns.

18. The semiconductor device of claim 17, further comprising:
a contact connected to at least one of the first and second source/drain patterns,
wherein a lowest point of the interface between the first and second active patterns is lower than a bottom surface of the contact.

19. The semiconductor device of claim 15, wherein a height of the interface decreases from the first active pattern, reaches a minimum value between the first and second active patterns, and then increases toward the second active pattern.

20. The semiconductor device of claim 15, wherein the first and second active patterns are spaced apart from each other in a first direction, and
wherein the gate electrode extends in the first direction.

* * * * *